(12) United States Patent  
Miyoshi et al.

(10) Patent No.: US 8,847,410 B2
(45) Date of Patent: Sep. 30, 2014

(54) SEMICONDUCTOR CHIP WITH BONDING WIRE AND METHOD FOR MAKING THE SAME

(75) Inventors: Kosuke Miyoshi, Kyoto (JP); Kinya Sakoda, Kyoto (JP); Toshikuni Shinohara, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 46 days.

(21) Appl. No.: 13/590,472

(22) Filed: Aug. 21, 2012

(65) Prior Publication Data

US 2013/0049231 A1     Feb. 28, 2013

(30) Foreign Application Priority Data

Aug. 26, 2011  (JP) .................................. 2011-184891
Jan. 25, 2012  (JP) .................................. 2012-012933
Jan. 25, 2012  (JP) .................................. 2012-012934
Jan. 25, 2012  (JP) .................................. 2012-012935
Jun. 15, 2012  (JP) .................................. 2012-135624

(51) Int. Cl.
*H01L 23/48*     (2006.01)
*H01L 23/52*     (2006.01)
*H01L 29/40*     (2006.01)
*H01L 23/31*     (2006.01)
*H01L 23/495*    (2006.01)
*H01L 23/00*     (2006.01)

(52) U.S. Cl.
CPC ....... *H01L 24/48* (2013.01); *H01L 2924/01028* (2013.01); *H01L 2224/45124* (2013.01); *H01L 2224/48097* (2013.01); *H01L 2924/01029* (2013.01); *H01L 2224/32245* (2013.01); *H01L 23/3107* (2013.01); *H01L 2224/78301* (2013.01); *H01L 2224/29101* (2013.01); *H01L 24/32* (2013.01); *H01L 2224/85205* (2013.01); *H01L 2224/48095* (2013.01); *H01L 2224/85201* (2013.01); *H01L 2924/01013* (2013.01); *H01L 2224/49113* (2013.01); *H01L 2224/4809* (2013.01); *H01L 2224/48456* (2013.01); *H01L 2224/45147* (2013.01); *H01L 2224/45144* (2013.01); *H01L 2224/73265* (2013.01); *H01L 2224/48091* (2013.01); *H01L 23/4952* (2013.01); *H01L 2224/29339* (2013.01); *H01L 2224/48247* (2013.01); *H01L 2224/45015* (2013.01); *H01L 24/49* (2013.01); *H01L 2224/85045* (2013.01); *H01L 2224/29386* (2013.01); *H01L 2224/85181* (2013.01); *H01L 24/85* (2013.01); *H01L 24/78* (2013.01); *H01L 2224/92247* (2013.01); *H01L 2924/01047* (2013.01); *H01L 24/29* (2013.01); *H01L 24/45* (2013.01); *H01L 2224/48465* (2013.01)

USPC ........... 257/786; 257/666; 257/784; 257/780; 257/782; 438/113; 438/124; 438/123; 438/617

(58) Field of Classification Search
CPC ......... H01L 24/01; H01L 24/42; H01L 24/47; H01L 21/4885; H01L 24/85; H01L 24/48; H01L 24/73; H01L 24/745; H01L 24/80; H01L 2224/42; H01L 2224/47; H01L 2224/48; H01L 2224/4801; H01L 2224/48011; H01L 2224/4805; B23K 20/004; B23K 20/10
USPC .......... 257/666, 784, 786, 780, 782; 438/123, 438/113, 124, 617

See application file for complete search history.

(56) References Cited

U.S. PATENT DOCUMENTS

| 5,395,035 A * | 3/1995 | Nakao ............................ 228/4.5 |
| 6,182,885 B1 * | 2/2001 | Nishiura et al. ........... 228/180.5 |
| 6,372,625 B1 | 4/2002 | Shigeno et al. |
| 2005/0224924 A1 * | 10/2005 | Koh et al. ..................... 257/666 |
| 2006/0255101 A1 * | 11/2006 | Shirato et al. ............. 228/180.5 |
| 2011/0057299 A1 * | 3/2011 | Takata et al. .................. 257/676 |

FOREIGN PATENT DOCUMENTS

| JP | 2823454 | 9/1998 |
| JP | 11-67809 | 3/1999 |

OTHER PUBLICATIONS www.engineeringtoolbox.com/linear-expansion-coefficients-d_95.html, retrieved Jan. 31, 2014.*

* cited by examiner

Primary Examiner — Yasser A Abdelaziez
Assistant Examiner — Cory Eskridge
(74) Attorney, Agent, or Firm — Hamre, Schumann, Mueller & Larson, P.C.

(57) ABSTRACT

A semiconductor device includes a semiconductor chip, a die pad including an obverse surface on which the semiconductor chip is bonded, a lead spaced apart from the die pad, a bonding wire electrically connecting the semiconductor chip and the lead to each other, and a resin package that seals the semiconductor chip and the bonding wire. The bonding wire includes a first bond portion press-bonded to the semiconductor chip by ball bonding, a second bond portion press bonded to the lead by stitch bonding, a landing portion extending from the second bond portion toward the die pad and formed in contact with an obverse surface of the lead, and a loop extending obliquely upward from the landing portion toward the semiconductor chip.

22 Claims, 61 Drawing Sheets

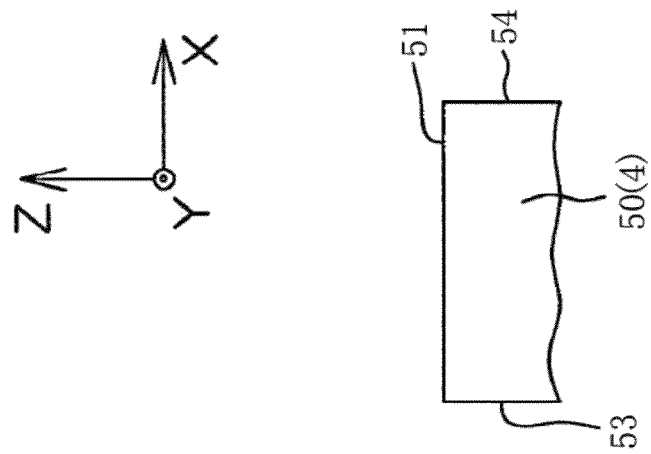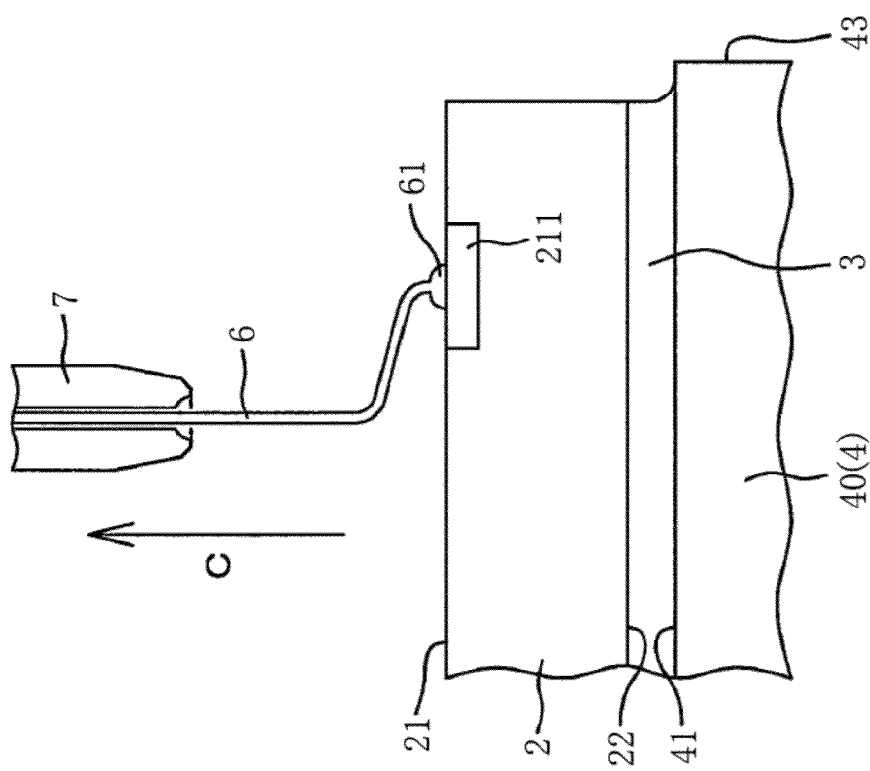
FIG.8

FIG.32
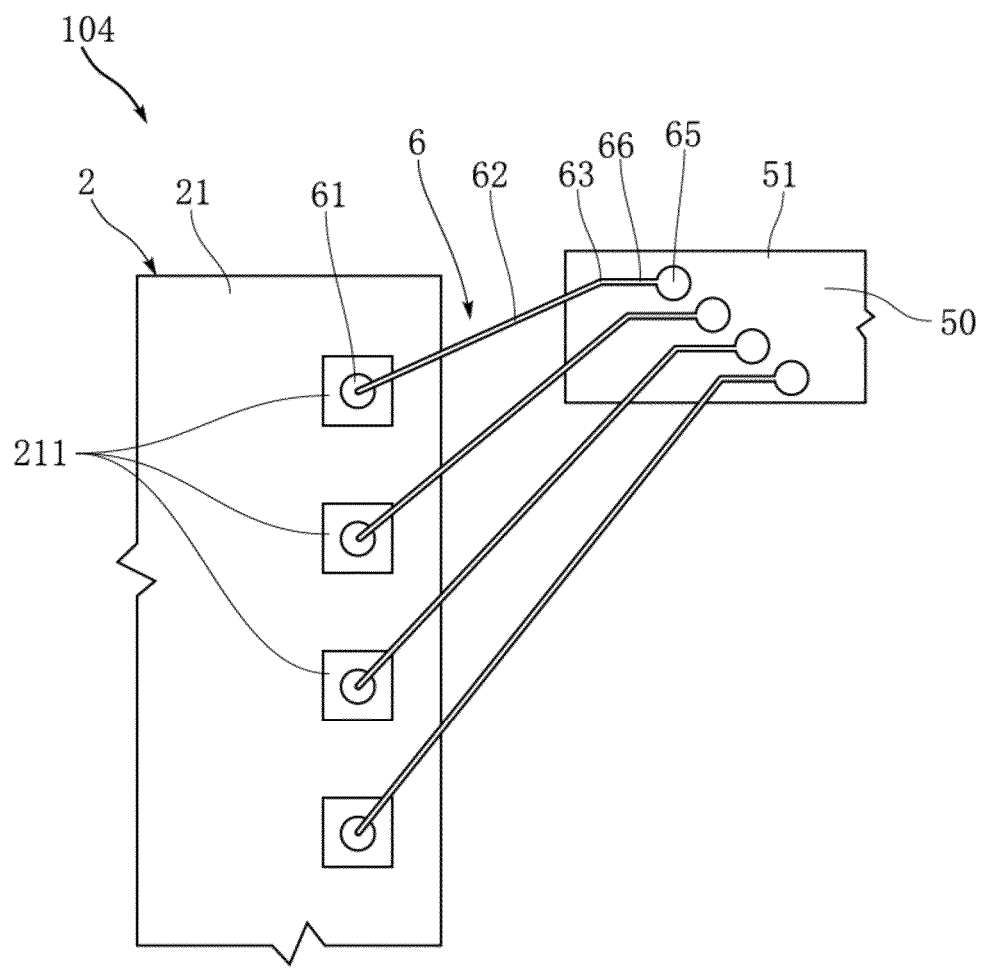
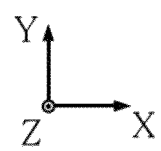

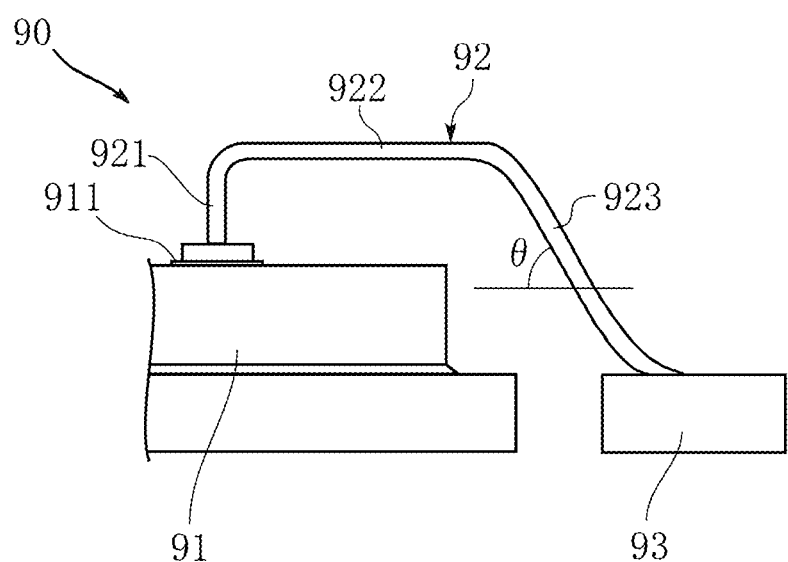
FIG.61 -- PRIOR ART --

SEMICONDUCTOR CHIP WITH BONDING WIRE AND METHOD FOR MAKING THE SAME

BACKGROUND OF THE INVENTION

1. Field of the Invention

The present invention relates to a semiconductor device including a semiconductor chip and a lead which are electrically connected to each other via a bonding wire. The present invention also relates to a method for making such a semiconductor device.

2. Description of the Related Art

Electrically connecting a semiconductor chip and leads of a lead frame by using bonding wires is conventionally known. Examples of the shape (loop shape) of such bonding wires are as disclosed in e.g. JP-A-11-67809 and Japanese Patent No. 2823454.

FIG. 61 shows a principal portion of the semiconductor device disclosed in JP-A-11-67809. The semiconductor device 90 shown in FIG. 61 includes a semiconductor chip 91 having a bonding pad 911, a bonding wire 92, and a lead terminal 93 connected to the semiconductor chip 91 via the bonding wire 92. The bonding wire 92 includes a first portion 921, a second portion 922 and a third portion 923. The first portion 921 has a shape extending upward substantially vertically from the portion press-bonded to the bonding pad 911. The second portion 922 extends horizontally from the first portion 921 to reach a position close to an end of the semiconductor chip 91. The third portion 923 extends downward front the second portion 922 to the portion bonded to the lead terminal 93.

The bonding wire disclosed in FIG. 2 of Japanese Patent No. 2823454 is connected at one end to a bonding pad of a semiconductor chip and connected at the other end to an inner lead of a lead frame at a position close to its end. The loop of this bonding wire has a triangular shape.

In recent years, the distance between a die pad and a lead tens to be reduced in accordance with size reduction of semiconductor packages. Thus, to avoid contact of the bonding wire 92 with the semiconductor chip 91 in the semiconductor device 90 for example, the inclination angle θ of the bonding wire 92 with respect to the lead terminal 93 needs to be increased. Specifically, the inclination angle θ is set to about 60 to 80°. With such an arrangement, however, wire sweep may occur in molding the resin package or the bonding wire 92 pushed up due to thermal expansion of resin may be detached from the lead terminal 93, which may cause an increase in defective rate.

To solve such a problem, it may be considered to lower (down-set) the position of the die pad on which the semi conductor chip 91 is to be mounted. However, in view of thickness reduction of the semiconductor package, down-setting the die pad is not desirable. Moreover, down-setting the die pad is sometimes difficult due to the structure of the device.

Also, there is another problem. In the semiconductor device 90, a plurality of bonding wires 92 similar to the illustrated one are used, and each of the bonding wires extends linearly as viewed in plan. In this case, the bonding wires need to be spaced apart from each other by a certain distance to avoid contact between them. However, such an arrangement hinders size reduction of the semiconductor device 90.

SUMMARY OF THE INVENTION

An object of the present invention is to provide an electronic device (in particular, a semiconductor device) that can reduce wire sweep or detachment of a wire bond portion even when down-setting cannot be performed.

Another object of the present invention is to provide a wire bonding structure (and hence, an electronic device, in particular, a resin-packaged electronic device) which can achieve size reduction while reducing the defective rate.

According to the present invention, there is provided a semiconductor device comprising a semiconductor chip, a die pad including an obverse surface on which the semiconductor chip is bonded, a lead spaced apart from the die pad, a bonding wire electrically connecting the semiconductor chip and the lead to each other, and a resin package that seals the semiconductor chip and the bonding wire. The bonding wire includes a first bond portion press-bonded to the semiconductor chip by ball bonding, a second bond portion press-bonded to the lead by stitch bonding, a landing portion extending from the second bond portion toward the die pad and formed in contact with an obverse surface of the lead, and a loop extending obliquely upward from the landing portion toward the semiconductor chip.

With this arrangement, since a landing portion of a bonding wire is formed in contact with the surface of the lead, in sealing the bonding wire by a resin package, sufficient pressure is applied by the resin in the direction to press the landing portion onto the surface of the lead. Thus, wire sweep in the resin-molding process is prevented. The landing portion intervenes between the loop and the second bond portion. Thus, even when the resin flowing under the loop thermally expands and the expanded resin pushes the loop upward, the effect of the pushing is suppressed such that the pushing merely causes slight rising of the landing portion from the lead, and detachment of the second bond portion from the lead is prevented. Thus, the defective rate is improved, and a reliable semiconductor device is provided.

The above-described advantages are effective also when the semiconductor device is under conditions where wire sweep or detachment of the second bond portion is likely to occur, as a result of responding to the demand for size reduction of the semiconductor package. For the size reduction of a semiconductor package, the distance between the die pad and the lead needs to be reduced. However, to prevent contact between the bonding wire and an edge of the semiconductor chip, the inclination angle of the bonding wire to the lead cannot be made extremely small, and an inclination angle of about 60-80° needs to be secured. With the inclination angle within this range, the bonding wire substantially stands on the lead, which often leads to wire sweep or detachment of the second bond portion in the conventional structure. In the semiconductor device of the present invention, however, wire sweep and detachment of the second bond portion is prevented even in such conditions.

Preferably, in the semiconductor device according to the present invention, the landing portion is 10-80 μm in length, and the inclination angle of the loop to the lead, is 60-80°. With this arrangement, the amount of resin that flows between the landing portion and the obverse surface of the lead is small. Thus, the force of the resin that pushes the wire in the horizontal direction can be reduced to ½ or less as compared with the conventional structure. Moreover, in the semiconductor device of the present invention, the obverse surface of the die pad and the obverse surface of the lead may be flush with each other.

In the semiconductor device of the present invention, wire sweep and detachment of the second bond portion are reliably prevented even when the die pad cannot be set lower than the lead (cannot be down-set relative to the lead) and the inclination angle of the bonding wire cannot be made small. The semiconductor device of the present invention is particularly advantageous when the distance between the first bond portion and an inner end of the lead in a horizontal direction parallel to the obverse surface of the lead is not more than 800 µm and when the height difference H between the first bond portion and the second bond portion in a direction normal to the obverse surface of the lead is not less than 100 µm.

The semiconductor device according to the present invention can be made by the following method. First, a semiconductor chip including an electrode pad and bonded to an obverse surface of a die pad is prepared, while a bonding wire including a ball portion formed at its end is prepared. Then, a first bond portion is formed by press-bonding the ball portion onto the electrode pad with a capillary. After the formation of the first bond portion, a loop is formed between the semiconductor chip and a lead spaced apart from the die pad by lifting the capillary and then moving the capillary obliquely downward in such a manner as to draw an arc toward the lead such that an inclination angle of 60-80° is formed with respect to a horizontal surface of the lead. After the formation of a loop, a wire margin of a predetermined length is provided by lifting the capillary from a point close to an obverse surface of the lead to a position obliquely upward of the point while paying out the bonding wire. By lowering the capillary in this state, a second bond portion is formed by stitch bonding by press-bonding the bonding wire onto the obverse surface of the lead, while forming a landing portion having a length of 10-80 µm by bringing the wire margin into contact with the obverse surface of the lead. Finally, the semiconductor chip and the bonding wire are sealed by a resin package.

According to this method, the landing portion can be formed easily after the formation of a loop. Specifically, after the loop is formed, a margin (wire margin) is provided by lifting the capillary to a predetermined position while paying out a bonding wire, and then the capillary is lowered. In this way, the landing portion is formed just by moving the capillary along a predetermined track. Thus, the formation of the landing portion can be performed in combination with the ordinary wire bonding operation and the operation to make a loop (such as triangular loop or trapezoidal loop).

Since the bonding wire is paid out from the capillary in forming the landing portion, the bonding wire is prevented from being unduly pulled by the capillary. Thus, load on the first bond portion and entire thinning of the wire are suppressed. Moreover, the capillary is moved by using, as the starting point, the bent portion (inflection point) of the bonding wire formed at the same time as the formation of the loop. Thus, even when the bonding wire is slightly pulled during the movement of the capillary, the pulling force is reduced at the bent portion. This also reduces the load on the first bond portion.

Preferably, the step of providing a wire margin comprises lifting the capillary from a point close to the obverse surface of the lead in a direction normal to the obverse surface of the lead and then moving the capillary in a direction parallel to the obverse surface of the lead. According to this method, the capillary can be moved from the point close to the obverse surface of the lead to the position obliquely upward of the point just through linear movement, so that the amount of the bonding wire to be paid out is easily controlled.

According to an embodiment of the present invention, a plurality of leads are arranged in a first direction, and two wires are bonded to each of the plurality of leads. The two wires bonded to each lead consists of a first bonding wire press-bonded to the lead at a first press-bond position and a second bonding wire press-bonded to the lead at a second press-bond position that is on one side of the first press-bond position in the first direction. The first press-bond position and the second press-bond position are deviated from each other by a predetermined distance in a second direction crossing the first direction. This distance is substantially the same among the plurality of leads.

A bonding structure according to the present invention comprises a first component, a second component spaced apart from the first component in a first direction, and a bonding wire. The second component includes a pad surface facing a second direction perpendicular to the first direction. The bonding wire includes a first bond portion bonded to the first component and a second bond portion bonded to the pad surface of the second component. The bonding wire includes a landing portion extending from the second bond portion along the pad surface, a bent portion connected to the landing portion on a side opposite from the second bond portion, and a loop connected to the bent portion from the first bond portion side. The loop forms an angle between its portion connected to the bent portion and the pad surface which is larger than the angle formed between the landing portion and the pad surface. The loop and the landing portion extend in different directions from each other as viewed in the second direction.

Preferably, the bent portion is in contact with the pad surface.

Preferably, a plurality of the second components and a plurality of the bonding wires are provided in the bonding structure, and the landing portions of the bonding wires are parallel to each other.

Preferably, the loops of the bonding wires cross the first direction as viewed in the second direction, whereas the landing portions of the bonding wires are along the first direction as viewed in the second direction.

Preferably, the first bond portion, the bent portion and the second bond portion are at different positions from each other in a third direction perpendicular to both the first direction and the second direction, and the bent portion is spaced farther from the first bond portion than the second bond portion is in the third direction.

Preferably, a plurality of the bonding wires are bonded to the pad surface of the second component.

Preferably, the landing portions of the bonding wires are parallel to each other.

Preferably, the second component is elongated in a predetermined direction, and the landing portions of the bonding wires are along the longitudinal direction of the second component.

Preferably, the landing portion is 10-80 µm in length, and the angle formed between the portion of the loop which is connected to the bent portion and the pad surface is 60-80°.

Preferably, the first bond portion and the second component are spaced apart from each other by not more than 800 µm in the first direction.

Preferably, the first bond portion and the second bond portion are spaced apart from each other by not less than 100 µm in the second direction.

Preferably, an ultrasonic trace is formed in the second bond portion.

An electronic device according to the present invention includes the above-described bonding structure, and includes an electronic component as the first component, a lead as the second component, the bonding wire, and a resin package that seals the electronic component and the bonding wire.

Preferably, the electronic device further includes a die pad including an obverse surface and a reverse surface facing away from each other, and the electronic component is bonded on the obverse surface.

Preferably, the obverse surface of the die pad and the pad surface of the lead are flush with each other.

Preferably, the reverse surface of the die pad is exposed from the resin package.

Preferably, the lead is exposed from the resin package in the second direction.

Preferably, the lead and the resin package are different from each other in coefficient of thermal expansion.

According to this arrangement, as viewed in the second direction, the bonding wire is bent at the bent portion. As compared with a bonding wire that is entirely straight, the shape and arrangement of the bonding wire can be appropriately adapted to the arrangement of the first component and the second component. This allows size reduction of the bonding structure and the electronic device.

A resin-sealed type electronic component according to the present invention can be made by the following method. First, a first component and a second component that are spaced apart from each other in a first direction are prepared. Then, by operating a capillary that pays out a wire, a bonding wire is formed that electrically connects the first component and the second component. Then, the first component and the bonding wire are sealed with resin. The second component includes a pad surface facing a second direct ion perpendicular to the first direction. The step of forming a bonding wire includes a first bonding step of bonding a wire paid out from the capillary to the first component, and a second bonding step of cutting the wire while pressing the wire paid out from the capillary against the pad surface. The bonding wire forming step further includes a loop forming step which is performed between the first bonding step and the second bonding step and in which a bent portion is formed, and a landing portion forming step performed between the loop forming step and the second bonding step. The landing portion forming step includes a first step of providing a wire margin by moving the capillary away from the pad surface in the second direct ion while paying out the wire from the capillary, and a second step of moving the capillary closer to the pad surface in the second direction while moving the capillary away from the first component in the first direction.

According to this method, the wire margin provided by the first step is caused to lie flat on the pad surface by the second step. Since the capillary is moved also in the first direction in the second step, the wire margin extends along the first direction. Thus, the wire margin becomes the landing portion that, lies on the pad surface. It may be considered that, the structure similar to the landing portion of the present invention can be made just by moving the capillary along the first direct ion after the first step. In this case, however, the portion of the bonding wire formed in the preceding step is pulled by the capillary. In the method according to the present invention, the capillary is moved not only along the first, direction but also along the second direction. According to this method, the portion of the bonding wire which has been already formed is not pulled by the capillary.

According to this method, the landing portion lying on the pad surface can be formed without causing damage on the bonding wire. The landing portion forming step is performed between the loop forming step and the second bonding step, and the landing portion is formed between the bond portion of the bonding wire to the pad surface, and the bent portion. This means that, unlike the conventional semiconductor device, the bond portion of the bonding wire to the lead terminal does not stand on the lead terminal. Even if part of the bonding wire stands on the pad surface, such a standing portion ends at the bent portion. Thus, according to the making method of the present, invention, in the process of sealing the first component and the bonding wire with resin, the influence of the resin in a liquid state on the bond portion between the bonding wire and the pad surface is suppressed. Thus, wire sweep or detachment of the wire is unlikely to occur, which reduces the defective rate. The structure including a landing portion is unlikely to cause problems even if the bonding wire stands on the pad surface at the bent portion. This is advantageous for arranging the first component and the second component close to each other.

Preferably, the bent portion is formed by moving the capillary closer to the pad surface in the second direction, and the first step comprises moving the capillary along the second direction from a position where the bent portion is formed.

Preferably, the second step comprises moving the capillary in such a manner as to draw an arc within a plane containing the first direction and the second direction.

Preferably, in the second step, the capillary is moved along an arc of a circle having a center at the bent portion and a radius corresponding to the length of the wire margin.

Preferably, in the second step, the capillary is moved 30-60 μm along the first direction.

Preferably, the first component includes an electrode pad spaced apart from the pad surface in the second direction. The first bonding step comprises forming a ball portion at an end of the wire paid out from the capillary and press-bonding the ball portion against the electrode pad. The second bonding step comprises press-bonding the wire held by the capillary onto the pad surface by stitch bonding.

Preferably, the electrode pad and the pad surface are spaced apart from each other by not less than 100 μm in the second direction.

Preferably, the loop forming step comprises a step of moving the capillary away from the electrode pad in the second direction and a step of moving the capillary toward the pad surface in such a manner as to draw an arc.

Preferably, the step of moving the capillary toward the pad surface in such a manner as to draw an arc comprises moving the capillary such that the bonding wire forms an inclination angle of 60-80° with respect to the pad surface.

Preferably, the first component is a semiconductor chip, and the second component is a lead terminal. The method further includes the step of forming a lead frame including a die pad to which the semiconductor chip is to be bonded and the lead terminal. The step of sealing the first component and the bonding wire with resin comprises placing the lead frame in a mold, flowing resin into the mold and hardening the resin.

Preferably, the step of forming the lead frame comprises working a thin metal plate such that the die pad and the lead terminal are at a same position in the second direction.

A resin-sealed type electronic component according to the present invention comprises a first component, a second component spaced apart from the first component in a first direction, a bonding wire that electrically connects the first component and the second component to each other, and a resin package covering the first component and the bonding wire. The bonding wire is formed by operating a capillary. The second component includes a pad surface facing a second direction perpendicular to the first direction, and the pad surface is covered with the resin package. The bonding wire includes a first bond portion bonded to the first component, a second bond portion bonded to the pad surface, a bent portion provided between the first bond portion and the second bond portion in the first direction, and a landing portion provided between the bent portion and the second bond portion in the first direction. The bent portion is formed with a recess depressed toward the pad surface in the second direction.

Preferably, the bent portion includes a third bond portion bonded to the pad surface.

Preferably, the third bond portion overlaps the recess as viewed in the second direction.

Preferably, the thickness of the bent portion in the second direction is larger than that of the second bond portion.

Preferably, the length of the landing portion in the first direction is larger than the diameter of the bonding wire.

Preferably, the length of the landing portion in the first direction is 10-80 μm.

Preferably, the first component is a semiconductor chip including an obverse surface and a reverse surface facing away from each other in the second direction and an electrode pad provided on the obverse surface, and the first bond portion is bonded to the electrode pad.

Preferably, the height difference between the first bond portion and the second bond portion in the second direction is not less than 100 μm.

Preferably, the bonding wire includes a loop provided between the first bond portion and the bent portion, and the loop is inclined at an inclination angle of 60-80° to the pad surface.

Preferably, the rein-sealed type electronic component according to the present invention further comprises a die pad including an upper surface and a lower surface facing away from each other in the second direction and supporting the reverse surface of the first component. The upper surface of the die pad is bonded to the reverse surface of the first component. The upper surface of the die pad and the pad surface are at a same position in the second direction.

A resin-sealed type electronic component according to the present invention can be made by the following method. A bonding wire that electrically connects a first component and a second component that are spaced apart from each other in a first direction is formed by operating a capillary that pays oat a wire. The first component and the bonding wire are sealed with resin. The second component includes a pad surface facing a second direction perpendicular to the first direction. The step of forming a bonding wire comprises: a first bonding step of bonding a wire paid out from the capillary to the first component; a second bonding step of cutting the wire paid out from the capillary while bonding the wire onto the pad surface; a loop forming step performed between the first bonding step and the second bonding step; a landing portion forming step performed between the loop forming step and the second bonding step, and a wire, contact step performed between the loop forming step and the landing portion forming step. The wire contact step comprises moving the capillary toward the pad surface in the second direction to bring the wire into contact with the pad surface. The landing portion forming step comprises a first step of providing a wire margin by moving the capillary away from the pad surface in the second direction while paying out the wire from the capillary, and a second step of moving the capillary in the first direction.

According to this method, since the wire is brought into contact with the pad surface in the wire contact step, it is easy to cause the landing portion to lie on the pad surface in the landing portion forming step performed later. In other words, since the starting point of the landing portion is in contact with the pad surface, the wire of the portion corresponding to the wire margin provided in the first, step naturally lie on the pad surface. Thus, according to the method of the present invention, the landing portion extending along the pad surface is formed relatively easily. The landing portion forming step is performed between the loop forming step and the second bonding step, and the landing portion is formed between the bond portion between the pad surface and the bonding wire, and the bent, portion. This indicates that, unlike the conventional semiconductor device, the bond portion of the bonding wire to the lead terminal does not stand on the lead terminal. Even if part of the bonding wire stands on the pad surface, such a standing portion ends at the bent portion. Thus, according to the making method of the present invention, in the step of sealing the first component and the bonding wire with resin, the influence of the resin in a liquid state on the bond portion between the bonding wire and the pad surface is suppressed. Thus, wire sweep or detachment of the wire is unlikely to occur, which improves the defective rate. The structure including a landing portion is unlikely to cause problems even if the bonding wire stands on the pad surface at the bent portion. This is advantageous for arranging the first component and the second component close to each other.

Preferably, the step of forming the bonding wire comprises a wire bonding step performed between the wire contact step and the landing portion forming step.

Preferably, the wire bonding step comprises press-bonding the wire onto the pad surface by stitch bonding.

Preferably, in the second step, the capillary is moved 30-60 μm along the first direction.

Preferably, the first component includes an electrode pad spaced apart from the pad surface in the second direction. The first bonding step comprises forming a ball portion at an end of the wire paid out from the capillary and press-bonding the ball portion against the electrode pad. The second bonding step comprises press-bonding the wire held by the capillary onto the pad surface by stitch bonding.

Preferably, the electrode pad and the pad surface are spaced apart from each other by not less than 100 μm in the second direction.

Preferably, the loop forming step comprises a step of moving the capillary away from the electrode pad in the second direction and a step of moving the capillary toward the pad surface in such a manner as to draw an arc.

Preferably, the step of moving the capillary toward the pad surface in such a manner as to draw an arc comprises moving the capillary such that the bonding wire forms an inclination angle of 60-80° with respect to the pad surface.

Preferably, the first component is a semiconductor chip, and the second component is a lead terminal. The method further comprises the step of forming a lead frame including a die pad to which the semiconductor chip is to be bonded and the lead terminal. The step of sealing the first component and the bonding wire with resin comprises placing the lead frame in a mold, flowing resin into the mold and hardening the resin.

Preferably, the step of forming the lead frame comprises working a thin metal plate such that the die pad and the lead terminal are at a same position in the second direction.

Other features and advantages of the present invention will become more apparent from detailed description given below with reference to the accompanying drawings.

BRIEF DESCRIPTION OP THE DRAWINGS

FIG. 8 shows a step subsequent to the step shown in FIG. 7;

Figure 23:
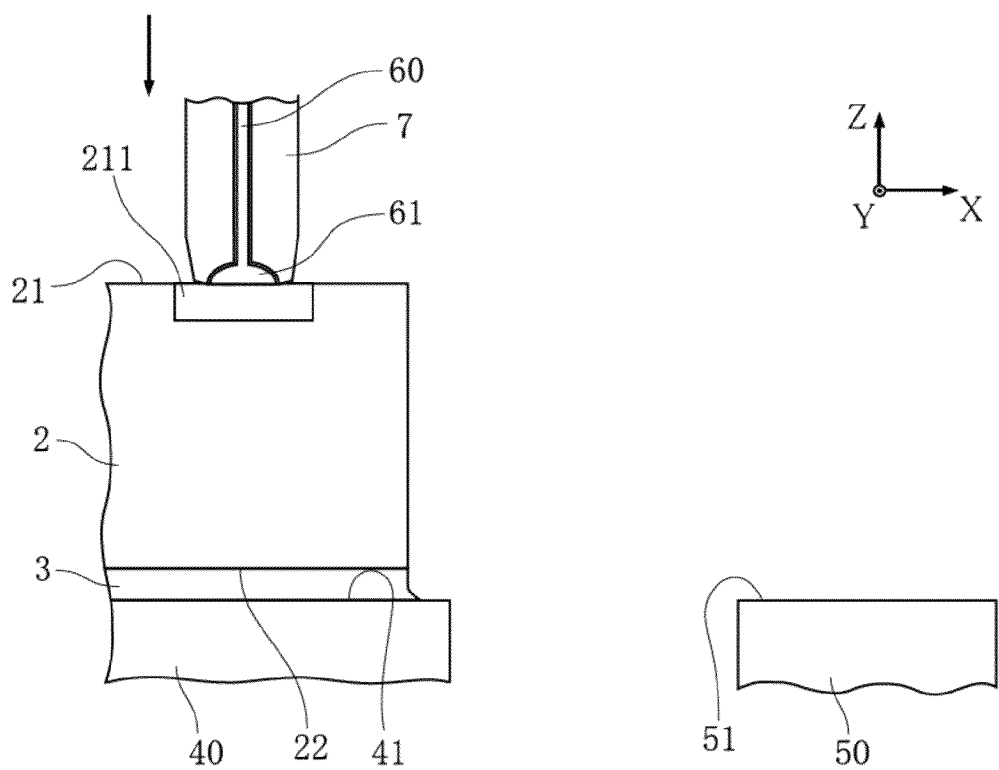
FIG. 23 is a schematic view showing part of a process for making the electronic device of FIG. 18.
Figure 24:
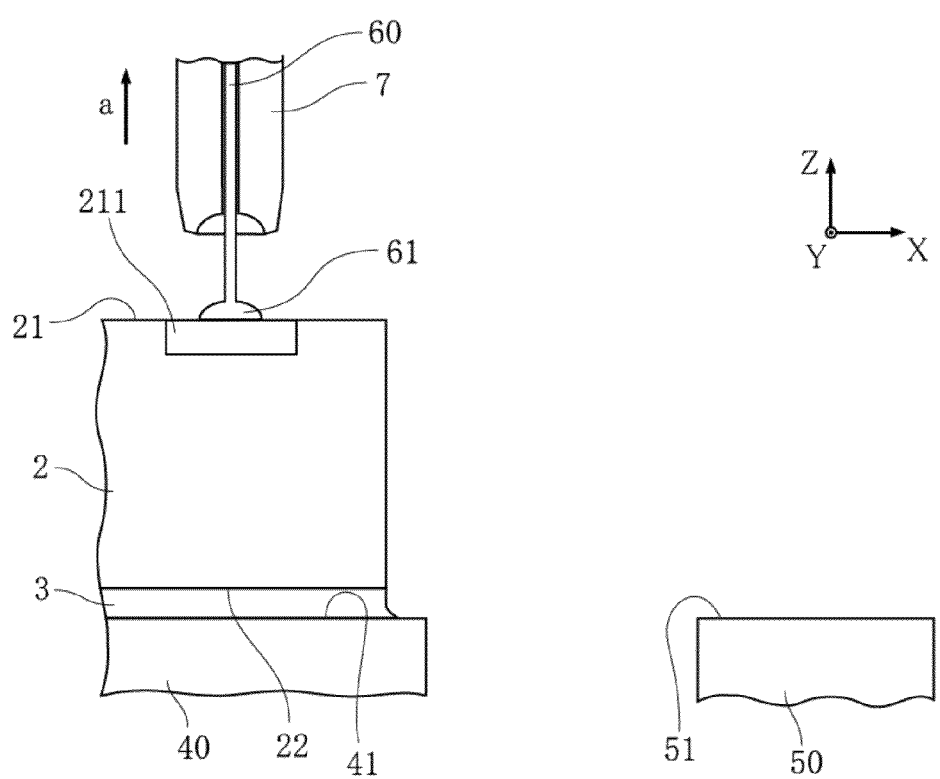
Figure 25:
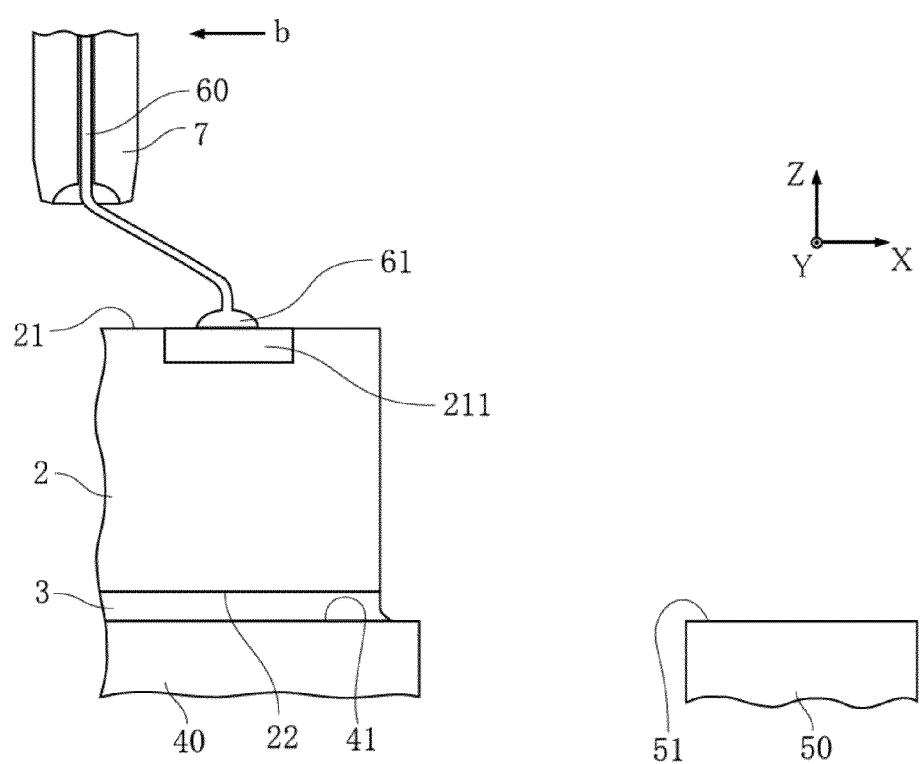
Figure 26:
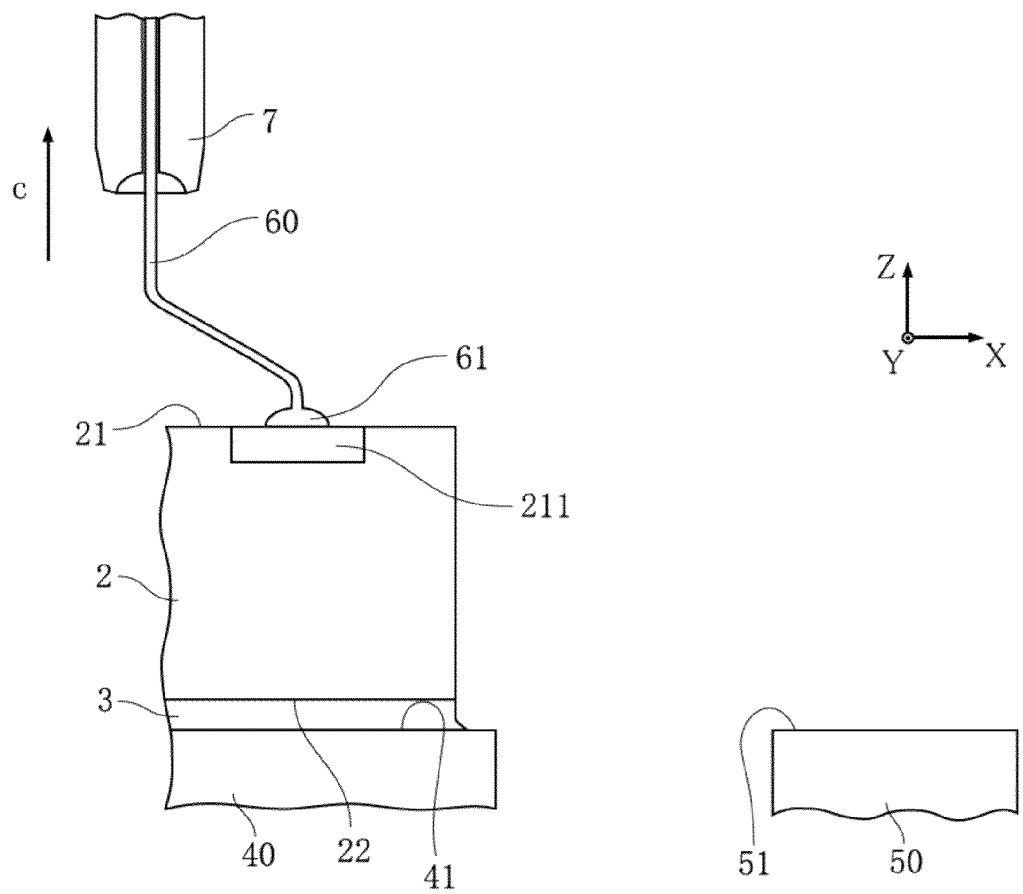
Figure 27:
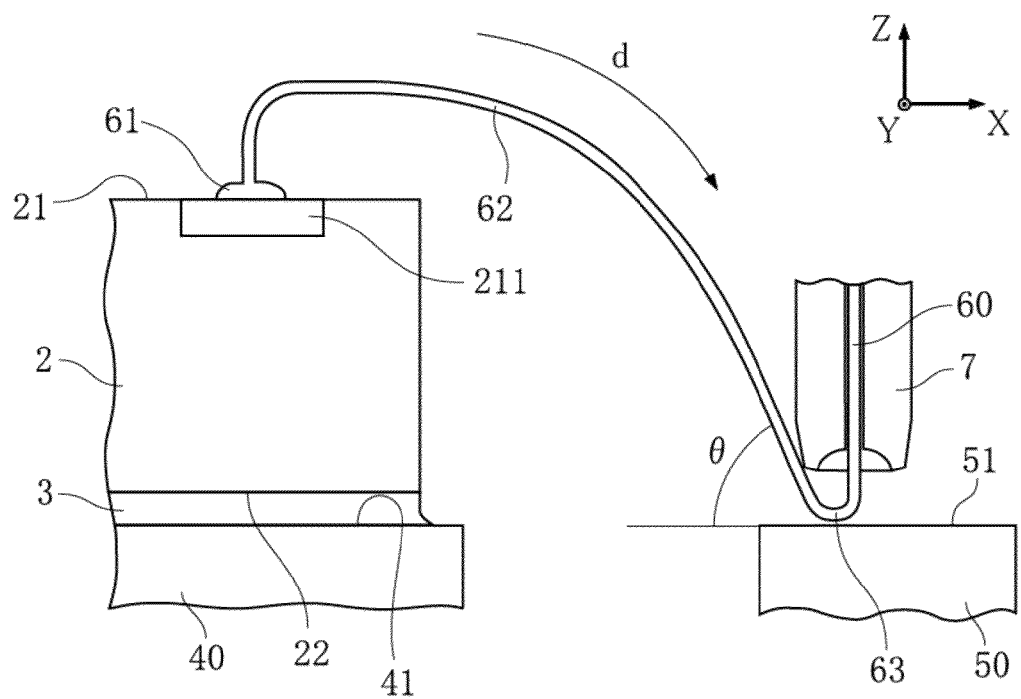
Figure 28:
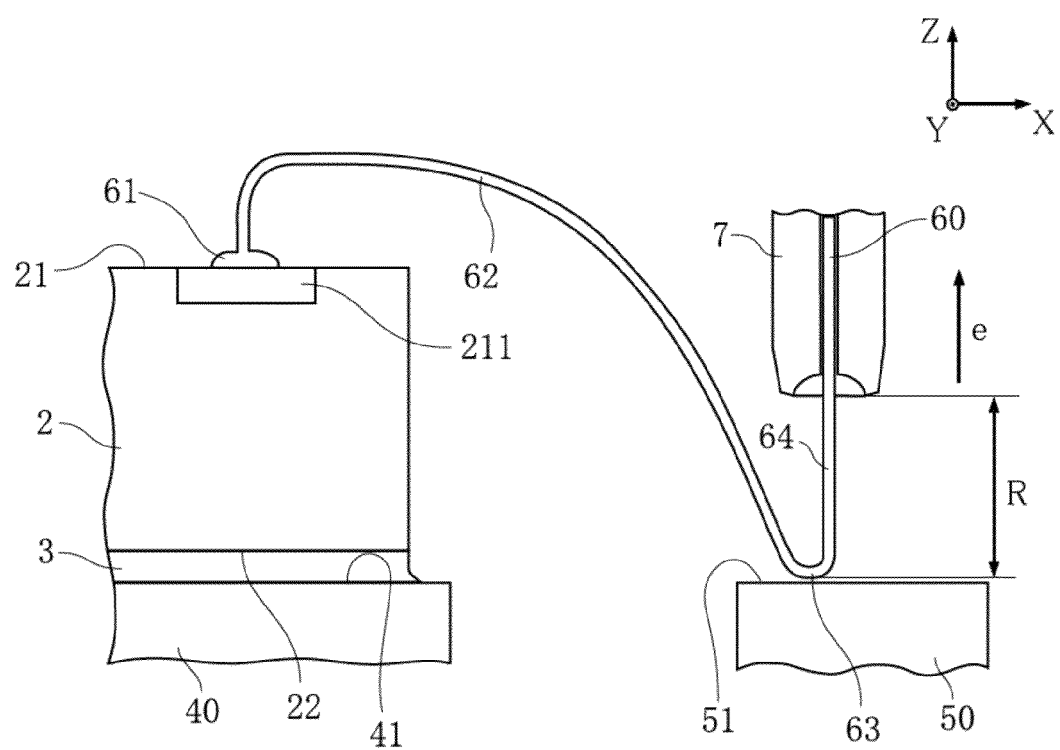
Figure 29:
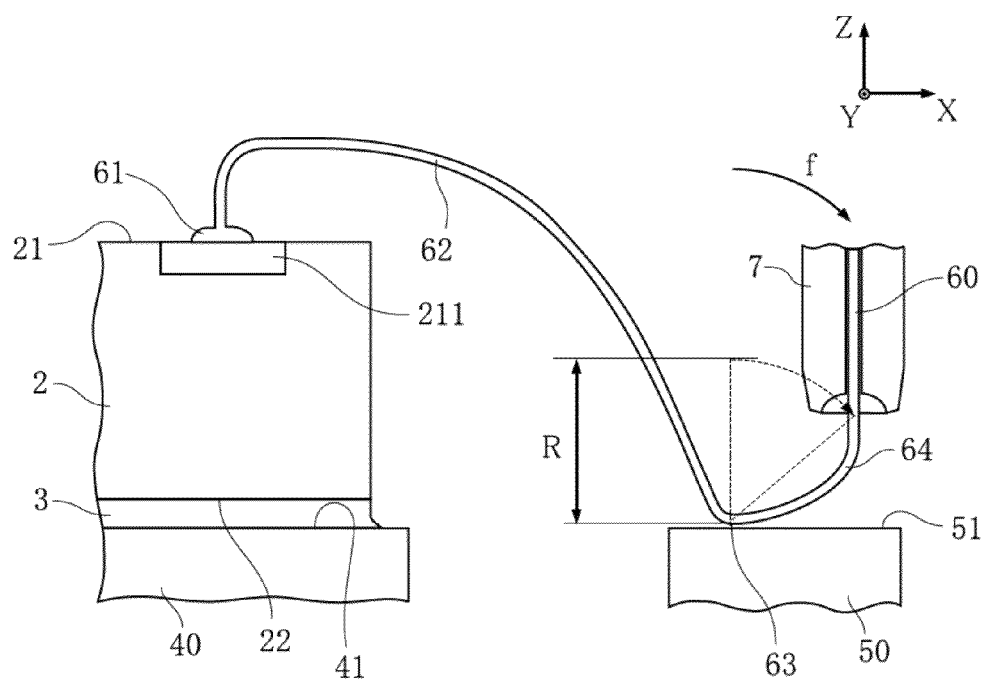
Figure 30:
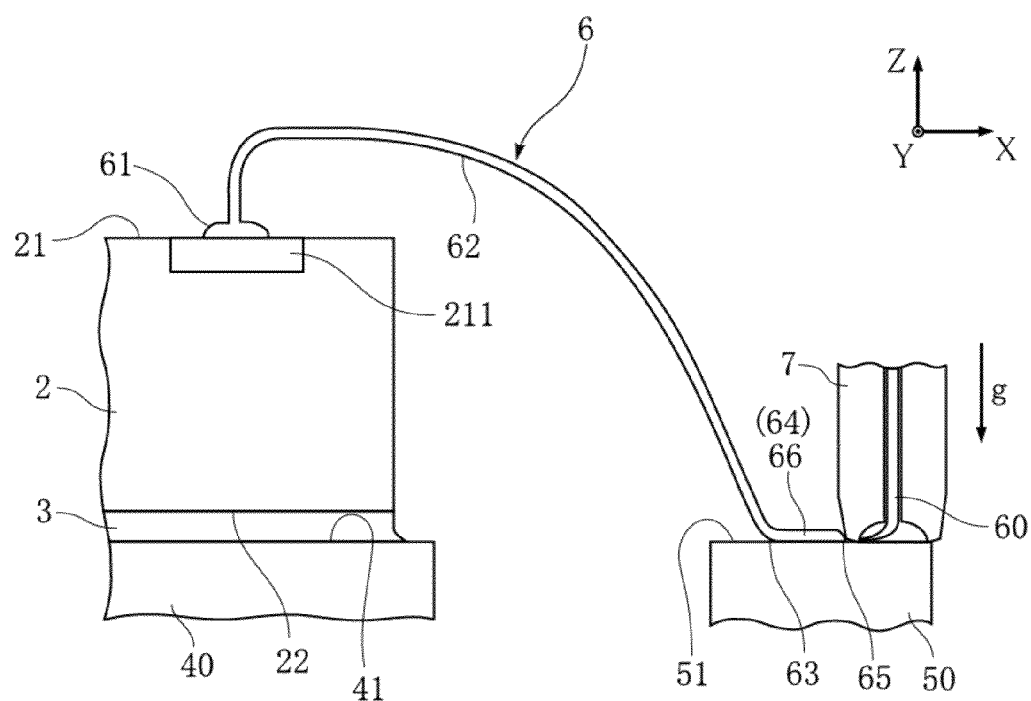
Figure 31:
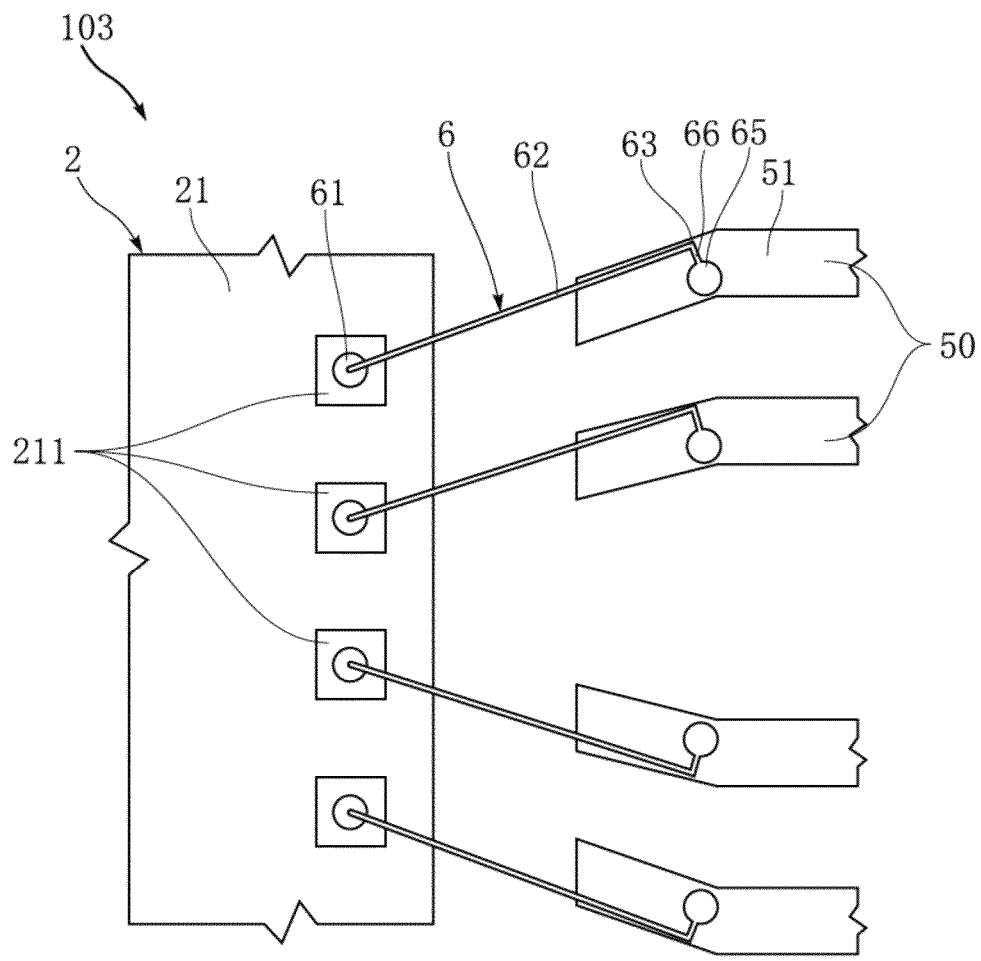
Figure 33:
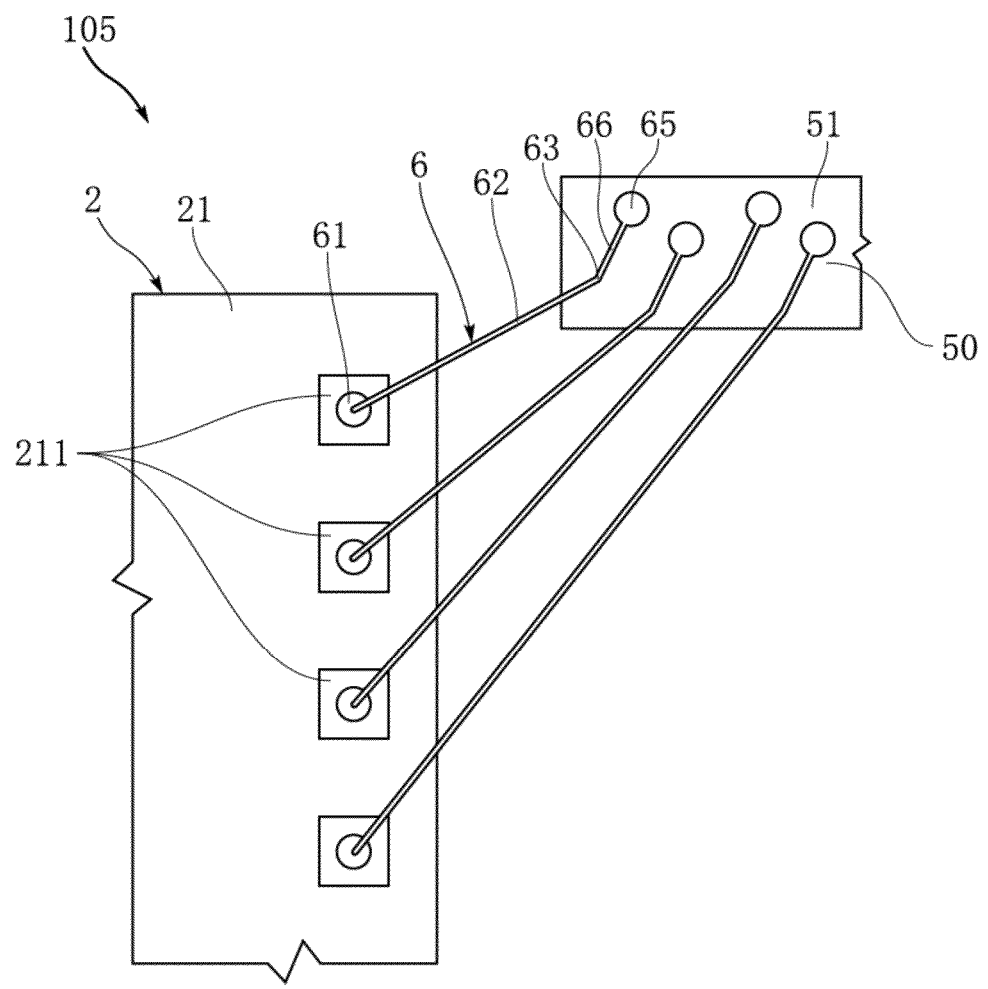
Figure 34:
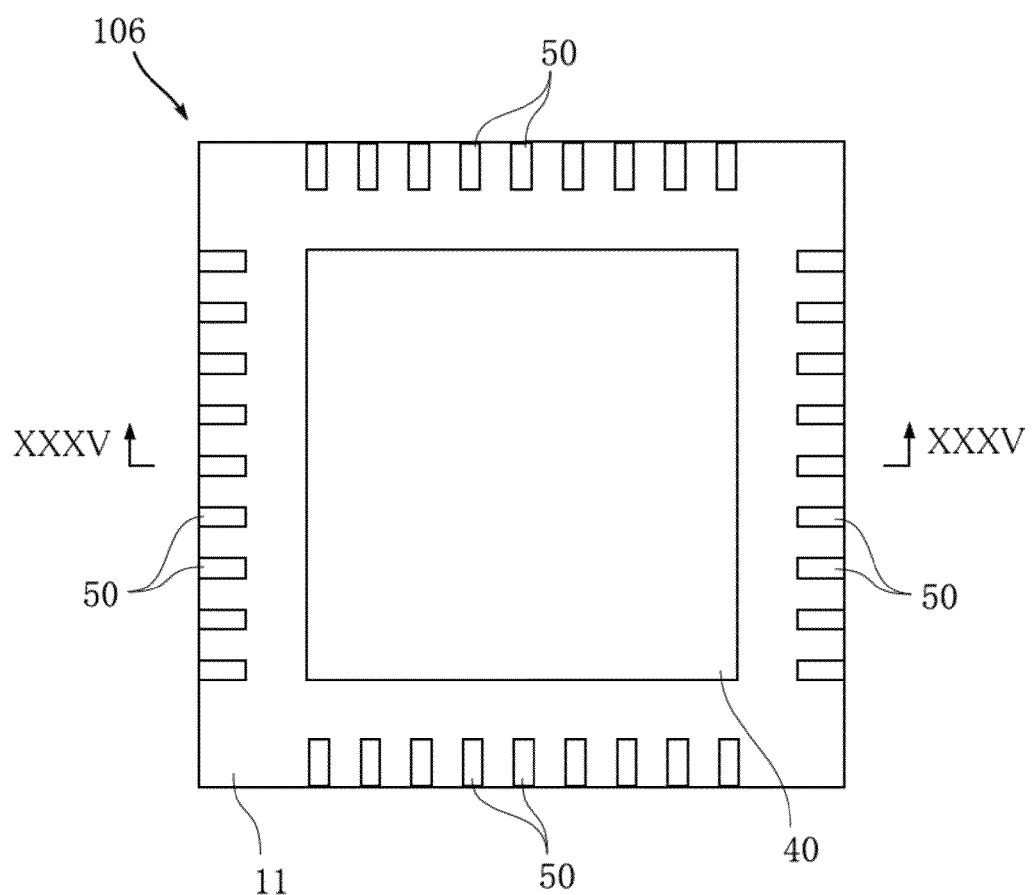
Figure 35:
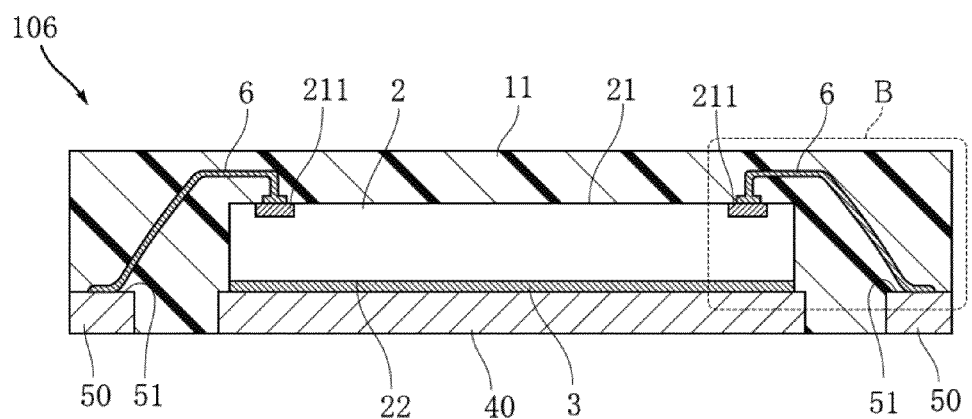
Figure 36:
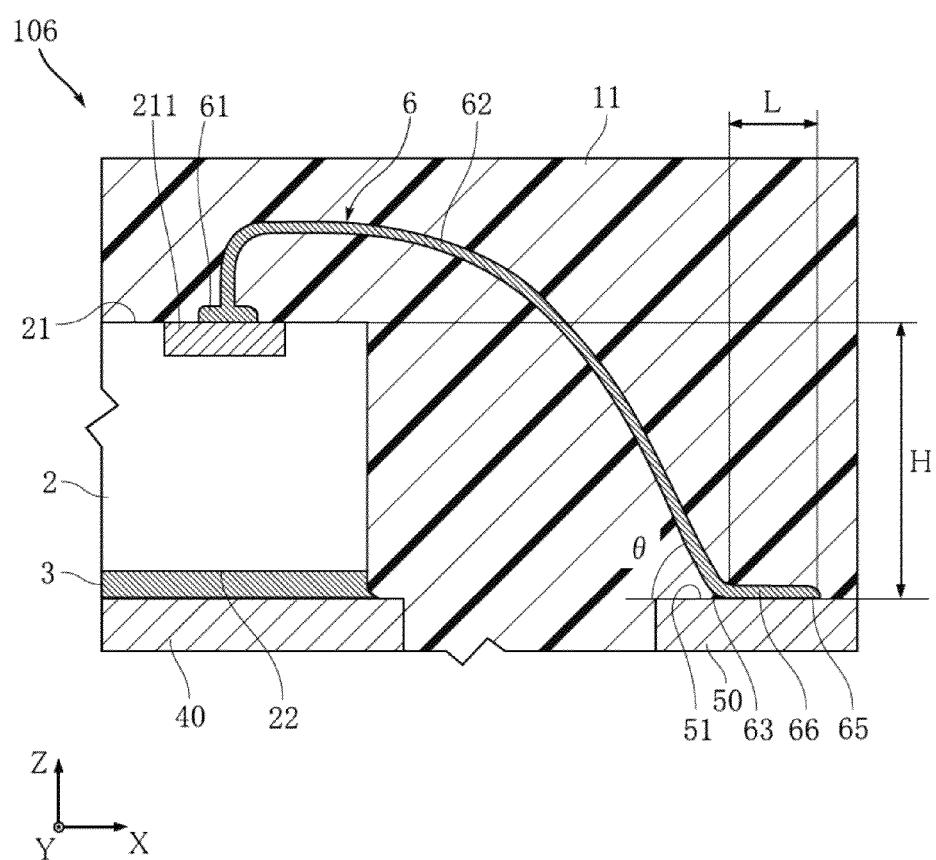
Figure 37:
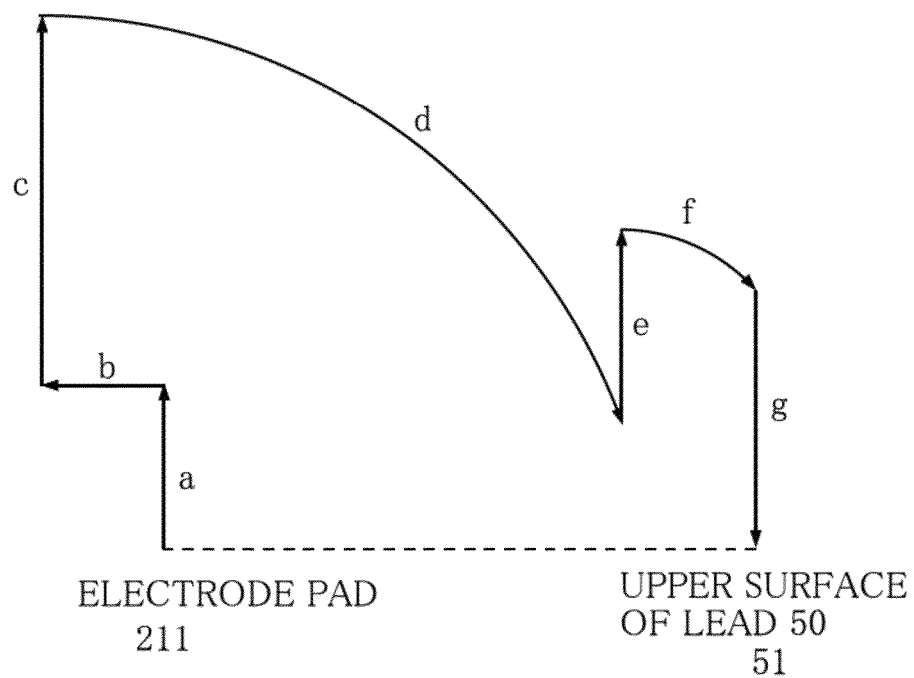
Figure 38:
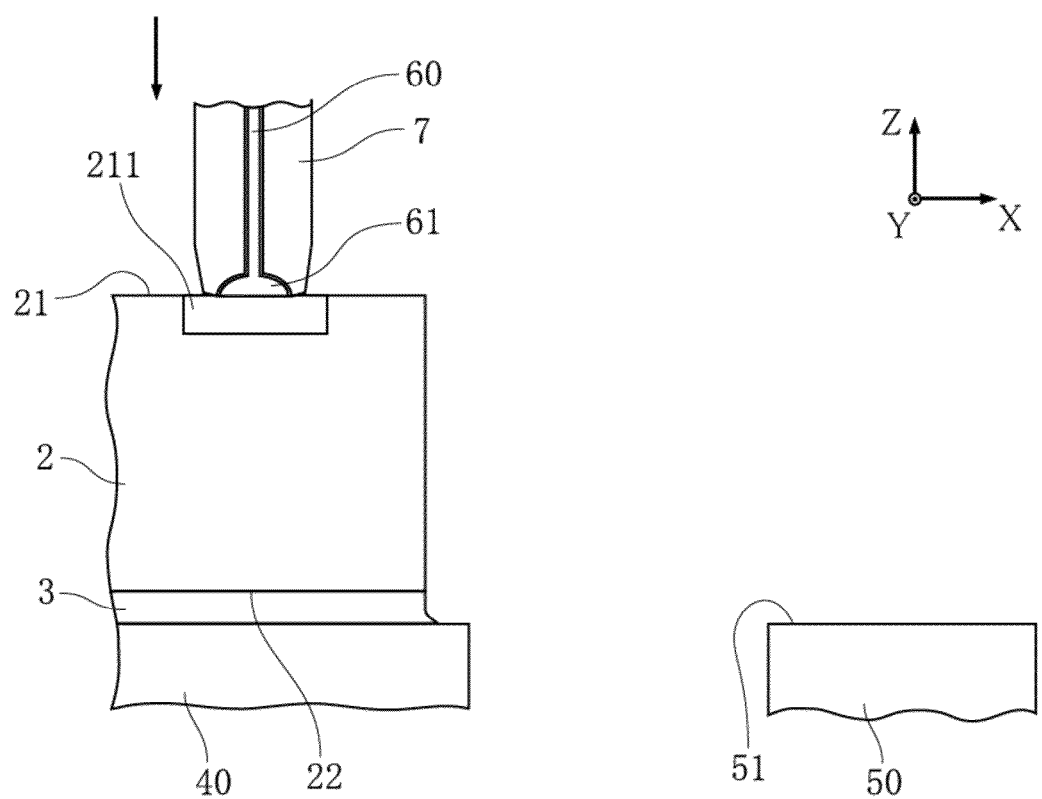
Figure 39:
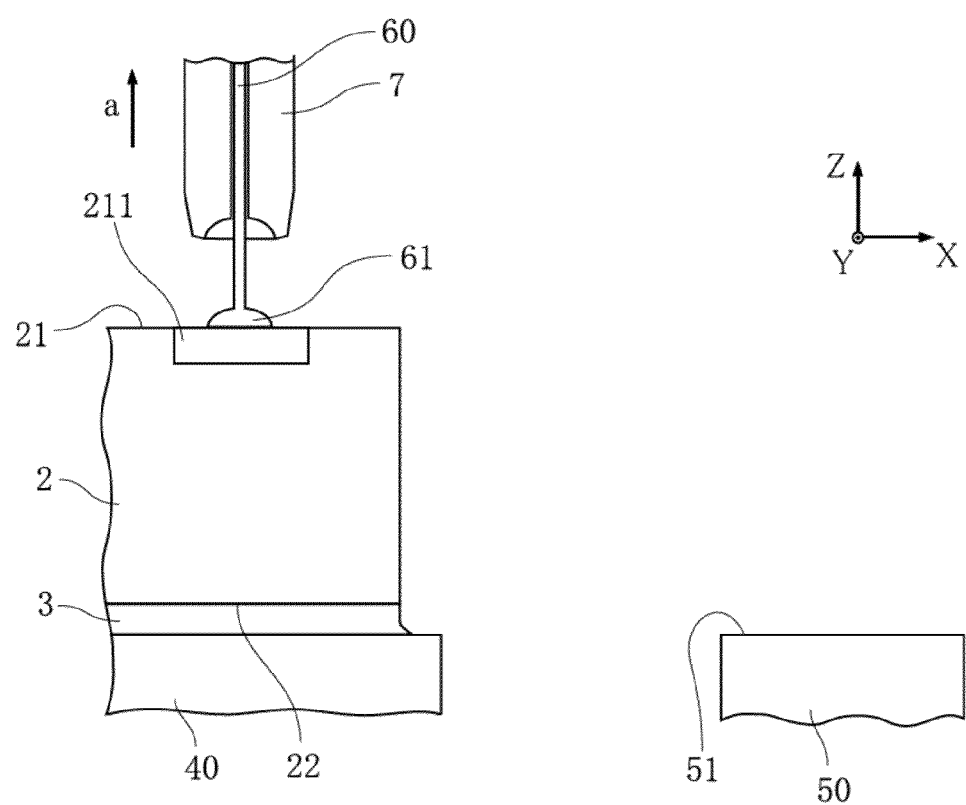
Figure 40:
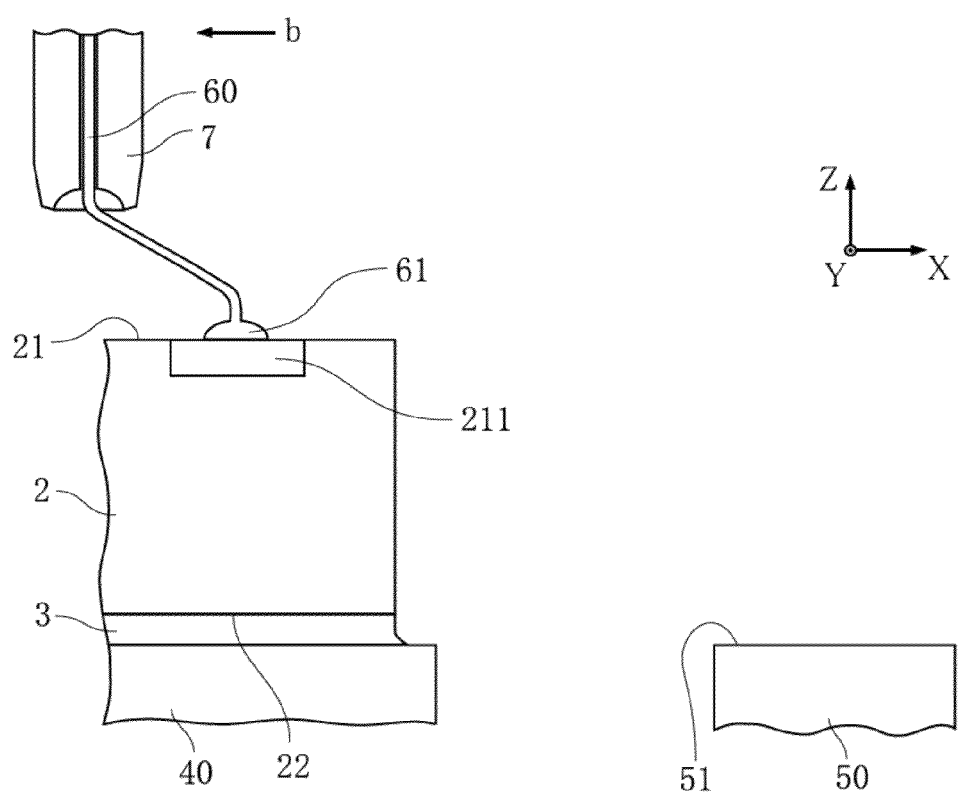
Figure 41:
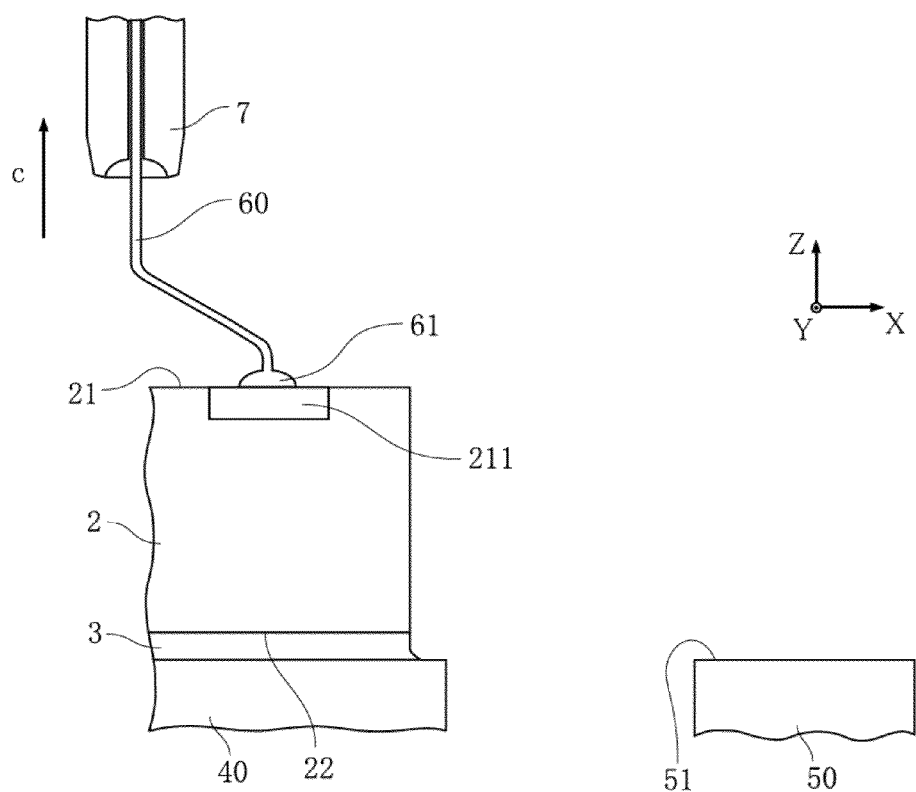
Figure 42:
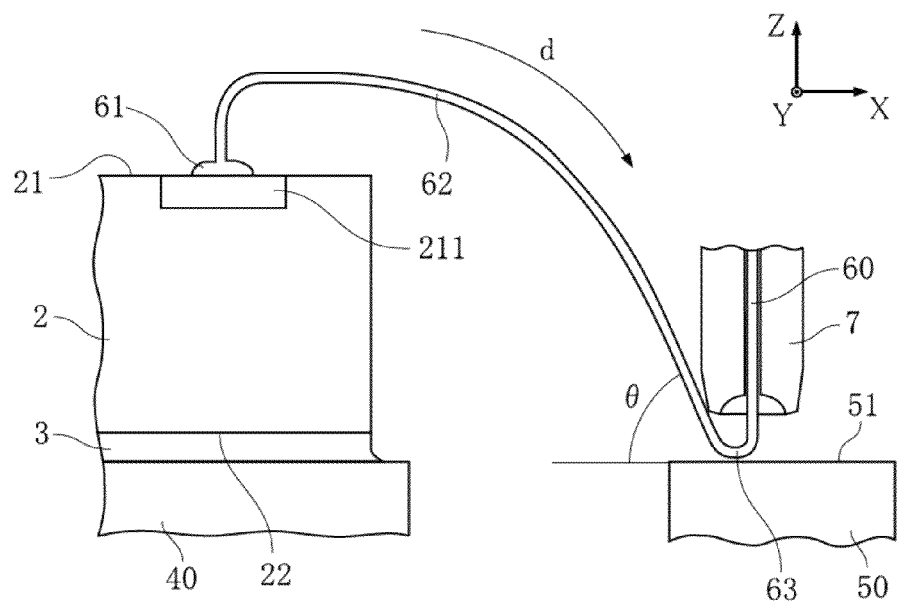
Figure 43:
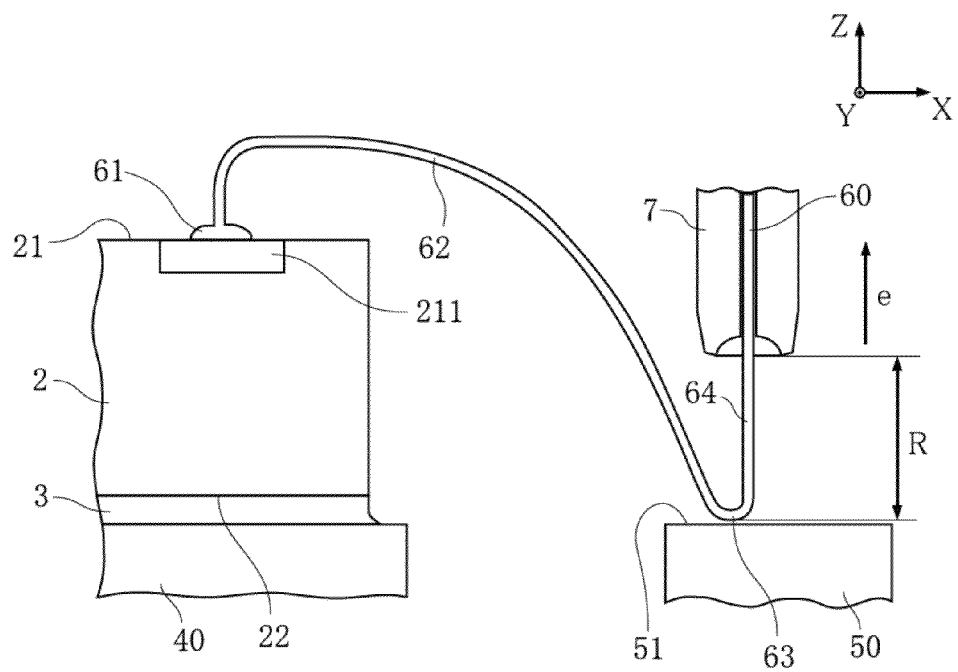
Figure 44:
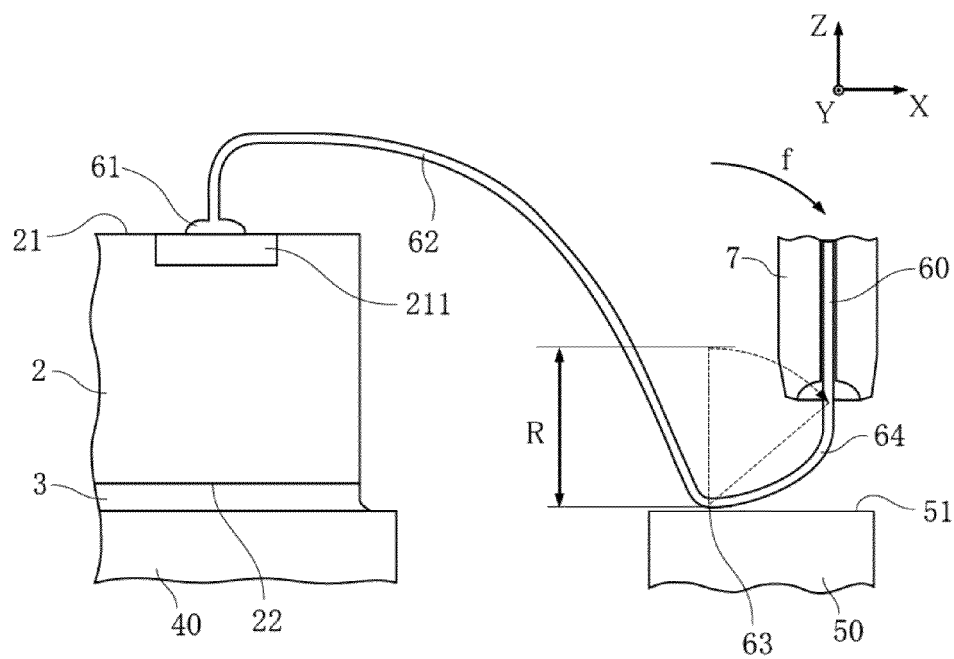
Figure 45:
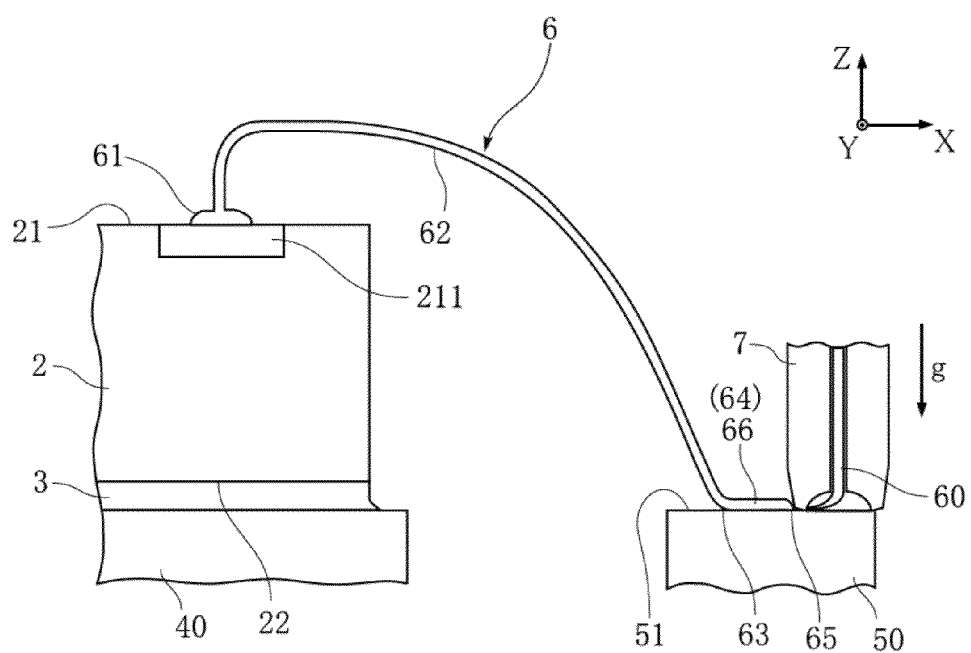
Figure 46:
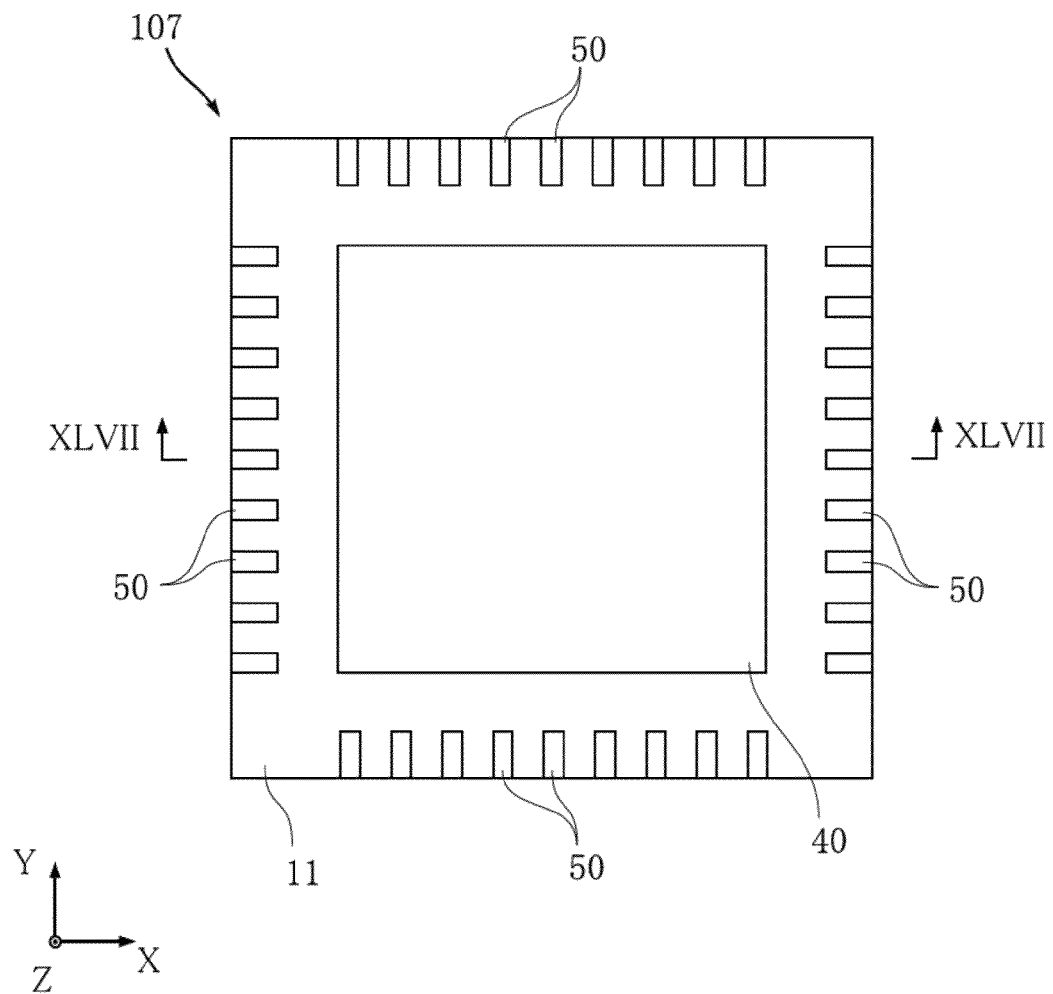
Figure 47:
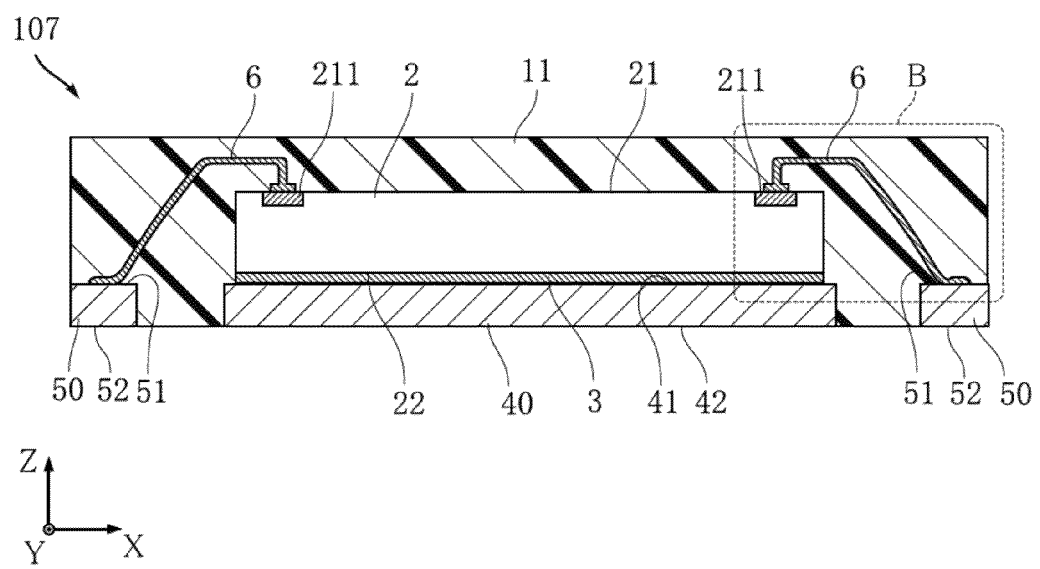
Figure 48:
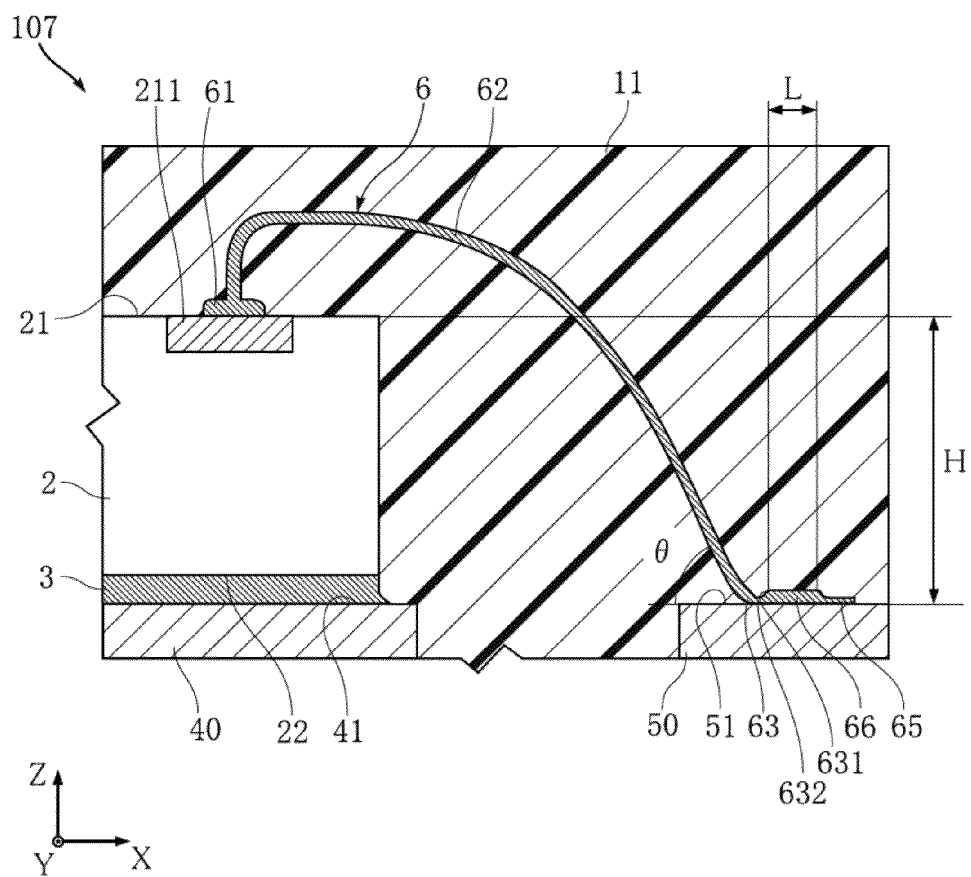
Figure 49:
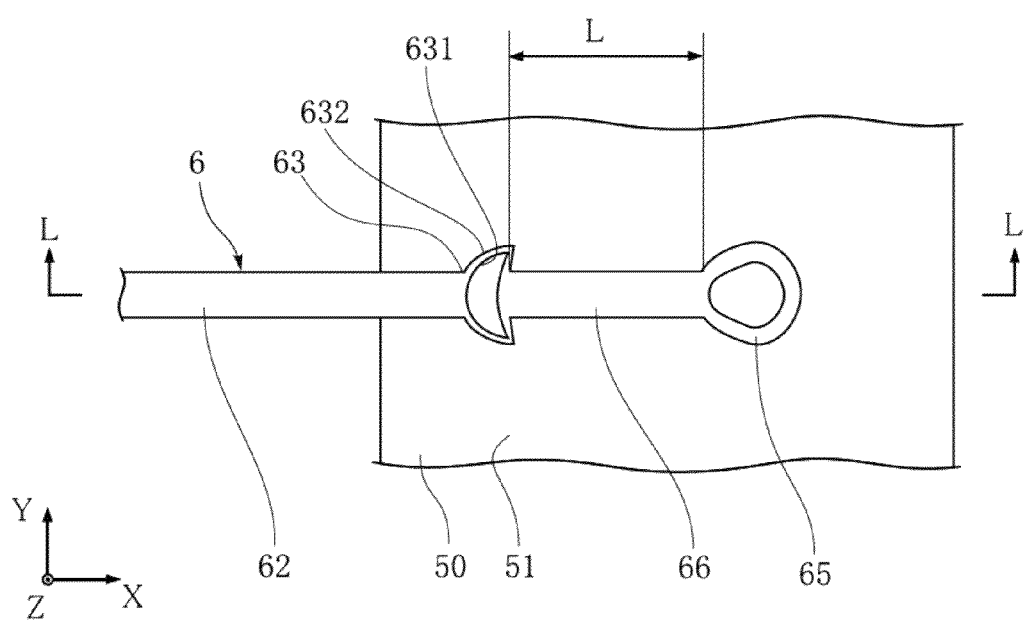
Figure 50:
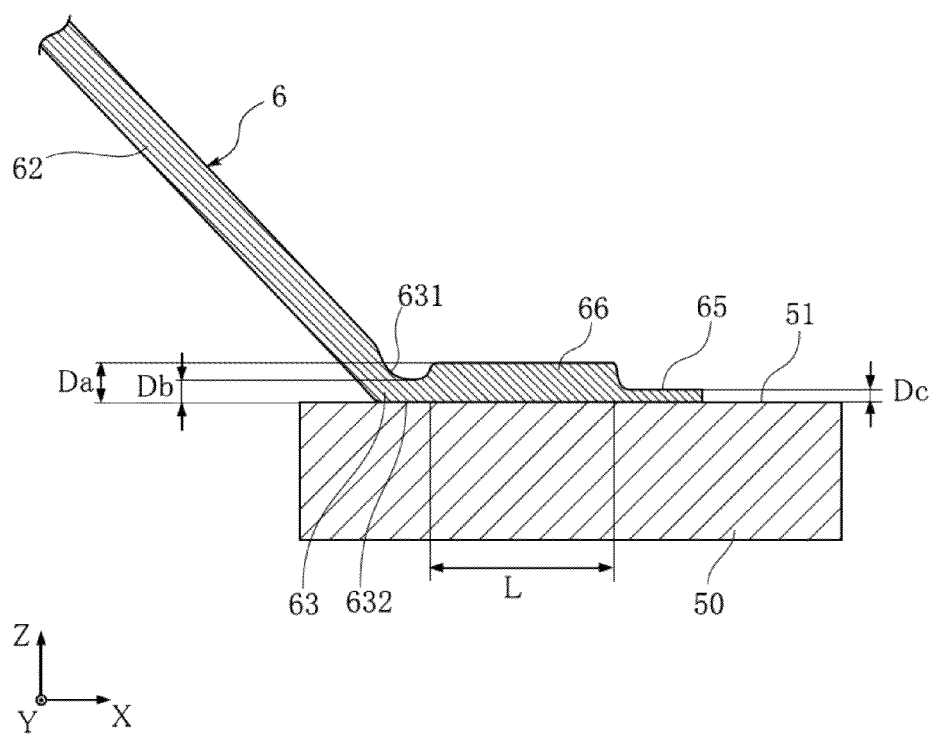
Figure 51:
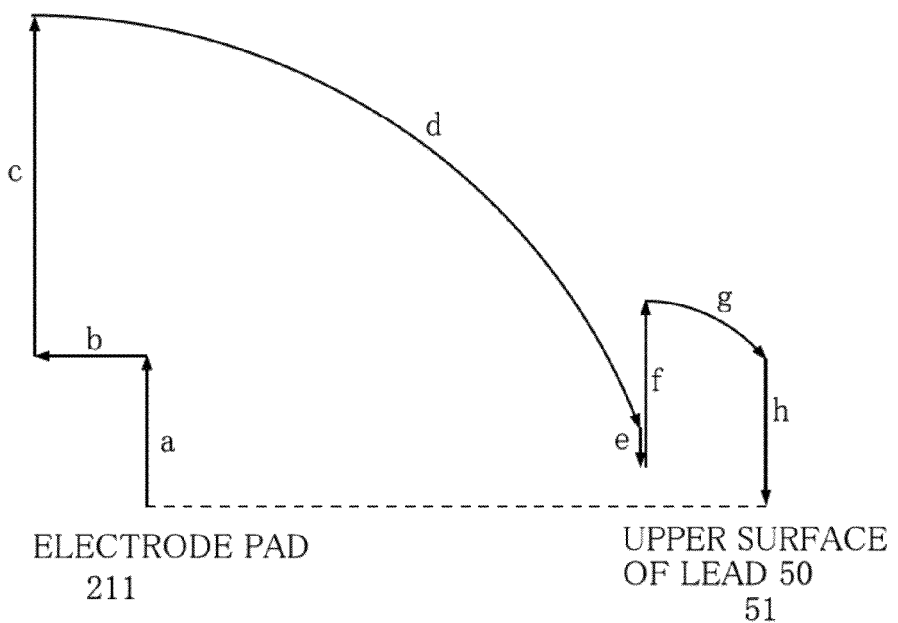
Figure 52:
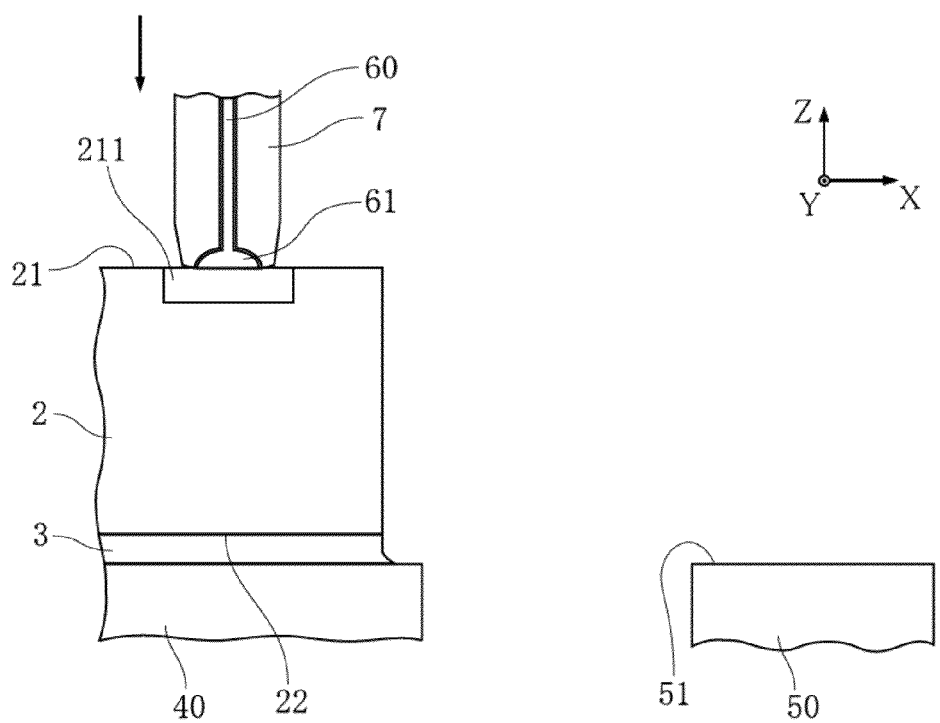
Figure 53:
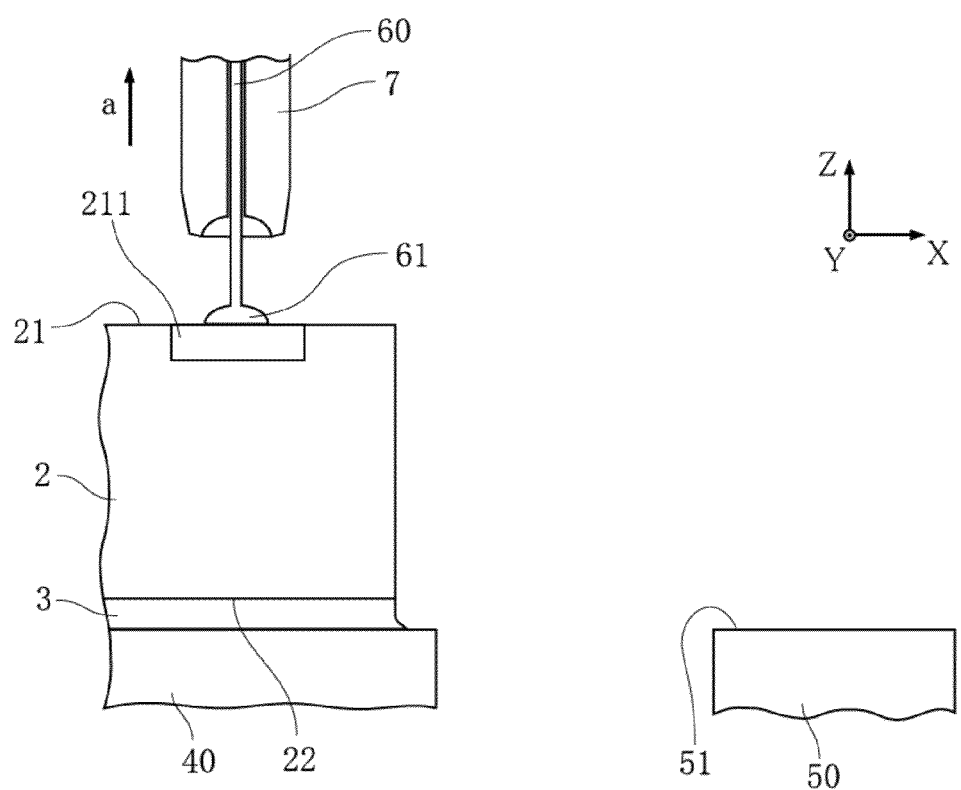
Figure 54:
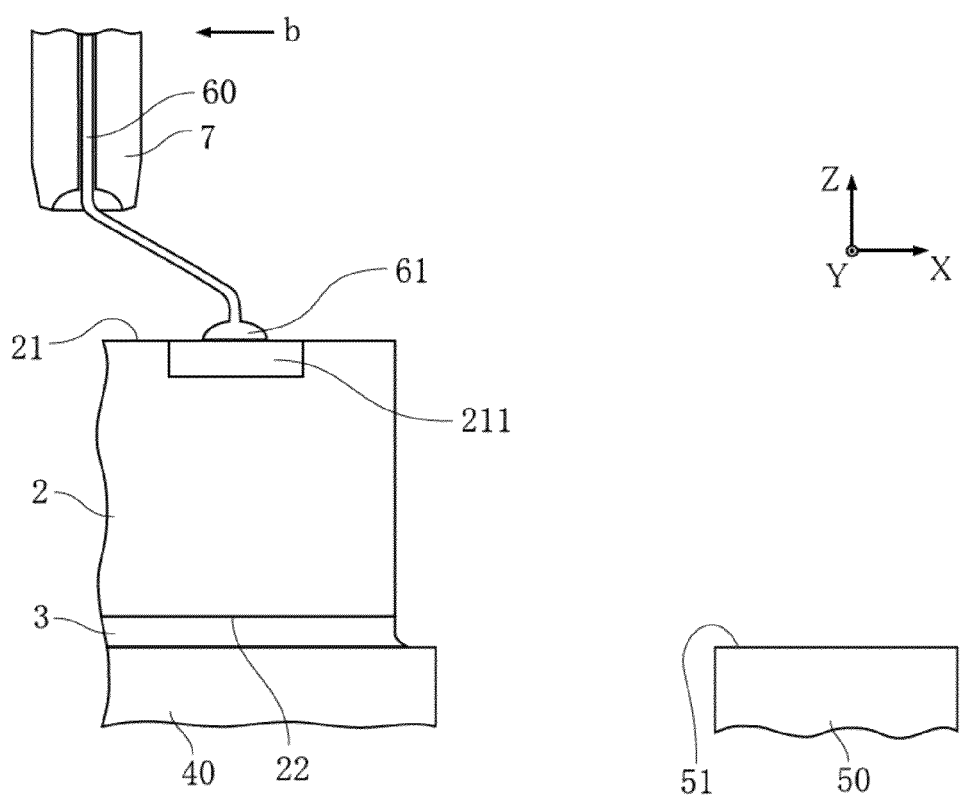
Figure 55:
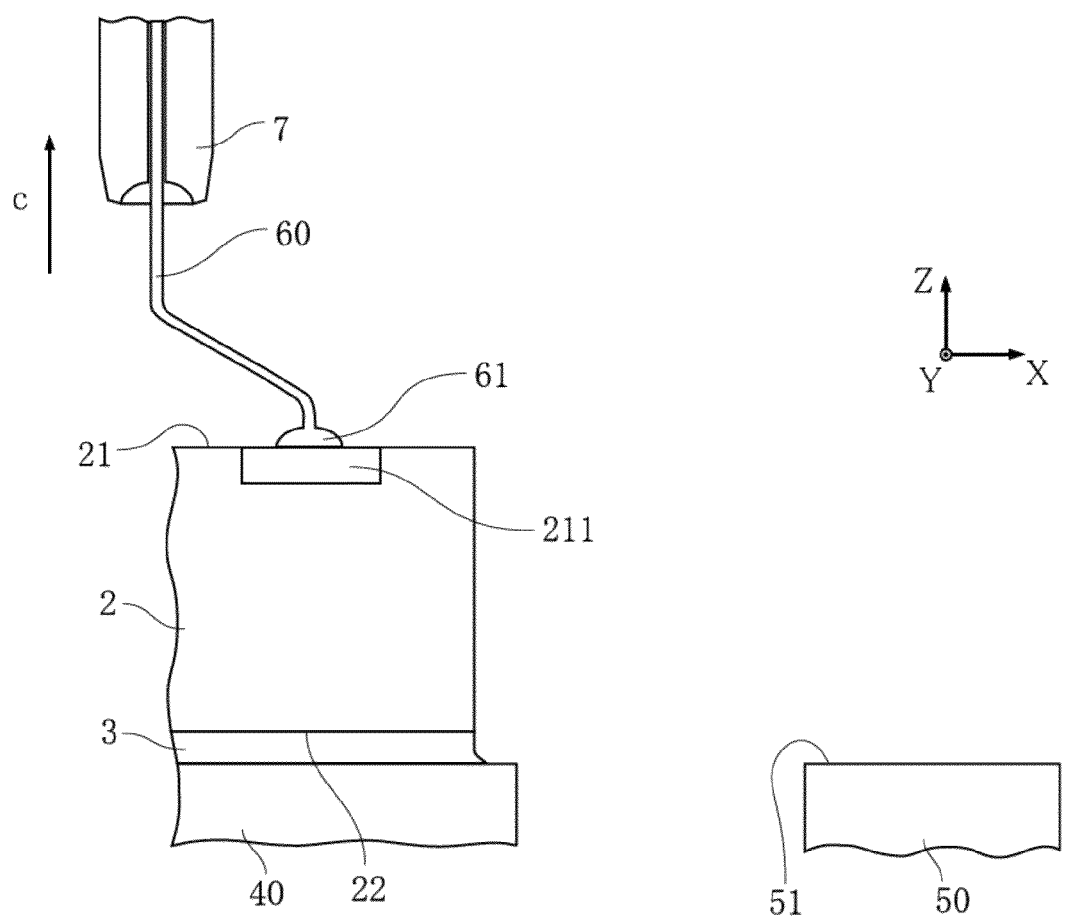
Figure 56:
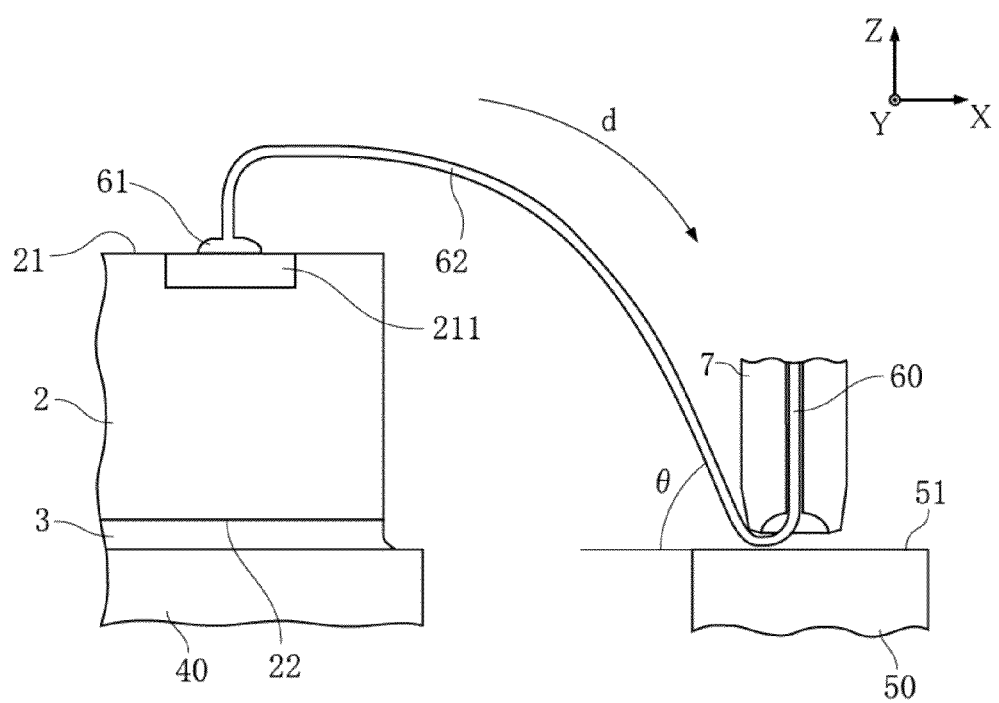
Figure 57:
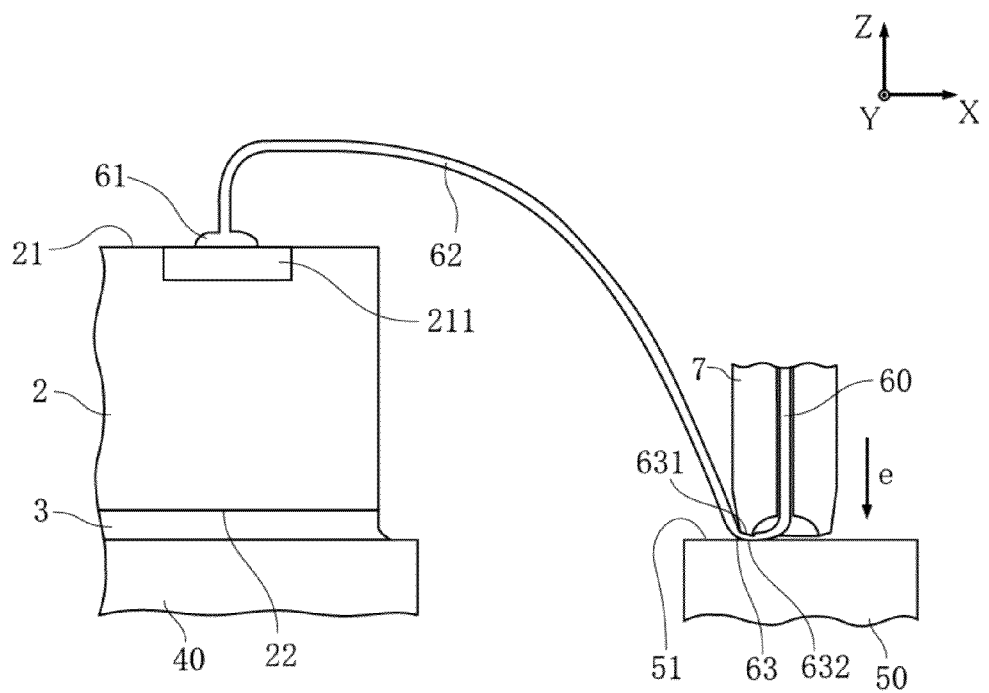
Figure 58:
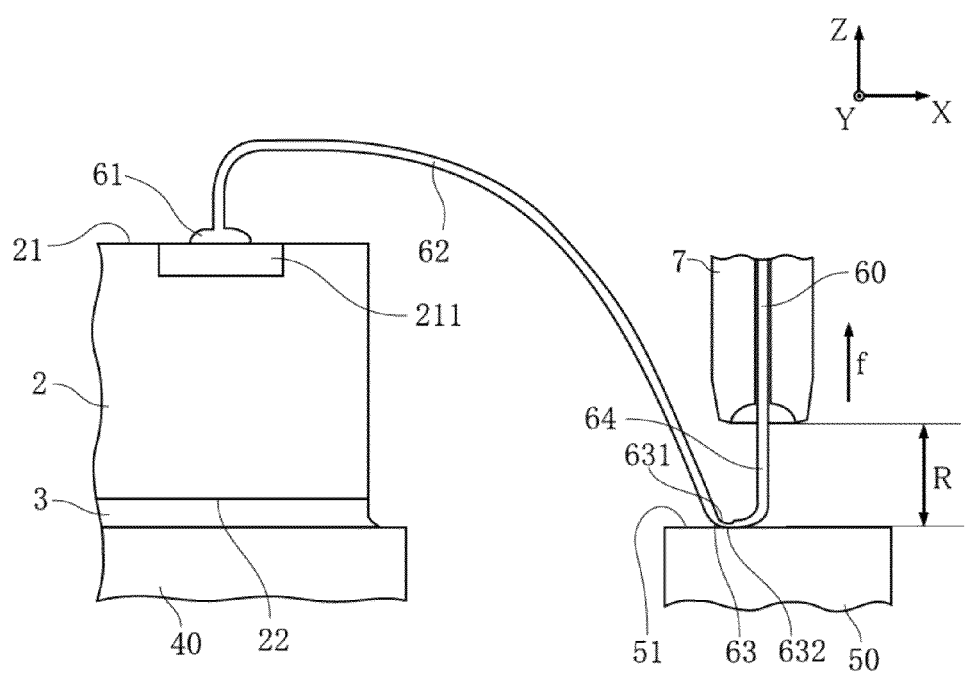
Figure 59:
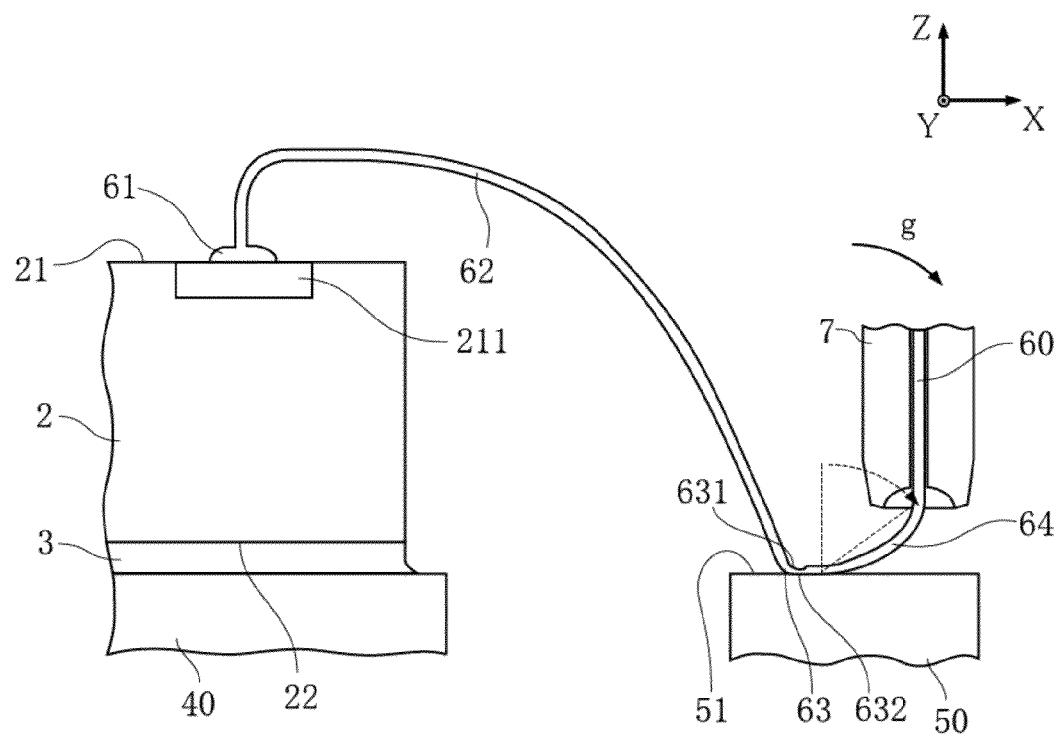
Figure 60:
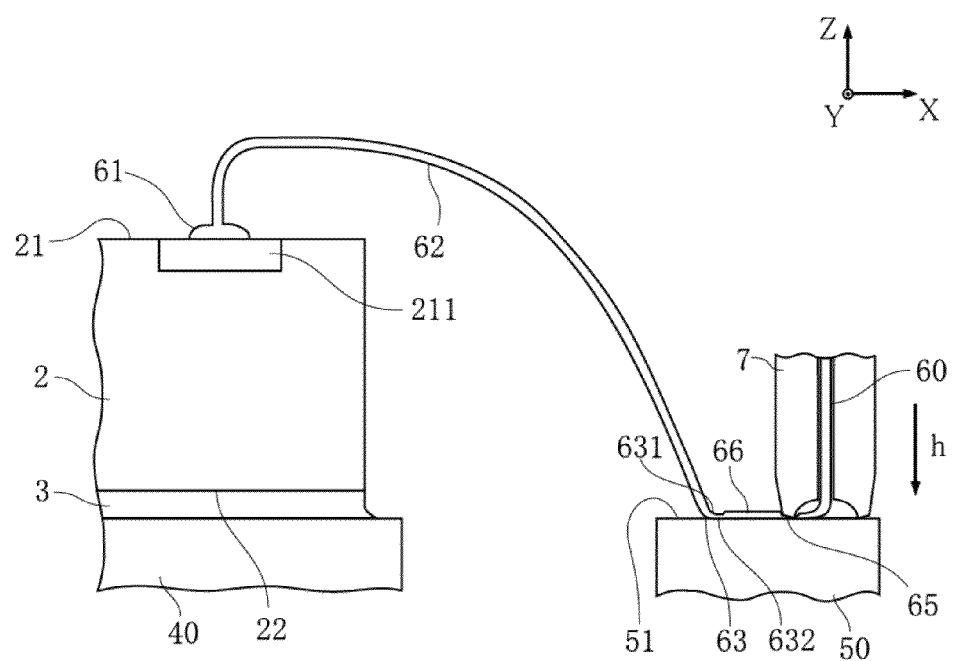

FIG. 24 shows a step subsequent to the step of FIG. 23;
FIG. 25 shows a step subsequent to the step of FIG. 24;
FIG. 26 shows a step subsequent to the step of FIG. 25;
FIG. 27 shows a step subsequent to the step of FIG. 26;
FIG. 28 shows a step subsequent to the step of FIG. 27;
FIG. 29 shows a step subsequent to the step of FIG. 28;
FIG. 30 shows a step subsequent to the step of FIG. 29;

FIG. 31 is a schematic plan view showing an electronic device according to a third embodiment of the present invention;

FIG. 32 is a schematic plan view showing an electronic device according to a fourth embodiment of the present invention;

FIG. 33 is a schematic plan view showing an electronic device according to a fifth embodiment of the present invention;

FIG. 34 is a schematic bottom view showing an example of resin-sealed type electronic component made by a method according to an embodiment of the present invention;

FIG. 35 is a sectional view taken along lines XXXV-XXXV in FIG. 34;

FIG. 36 is an enlarged view showing a principal portion of FIG. 35;

FIG. 37 shows a track of a capillary in a process of forming a bonding wire;

FIG. 38 is a schematic view showing part of a process for making the resin-sealed type electronic device of FIG. 34;

FIG. 39 shows a step subsequent to the step of FIG. 38;
FIG. 40 shows a step subsequent to the step of FIG. 39;
FIG. 41 shows a step subsequent to the step of FIG. 40;
FIG. 42 shows a step subsequent to the step of FIG. 41;
FIG. 43 shows a step subsequent to the step of FIG. 42;
FIG. 44 shows a step subsequent to the step of FIG. 43;
FIG. 45 shows a step subsequent to the step of FIG. 44;

FIG. 46 is a schematic bottom view showing a resin-sealed, type electronic component according to an embodiment of the present invention;

FIG. 47 is a sectional view taken along lines XLVII-XLVII in FIG. 46;

FIG. 48 is an enlarged view showing a principal portion of FIG. 47;

FIG. 49 is a plan view showing a principal portion of the bonding wire shown in FIG. 48;

FIG. 50 is a sectional view taken along lines L-L in FIG. 49;

FIG. 51 shows a track of a capillary in a process of forming a bonding wire;

FIG. 52 is a schematic view showing part of a process for making a resin-sealed type electronic device according to the present invention;

FIG. 53 shows a step subsequent to the step of FIG. 52;
FIG. 54 shows a step subsequent to the step of FIG. 53;
FIG. 55 shows a step subsequent to the step of FIG. 54;
FIG. 56 shows a step subsequent to the step of FIG. 55;
FIG. 57 shows a step subsequent to the step of FIG. 56;
FIG. 58 shows a step subsequent to the step of FIG. 57;
FIG. 59 shows a step subsequent to the step of FIG. 58;
FIG. 60 shows a step subsequent to the step of FIG. 59; and FIG. 61 is a schematic view showing an example of conventional semiconductor device.

DETAILED DESCRIPTION OF THE PREFERRED EMBODIMENTS

Embodiments of the present invention are described below with reference to the accompanying drawings.

Figure 1:
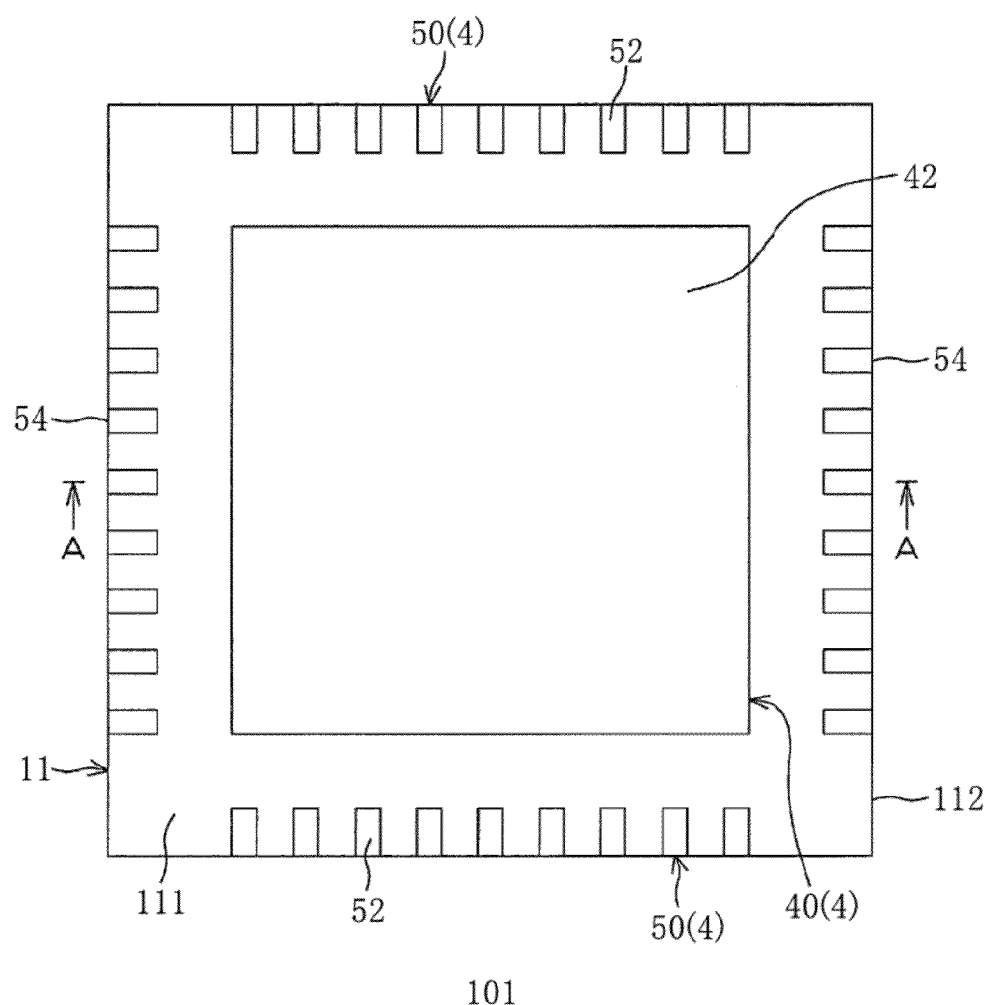
FIG. 1 is a schematic bottom view showing a semiconductor device according to a first embodiment of the present invention.

FIG. 1 is a schematic bottom view of a semiconductor device 101 according to a first embodiment of the present invention.

Figure 2:
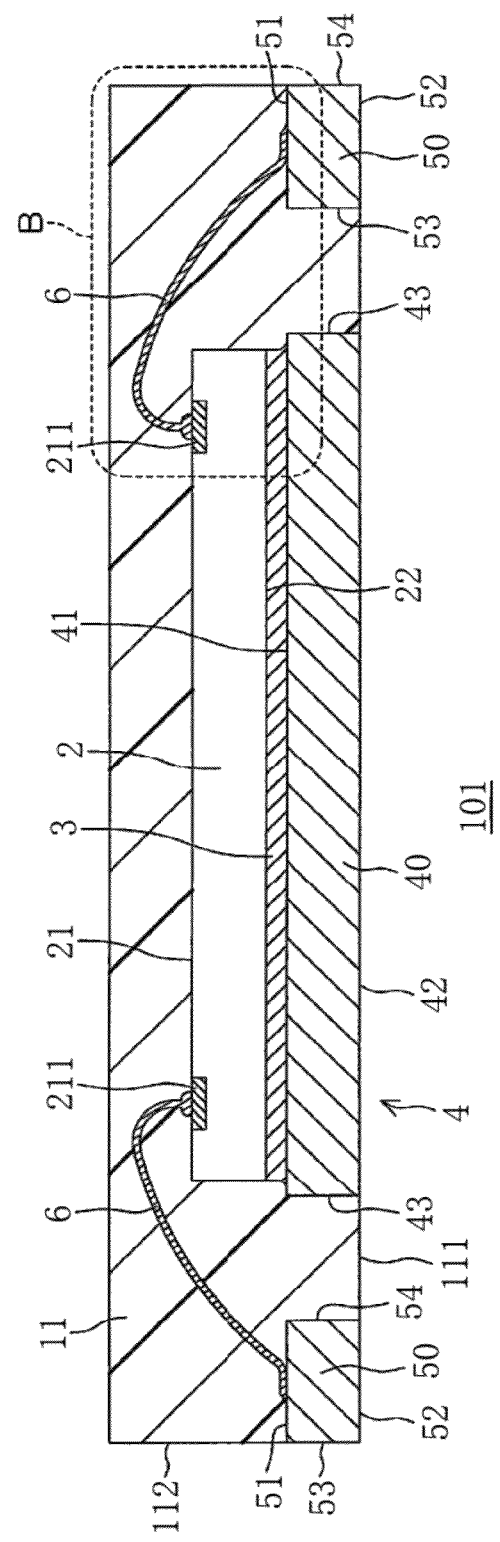
FIG. 2 is a sectional view of the semiconductor device of FIG. 1, taken along lines A-A in FIG. 1.
Figure 3:
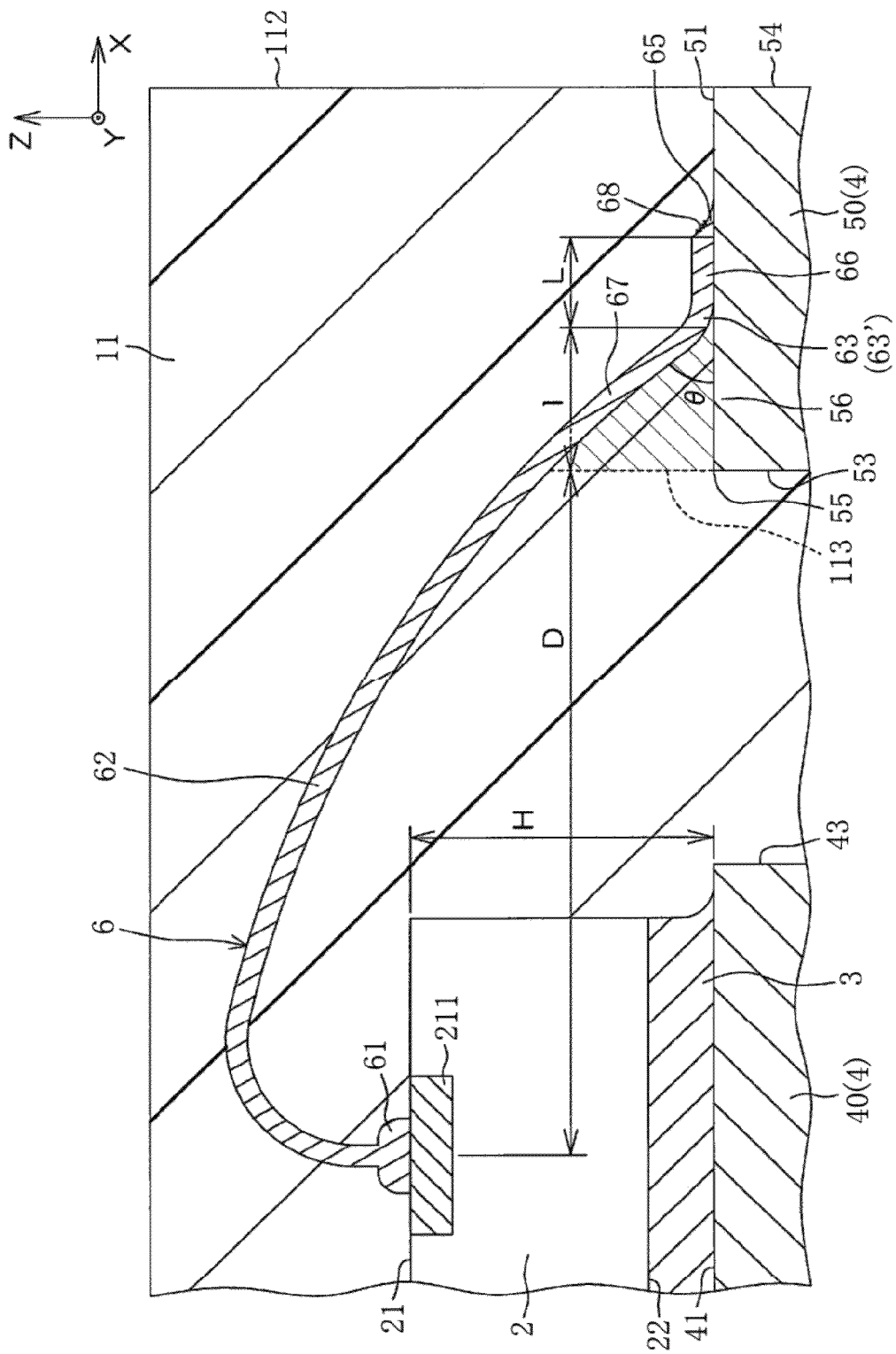
FIG. 3 is a schematic view showing the portion surrounded by the broken line B in FIG. 2 as enlarged.

FIG. 2 is a sectional view of the semiconductor device 101, taken along lines A-A in FIG. 1. FIG. 3 is a schematic view showing the portion surrounded by the broken line B in FIG. 2 as enlarged.

The semiconductor device 101 is a surface-mounting semiconductor device of a QFN (Quad Flat Non-leaded) type. The semiconductor device 101 includes a semiconductor chip 2 bonded to a lead frame 4, and a resin package 11 (made of e.g. epoxy resin) that seals these components. The semiconductor device 101 is generally in the form of a rectangular parallelepiped having a relatively small thickness (hexahedron that is square in bottom view in this embodiment). For instance, the semiconductor device 101 has a size of about 4 nm×4 mm in plan view and a thickness of about 0.80-0.90 mm.

The lead frame 4 includes a die pad 40 arranged at the center of the semiconductor device 101 in bottom view, and a plurality of leads 50 arranged around the die pad 40 with predetermined intervals. The upper surface 41 of the die pad 40 is not made lower than the upper surface 51 (horizontal surface) of each lead 5 (i.e., not down-set relative to the leads 50). The upper surface 41 and the upper surface 51 are flush with each other. The lead frame 4 is made by performing punching or etching with respect to a thin metal plate (made of e.g. Cu or 42-alloy that is an alloy containing Fe and 42% nickel) having a thickness of e.g. 190-210 μm (about 200 μm in this example).

In bottom view, the die pad 40 has a center overlapping the center of the resin package 11, and is in the form of a rectangular plate having four sides parallel to the four sides of the resin package 11. In bottom view, the size of the die pad 40 is larger than that of the semiconductor chip 2 and about 2.7 mm×2.7 mm in this example. The upper surface 41 and side surfaces 43 of the die pad 40 are covered by the resin package 11. The lower surface 42 of the die pad 40 is exposed from the reverse surface 111 of the resin package 11.

The leads 50 are arranged around the die pad 40 to face each side surface 43 of the die pad 40. The leads 50 facing each side surface 43 of the die pad 40 are equally spaced in a direction parallel to the side of the die pad 40. The length of each lead 50 in the direction facing the die pad 40 (longitudinal direction) is e.g. 390-410 μm (about 400 μm in this example) and sometimes shorter. The upper surface and the facing surface (first end surface 53) of each lead 50 which faces the die pad 40 are covered by the resin package 11. The end surface (second end surface 54) of each lead 50 which is opposite from the first end surface 53 is exposed from a side surface 112 of the resin package 11 and constitutes part of the side surface 112. The lower surface 52 of each lead 50 is exposed from the reverse surface 111 of the resin package 11.

The semiconductor chip 2 is bonded (die bonding), at the reverse surface 22, to the die pad 40 via a bonding material 3 (such as solder paste, silver paste, alumina paste or a non-conductive material), with the obverse surface 21 provided with the electrode pad 21 facing upward. The thickness of the semiconductor chip 2 is not less than 100 μm, and e.g. 220-240 μm (about 230 μm in this example). There is a height difference H between the obverse surface 21 of the semiconductor chip 2 (specifically, the obverse surface of the electrode pad 211) and the upper surface 51 of the lead 50 (the upper surface 41 of the die pad 40), which depends on the thickness of the semiconductor chip 2. The height difference H is not less than 100 μm, and specifically e.g. 200-400 μm, including the thickness of the bonding material 3.

To each of the electrode pads 211, which is formed in the obverse surface 21 of the semiconductor chip 2, is connected an end of a bonding wire 6. The other end of the bonding wire 6 is bonded to the upper surface 51 of one of the leads 50. Specifically, bonding wires 6, each of which is connected at one end to an electrode pad 211, are connected to the upper surfaces 51 of different leads 50 at their respective other ends. In this way, the semiconductor chip 2 is electrically connected to the leads 50 via bonding wires 6. The length of each bonding wire 6 depends on the distance between the electrode pad 211 and the lead 50, and the distance between the electrode pad 211 and the lead 50 is e.g. 500-800 μm.

Figure 4:
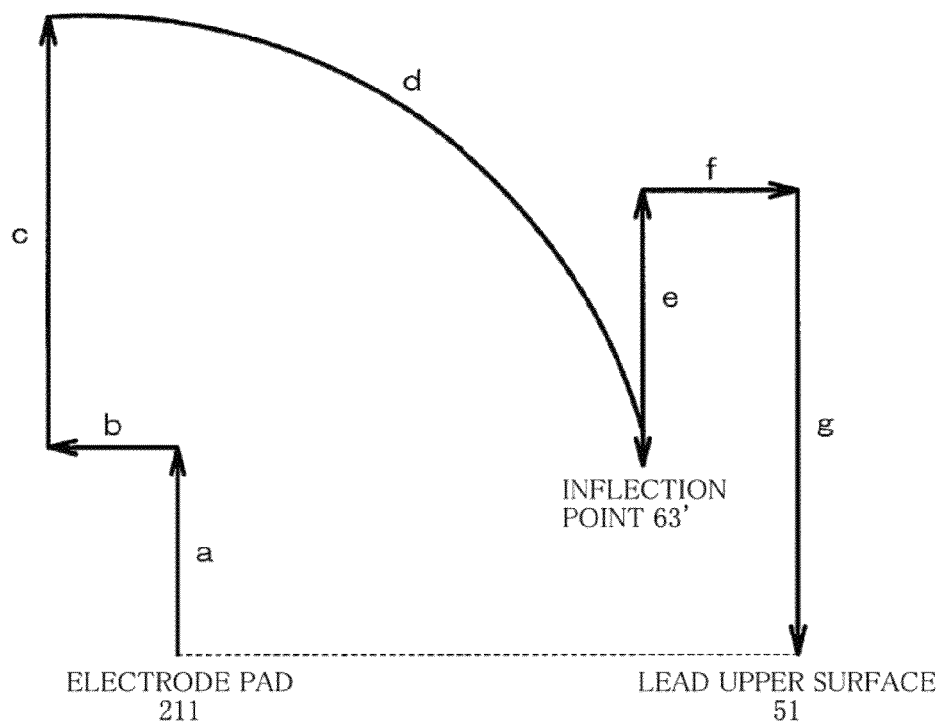
FIG. 4 shows the track of a capillary in the process of bonding a bonding wire.

Each, bonding wire 6 is formed by moving a capillary 7 of a wire bonder along the track shown in FIG. 4.

A method for making the semiconductor device 101 is described below with reference to FIGS. 4-13. In FIG. 4, the vertical axis represents the direction Z, whereas the horizontal axis represents the wire forming direction (directions X and Y). The arrows a-g in this figure correspond to the movements indicated by the signs a-g in FIGS. 6-12, respectively.

Figure 5:
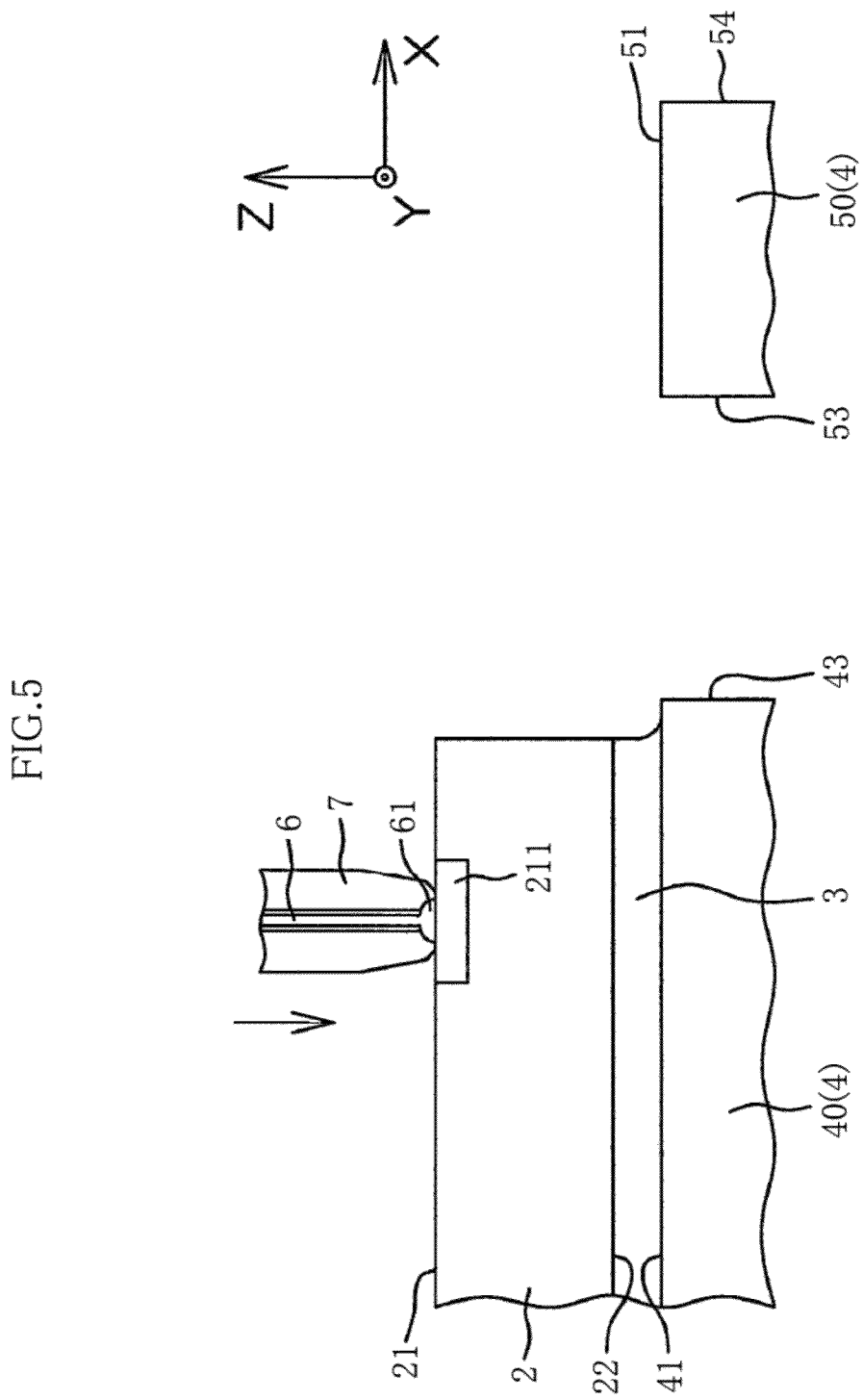
FIG. 5 is a schematic view showing part of a process for making the semiconductor device shown in FIGS. 1-3.

To form a bonding wire 6 (to perform wire bonding), a current is applied to the end of a wire held by a capillary 7 of a bonder, whereby a FAB (Free Air Ball) is formed at the end. Then, as shown in FIG. 5, the capillary 7 is moved downward in the direction Z to press the FAB against the electrode pad 211, and ultrasonic energy is applied (ball bonding). The FAB pressed by the capillary 7 is deformed, whereby a first bond portion 61 is formed on the electrode pad 211. In this way, bonding of one end of the bonding wire 6 to the electrode pad 211 (first bonding) is completed.

Figure 6:
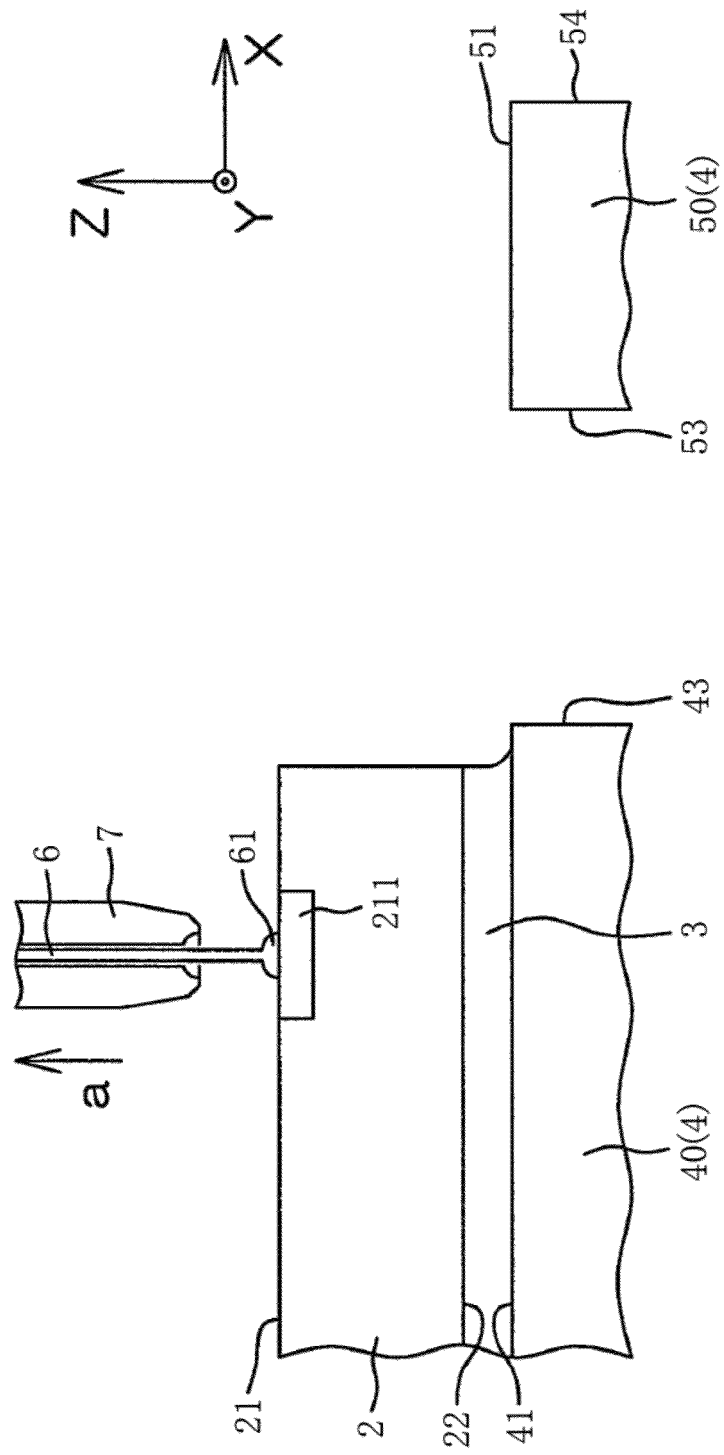
FIG. 6 shows a step subsequent to the step shown in FIG. 5.

Then, as shown in FIG. 6, the capillary 7 is moved away from the electrode pad 211 in the direction Z to a predetermined height position (e.g. to a height of 100-300 μm) (the arrow a in FIG. 4) while paying out the bonding wire 6.

Figure 7:
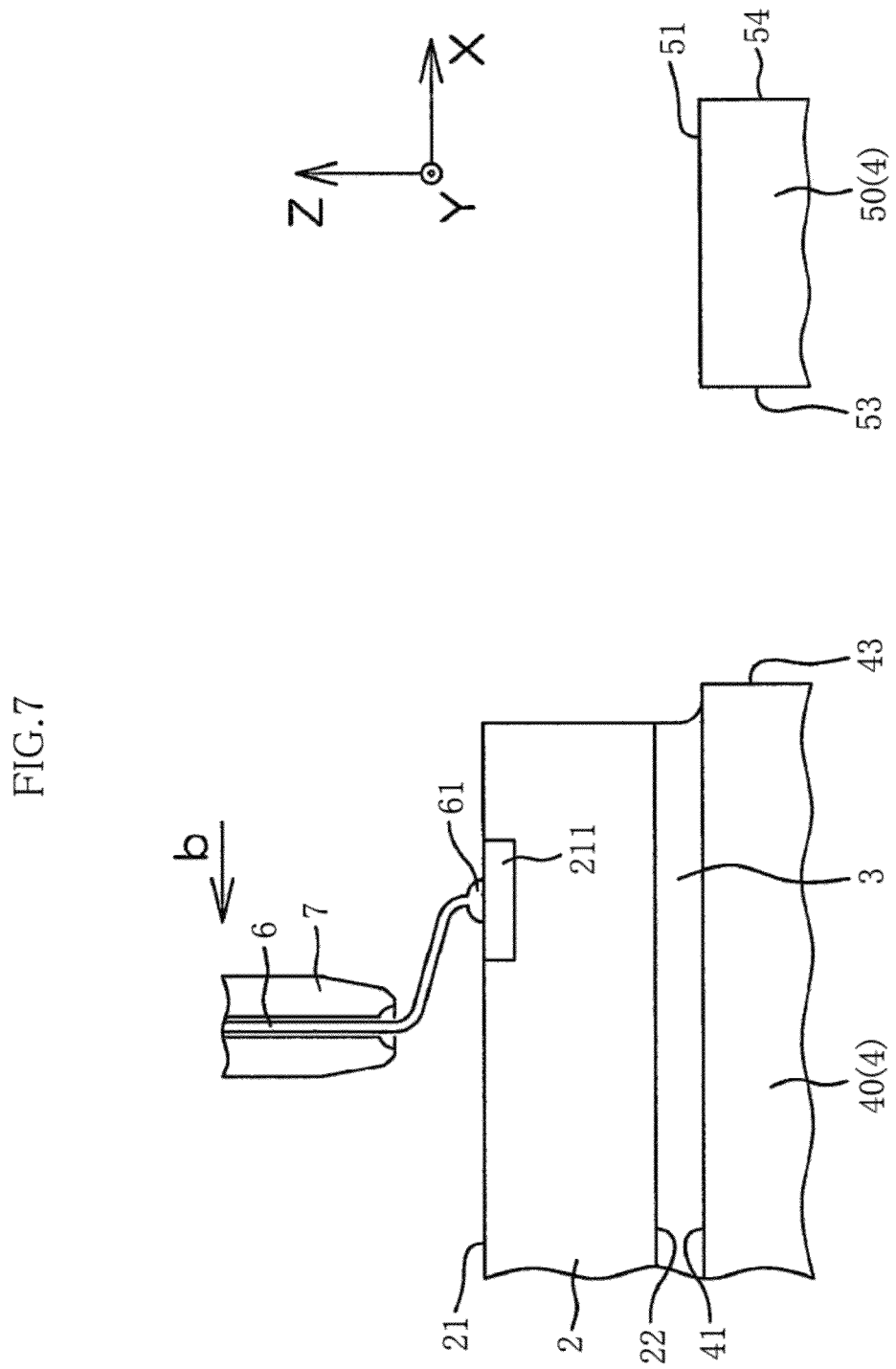
FIG. 7 shows a step subsequent to the step shown in FIG. 6.

Then, as shown in FIG. 7, while holding the bonding wire 6 paid out from it, the capillary 7 is moved in the direction X to be away from an edge of the semiconductor chip 2 (toward the inner portion of the semiconductor chip 2). Specifically, the capillary 7 is moved to an obliquely upper position relative to the electrode pad 211 by translation of e.g. 100-200 μm (horizontal movement) relative to the obverse surface 21 of the semiconductor chip 2 (arrow b in FIG. 4).

Then, as shown in FIG. 8, the capillary 7 is moved e.g. 500-800 μm upward in the direction Z while paying out the bonding wire 6 (arrow c in FIG. 4), depending on the distance between the electrode pad 211 and the lead 50.

Figure 9:
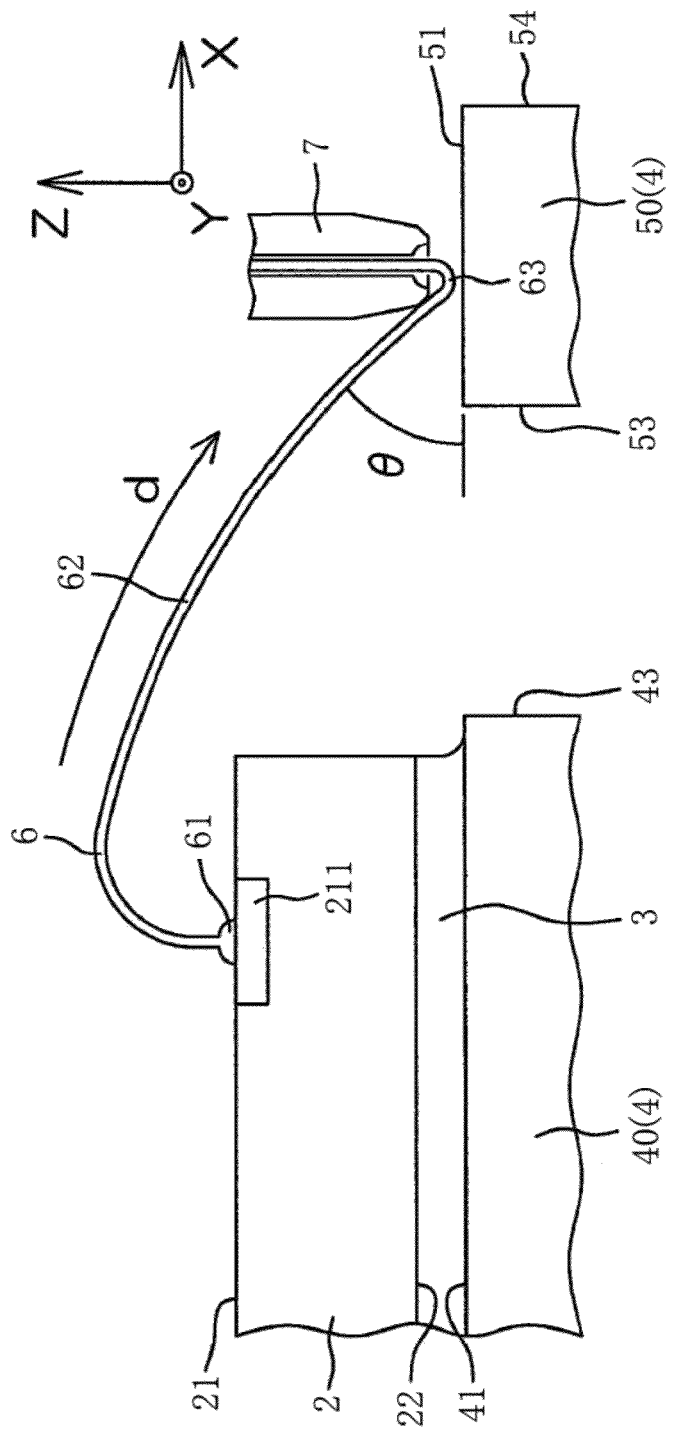
FIG. 9 shows a step subsequent to the step shown in FIG. 8.

Then, as shown in FIG. 9, while holding the bonding wire 6 paid out from it, the capillary 7 is moved obliquely downward in such a manner as to draw an arc toward the upper surface 51 of the lead 50 to form an inclination angle θ of 80-80° with respect to the lead 50 (arrow d in FIG. 4). As shown in FIG. 3, this process provides a loop 62 in the form of an arc projecting upward and bridging the semiconductor chip 2 and the lead 50. Also, in this step, the bonding wire 6 is bent to form a bent portion 63 in the bonding wire.

Figure 10:
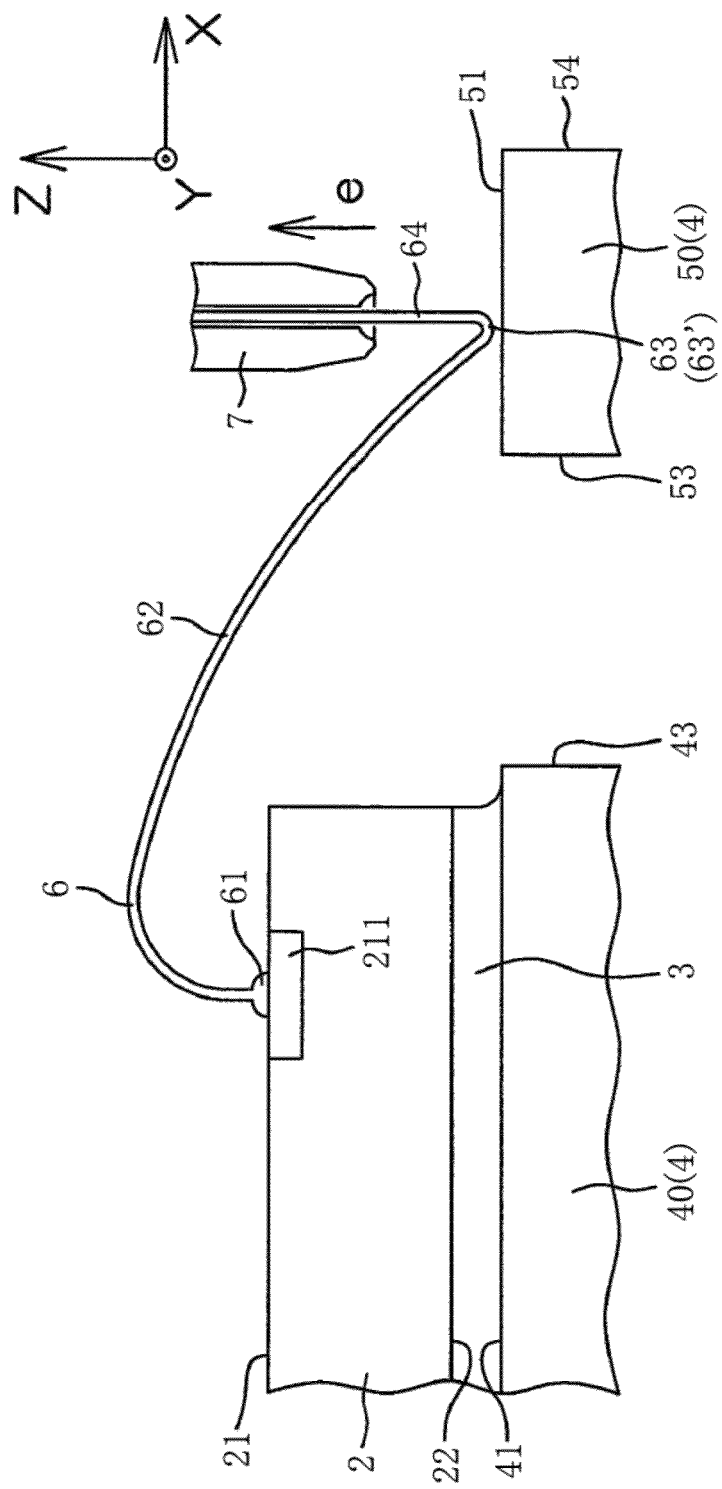
FIG. 10 shows a step subsequent to the step shown in FIG. 9.

Then, as shown in FIG. 10, immediately before the end of the loop 62 comes into contact with the upper surface 51 of the lead 50, the capillary 7 is moved upward in the direction Z while paying out the bonding wire 6. Specifically, when the capillary comes close to the upper surface 51 of the lead 50, the capillary 7 is moved upward in the direction Z, with the bent portion 63 of the bonding wire 6 used as an inflection point 63', to a height position of e.g. 300-600 μm from the upper surface 51 of the lead 50 (arrow e in FIG. 4), while paying out the bonding wire 6. By this step, a wire margin 64 is provided between the inflection point 63' and the end of the capillary 7, which has a length corresponding to the length of the paid out portion of the bonding wire 6.

Figure 11:
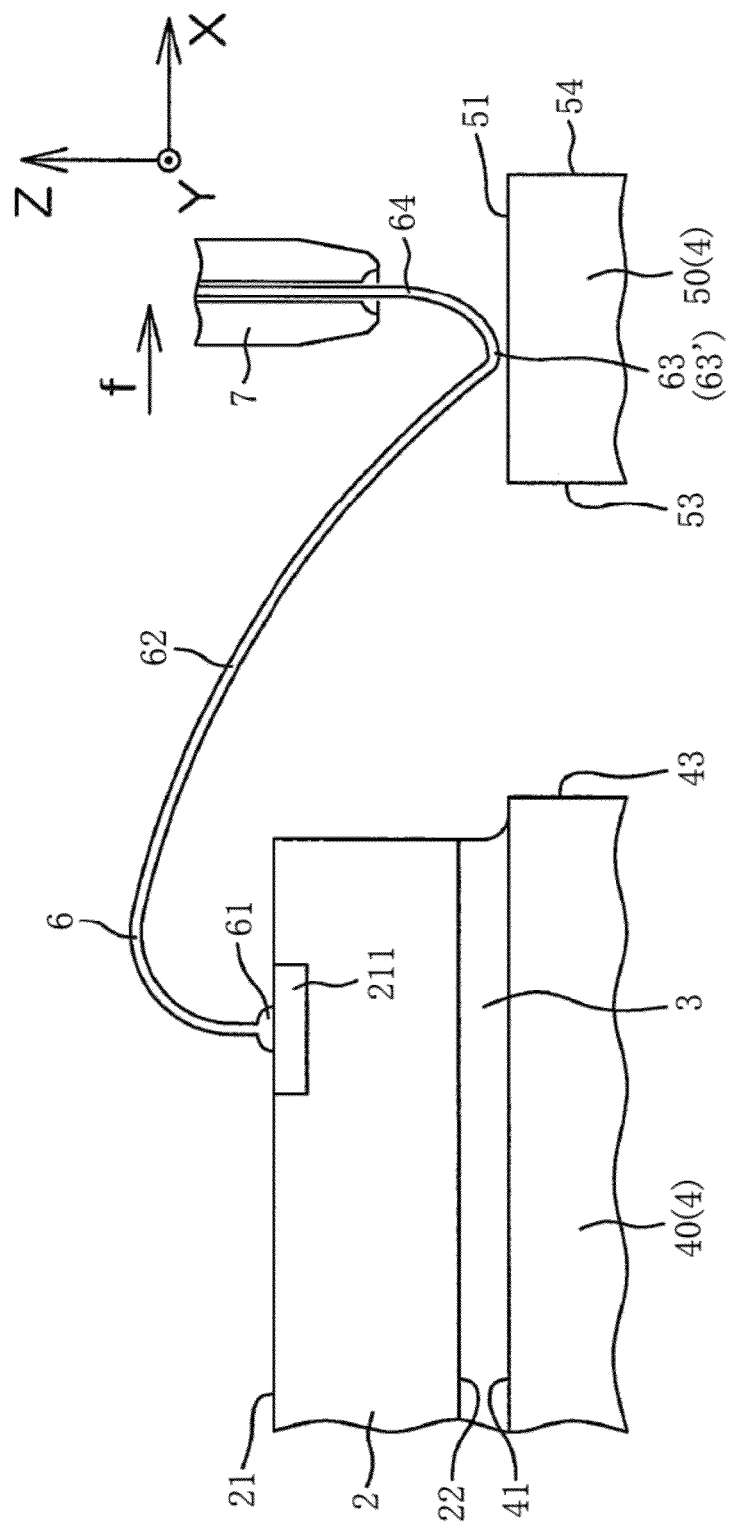
FIG. 11 shows a step subsequent to the step shown in FIG. 10.

Then, as shown in FIG. 11, while holding the wire margin 64, the capillary 7 is moved in the direction X to be away from the semiconductor chip 2 (toward the outer side of the lead 50). Specifically, the capillary 7 is moved to an obliquely upper position relative to the inflection point 63' by translation of e.g. 30-60 μm (horizontal movement) relative to the upper surface 51 of the lead 50 (arrow f in FIG. 4).

Figure 12:
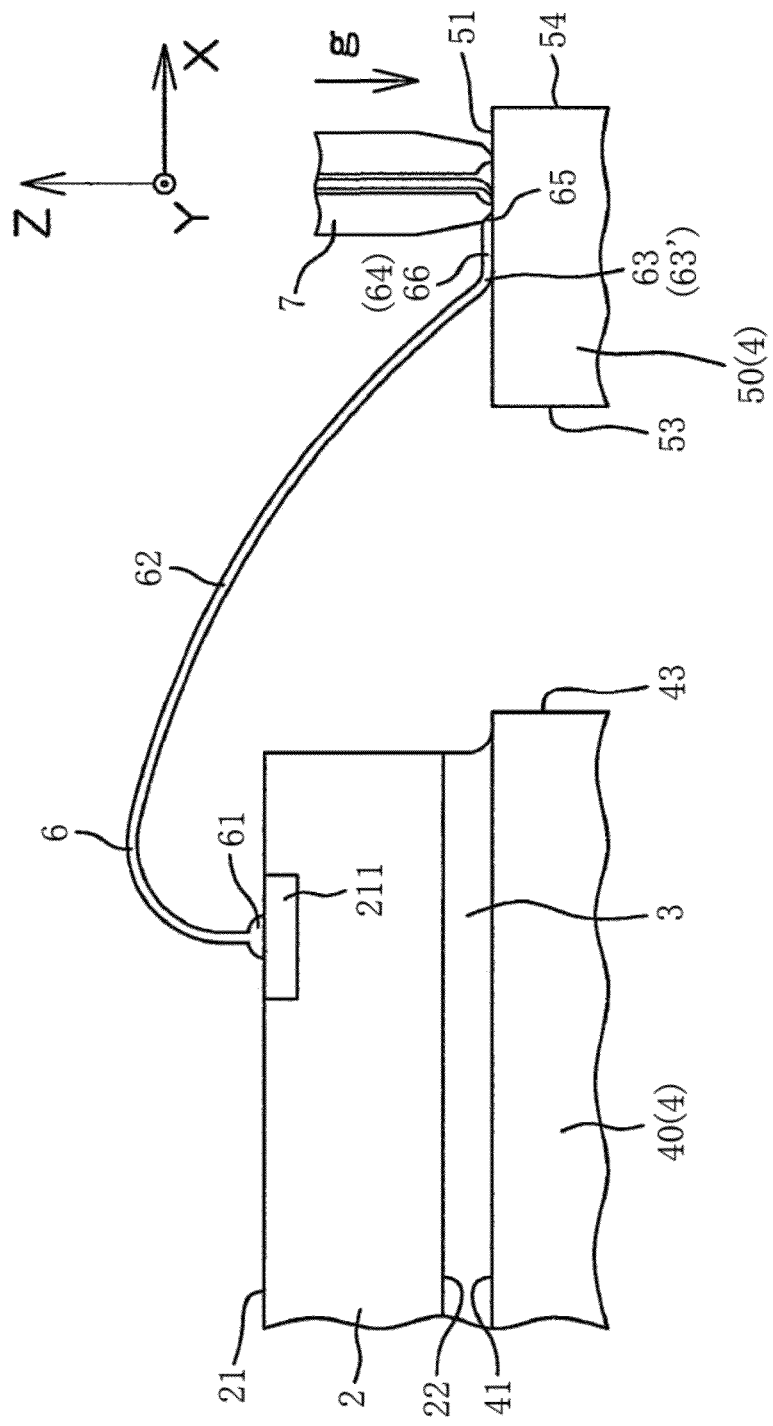
FIG. 12 shows a step subsequent to the step shown in FIG. 11.

Then, as shown in FIG. 12, the capillary 7 is lowered in the direction Z to come into contact with the upper surface 51 of the lead 50 (arrow g in FIG. 4). Thus, the wire margin 64, which has been standing on the upper surface 51 of the lead 50 in the direction Z, lies from the inflection point 63' on the upper surface 51 of the lead 50 in the direction X. The end of the wire margin (the portion at the end of the capillary 7) is pressed against the upper surface 51 of lead 50 by the capillary 7 and cut by applying ultrasonic energy (stitch bonding). Thus, the other end of the bonding wire 6 is deformed, and the second bond portion 65 that is wedge-shaped in side view is formed on the lead 50. In this way, bonding of the other end of the boding wire 6 to the lead 50 (second bonding) is completed. In this process, ultrasonic trace 68 due to the application of ultrasonic energy is left in the second bond portion 65 (See FIG. 3).

At the same time as the formation of the second bond, portion 65, as shown in FIG. 3, the wire margin 84 laid on the upper surface 51 of the lead 50 becomes a landing portion 66. The landing portion 86 is unfixedly held on the upper surface 51 of the lead 50 while keeping the linear shape of the bonding wire 6 (i.e., not fixed by press-bonding or the like but just held substantially in contact with the upper surface 51 of the lead 50 without physical adhesion). The landing portion 66 and the lead 50 are substantially in parallel with each other. In this embodiment, the length L of the landing portion 66 in the direction X (i.e., the distance from the rising point to an end of the second bond portion, as shown in FIG. 3) is 10-80 μm.

The landing portion 66 retreats from the inner end 55 of the lead 50 toward the outer side of the lead 50 (toward the second end surface 54) by a distance l (see FIG. 3). Thus, the lead 50 includes an inner portion 56 that is positioned on the inner side of the landing portion 66. The rising portion 67 of the loop 62 (the portion of the bonding wire 6 which is on the inner side of the landing portion 66 and which rises to become substantially linear) faces the inner portion 56 of the lead 50. That is, the rising portion 67 is positioned directly above the inner portion 56 of the lead 50.

In the bonding wire 6 after the bonding, the height difference H between the first bond portion 61 and the second bond portion 65 is equal to the height difference H between the obverse surface 21 of the semiconductor chip 2 and the upper surface 51 of the lead 50 (not less than 100 μm and specifically 100-400 μm, for example). The loop distance D between the first bond portion 61 and the inner end 55 of the lead 50 in the direction X is not more than 800 μm and specifically 500-800 μm, for example. The loop distance D can be easily adjusted by e.g. adjusting the pay-out amount of the bonding wire 6 in the step shown in FIG. 8.

Thereafter, by repeating the steps described above with reference to FIGS. 5-12, each of the electrode pads 211 of the semiconductor chip 2 and a corresponding one of the leads 50 are connected to each other by a bonding wire 6.

Figure 13:
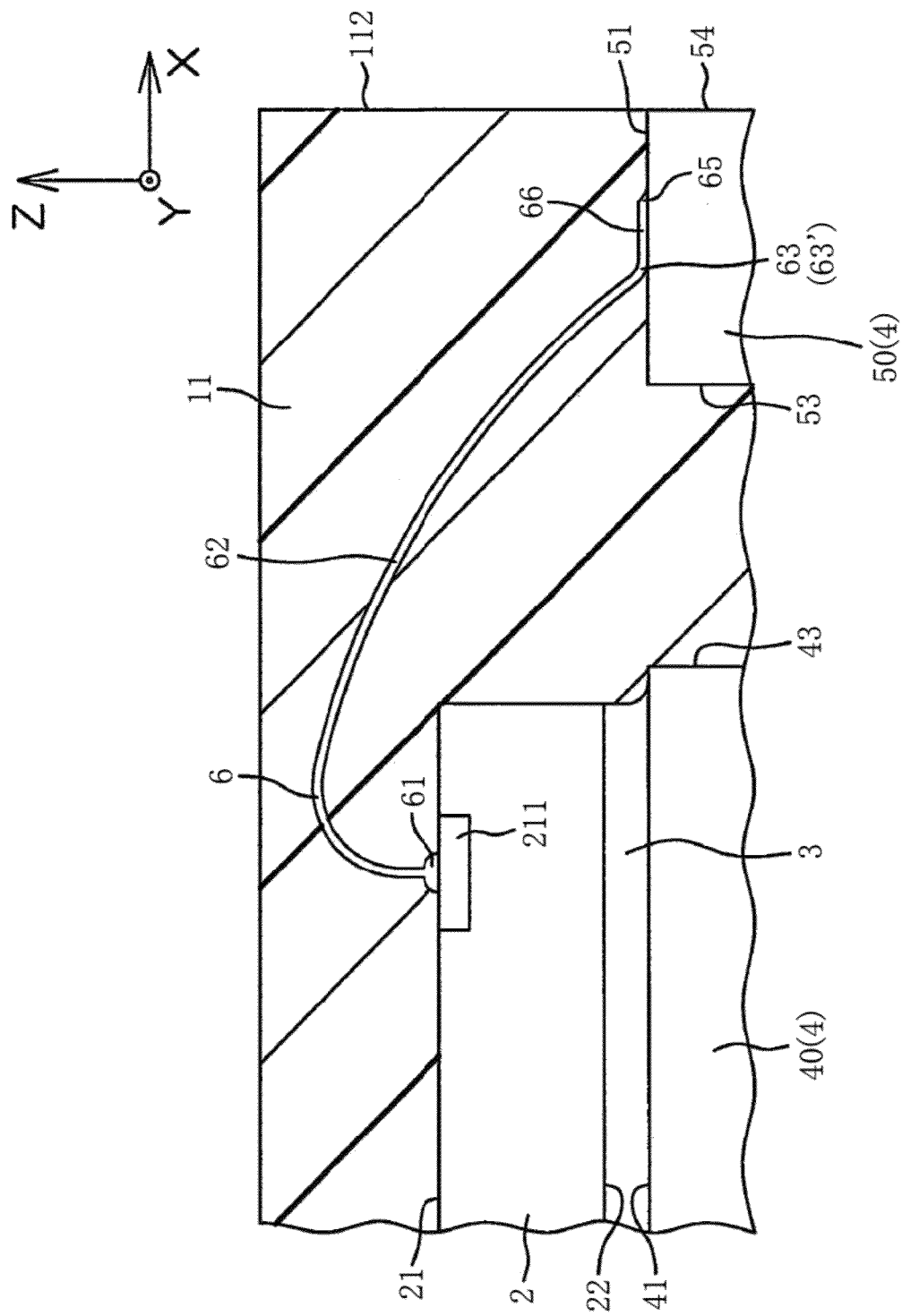
FIG. 13 shows a step subsequent to the step shown in FIG. 12.

After bonding of all bonding wires is completed, the lead frame 4 is set in a mold, and the semiconductor chip 2 and the bonding wires 6 are collectively sealed in a resin package 11, together with necessary portions of the lead frame 4 and the die pad 40, as shown in FIG. 13.

As described above, according to the semiconductor device 101, the landing portion 66, which is held in contact with the upper surface 51 of the lead 5 while keeping the linear shape of the bonding wire 6, is formed to have a length L of 10-80 μm. Thus, in sealing the bonding wire 6 in the resin package 11 (the step of FIG. 13), only a small amount of resin flows between the landing portion 66 and the upper surface 51 of the lead 50. Thus, the force that pushes the bonding wire 6 in the horizontal direction is reduced to ½ or less as compared with the conventional structure, and hence wire sweep is prevented. Further, the landing portion 66 receives from the resin a sufficient pressure to press the landing portion against the upper surface 51 of the lead 50. This suppresses wire sweep in the resin-molding process.

Moreover, the loop 62 and the second bond portion 65 are not connected directly to each other but connected via the landing portion 66 intervening between them. Thus, even when the resin flowing under the loop 62 (e.g. the hatched portion 113 in FIG. 3 that is sandwiched between the inner portion 56 of the lead 50 and the rising portion 67 of the bonding wire 6) thermally expands or the length of the lead 50 changes so that the resin pushes the loop 62 upward, the pushing merely causes slight rising of the landing portion 66 from the upper surface 51 of the lead 50, and detachment of the second bond portion 65 from the lead 50 does not occur. Further, detachment of the second bond portion 65 after the manufacture due to difference in thermal expansion between the resin package 11 and the lead 50 is also prevented. Thus, the defective rate is improved, and a reliable semiconductor device 101 is provided.

The above-described advantages are particularly effective when the distance between the semiconductor chip 2 and the lead 50 is further reduced in accordance with the demand for size reduction of a semiconductor package and hence the semiconductor device 101 (semiconductor package) is under the condition where sweep of the bonding wire 6 (wire sweep) or detachment of the second bond portion 65 can easily occur. To make the semiconductor device 101 smaller, the distance between the die pad 40 and the lead 50 needs to be reduced. However, to prevent contact of the bonding wire 6 with the semiconductor chip 2, the inclination angle θ of the bonding wire 6 with respect to the lead 50 cannot be made sufficiently small and sometimes needs to be made large. In the conventional structure, when the inclination angle θ is large, the portion of the bonding wire 6 adjacent to the second bond portion 65 substantially stands on the lead 50, which often leads to wire sweep or detachment of the second bond portion 65. Unlike this, the semiconductor device 101 reliably prevents wire sweep and detachment of the second bond portion 6S even when the inclination angle is large.

According to the semiconductor device 101, even when the die pad 40 cannot foe set at a position lower than the lead 50 (i.e., the die pad 40 cannot be down-set relative to the lead 50) and hence it is difficult to make the inclination angle θ of the bonding wire 6 to the lead 50 small, wire sweep and detachment of the second bond portion 65 is reliably prevented.

To form the landing portion 66, after the loop 62 is formed, bent, portion 63 is formed in the bonding wire 6. Then, while paying out the bonding wire 6, the capillary 7 is moved upward in the direction Z to a predetermined height position from the upper surface 51 of the lead 50 to provide a wire margin 64 (the step shown in FIG. 10). Then, while holding the wire margin 64, the capillary 7 is moved horizontally in the direction X (the step shown in FIG. 11). Then, the capillary 7 is lowered in the direction Z to come into contact with the upper surface 51 of the lead 50 (the step shown in FIG. 12). This process causes the wire margin 64, which has been standing on the upper surface 51 of the lead 50 in the direction Z, to lie from the bent portion 63 on the upper surface 51 of the lead 50 in the direction X. In this way, the landing portion 66 is formed easily.

In this way, the landing portion 66 is formed just by the operation of the capillary 7 after the movement to draw an arc to form the loop 62. Thus, the formation of the landing portion 66 can be performed in combination with the ordinary wire bonding operation and the loop making operation (triangular loop, trapezoidal loop, and so on). Moreover, in forming the landing portion 66, the wire margin 64 is provided by paying out the bonding wire 6 from the capillary 7, so that the bonding wire 6 is not unduly pulled by the capillary 7. Thus, load on the first bond portion 61 (specifically, a neck portion (1st neck) adjacent to the first bond portion 61) and entire thinning of the wire are prevented. Since the capillary 7 is moved after the bent portion 63 is formed, even when the bonding wire 6 is slightly pulled during the movement of the capillary 7, the pulling force is reduced at the bent portion 63. This also reduces the load on the first bond portion 61.

The capillary 7 is shifted from the bent portion 63 formed in the step shown in FIG. 10 to an obliquely upward position only by linear movements i.e., vertical movement and horizontal movement. This allows easy control of the pay-out amount of the bonding wire 6. Thus, just by controlling the distance of the vertical movement in the step shown in FIG. 10 and the distance of the horizontal movement in the step shown in FIG. 11, variation in length L of the landing portion relative to the loop distance D is easily controlled.

Figure 14:
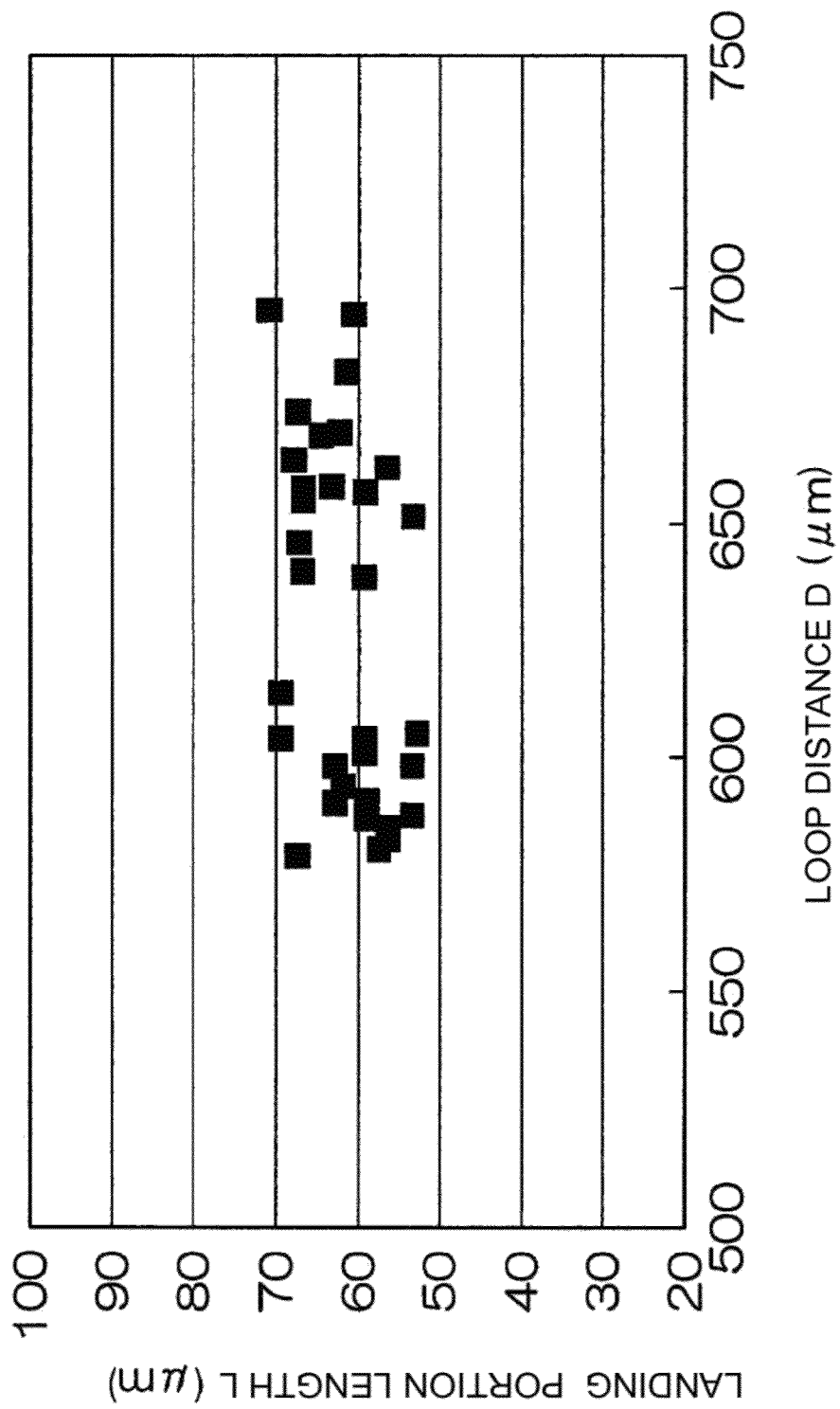
FIG. 14 shows distribution of loop distance D and landing portion length L in semiconductor devices obtained by the steps shown in FIGS. 5-13.

Specifically, as shown in FIG. 14, even when the loop distance D is varied within the range of 120 μm, i.e., from 580 to 700 μm, variation in length L of the landing portion 66 of the bonding wire 6 lies in the range of from 50 to 70 μm.

The present invention can be embodied in other ways.

For instance, although the semiconductor device 101 is adapted for the QFN type, the present invention is applicable also to semiconductor devices of other non-lead package types such as the SON (Small Outlined Non-leaded Package) and also to electronic components such as chip resistors or chip capacitors.

Further, the present invention is applicable not only to a semiconductor device of a so-called singulation type in which the second end surface 54 of the lead 50 and the side surface 112 of the resin package 11 are flush with each other, but also to a semiconductor device adapted for a non-lead package of a lead cut type in which the lead 50 projects from the side surface 112 of the resin package 11.

Further, the present invention is applicable not only to a semiconductor device adapted for a non-lead package but also to a semiconductor device adapted for a package having an outer lead provided by a projecting portion of the lead 50 from the resin package 11, such as a QFP (Quad Flat Package). Moreover, in the lead frame 4, the upper surface 41 of the die pad 40 may be down-set relative to the upper surface 51 of the lead 50.

In the above-described embodiment, to form the landing portion 66, the capillary 7 is shifted from the bent portion 63 (inflection point 63') to an obliquely upward position in two steps, i.e., by vertical movement in the direction Z and horizontal movement in the direction X, after the formation of the bent portion 6. Instead of this, shift of the capillary 7 from the bent portion 63 (inflection point 63') to this position may be performed by one step, i.e., simultaneous movement in the direction Z and the direction X, after the formation of bent portion 6. As the bonding wire 6, metal wires such as a gold wire, an aluminum wire and a copper wire may be used. The diameter of the bonding wire 6 is not limited to a specific value, and the above-described advantages can be obtained by forming the landing portion 66 having a length appropriate for the diameter.

The present invention can be varied in design in many ways within the scope described in the claims.

EXAMPLES

Examples of the application of the present invention are described below. However, the present invention is not limited by these examples.

Example 1

By performing the steps described above with reference to FIGS. 5-12, a lead and an electrode pad of a semiconductor chip were connected to each other with a gold wire having a diameter of 25 µm. The loop distance D of the gold wire was 500 µm, and the inclination angle θ with respect to the lead was 50°. The pay-out amount e and the pay-out amount f of the wire in the process of forming a landing portion was 500 µm and 40 µm, respectively. As shown in FIG. 3, the "inclination angle θ" refers to the angle defined between the upper surface of the lead and the portion of the wire that is on the inner side of the landing portion and extends substantially linearly after rising.

Figure 15:
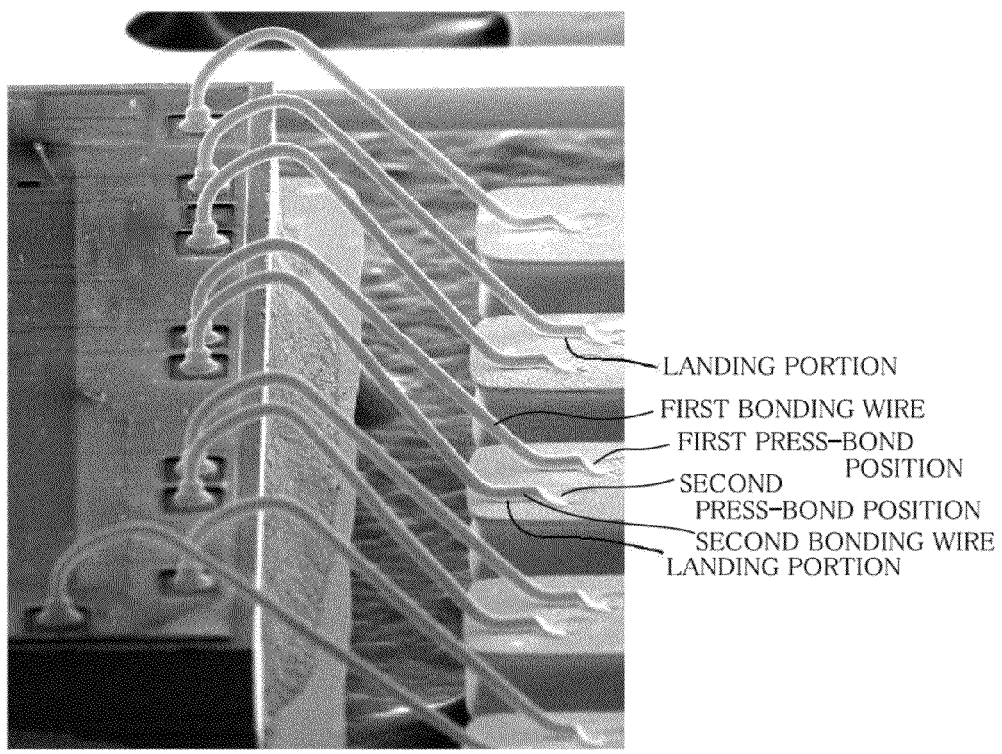
FIG. 15 is an SEM image showing the shape of bonding wires of Example 1.

The region in the vicinity of the bond between the gold wire and the lead was observed with a scanning electron microscope (SEM). The SEM image is shown in FIG. 15. As seen in FIG. 15, it is confirmed that the landing portion having a length of 50-70 µm was formed in Example 1.

The schematic structure of the semiconductor device of Example 1 is basically the same as that of the semiconductor device 10 shown in FIGS. 1-3. In Example 1, however, as will be understood from FIG. 15, two wires are bonded to each of a plurality of leads spaced apart from each other in a first direction (vertical direction in the figure). The first direction corresponds to the direction along one of the four sides of the resin package 11 shown in FIG. 1. The two bonding wires bonded to each lead shown in FIG. 15 consists of a first bonding wire press-bonded to the lead at a first press-bond position and a second bonding wire press-bonded to the lead at a second press-bond position that is on one side (lower side in the figure) of the first press-bond position in the first direction (vertical direction in the figure). In each of the leads, the first press-bond position and the second press-bond position are deviated from each other in a second direction (horizontal direction in the figure) crossing the first direction. Specifically, in each lead, the second press-bond position is deviated to the left in the figure from the first press-bond position. The amount of deviation is substantially the same among all the leads.

Example 2

In this example, the distance f of the horizontal movement of the capillary after the formation of the bent portion was increased as compared to that in Example 1, and specifically, increased to 50 µm. Except for this change in the horizontal movement distance, the same process as that of Example 1 was performed to connect a lead and an electrode pad of a semiconductor chip with a gold wire having a diameter of 25 µm.

Figure 16:
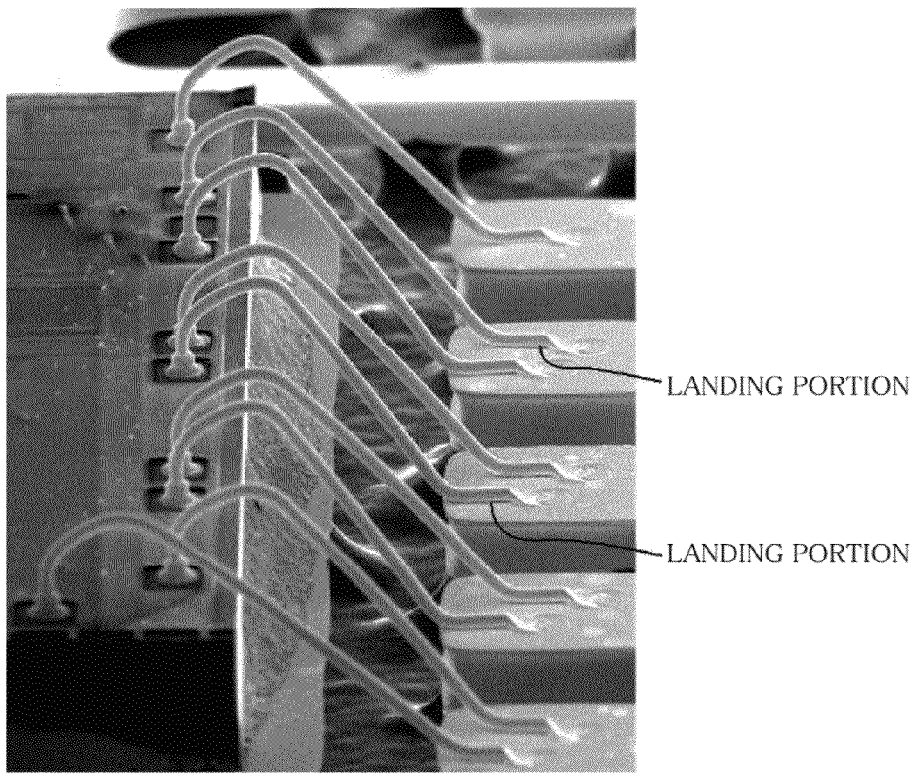
FIG. 16 is an SEM image showing the shape of bonding wires of Example 2.

The region in the vicinity of the bond between the gold wire and the lead was observed with a scanning electron microscope. The SEM image is shown in FIG. 16. As seen in FIG. 16, it is confirmed that the landing portion having a length of 60-80 µm was formed in Example 2.

Comparative Example 1

The distance f of the horizontal movement of the capillary after the formation of the bent portion was reduced, as compared to that, in Example 1, and specifically, reduced to 30 µm. Except for this change in the horizontal movement distance, the same process as that of Example 1 was performed to connect, a lead and an electrode pad of a semiconductor chip with a gold wire having a diameter of 25 µm.

Figure 17:
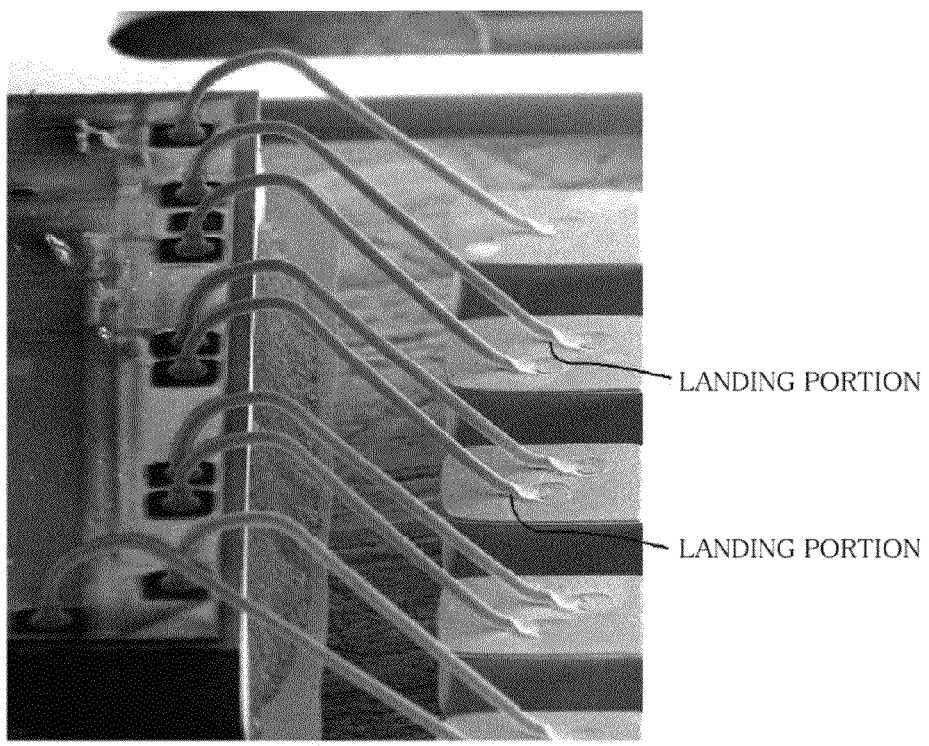
FIG. 17 is an SEM image showing the shape of bonding wires of Comparative Example 1.

The region in the vicinity of the bond between the gold wire and the lead was observed with a scanning electron microscope. The SEM image is shown in FIG. 17. As seen in FIG. 17, in the Comparative Example, although the landing portion was formed, the length L was not satisfactory.

Other embodiments of the present invention are described below with reference to FIGS. 18-33.

Figure 18:
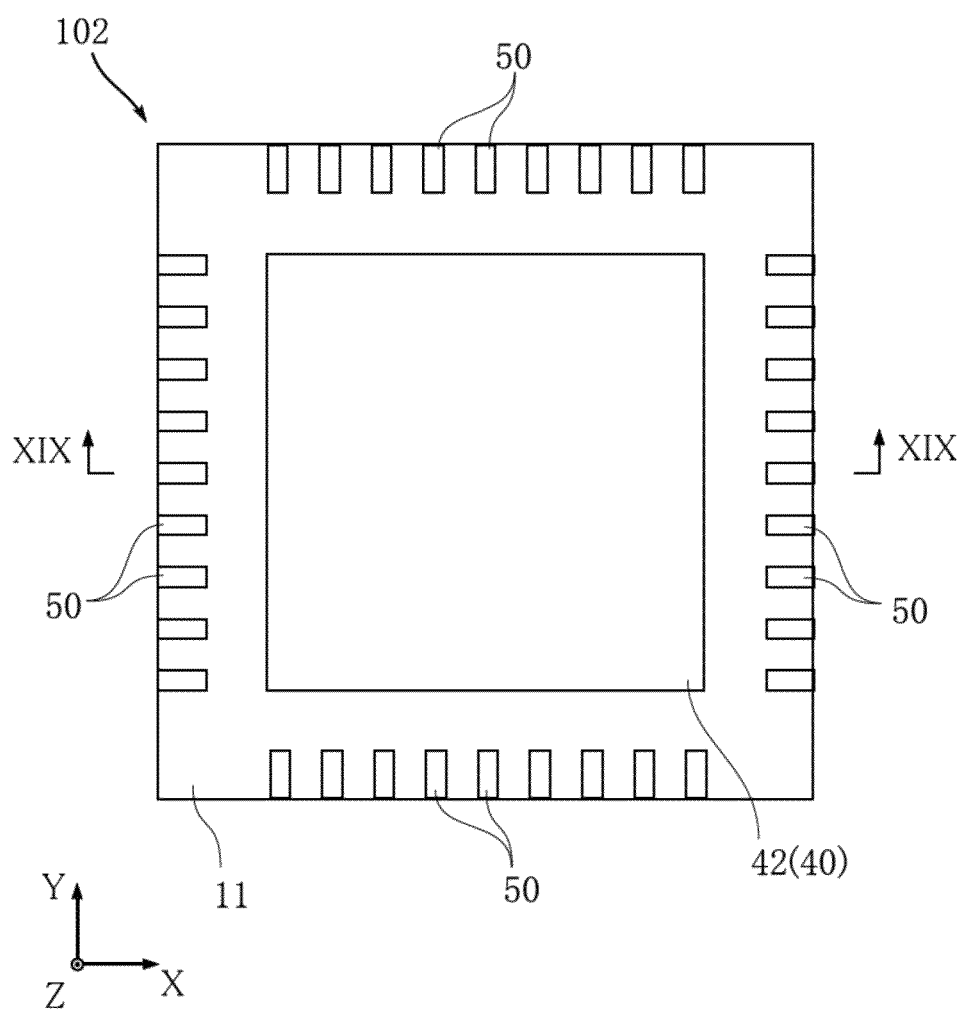
FIG. 18 is a schematic bottom view showing an electronic device according to a second embodiment of the present invention.
Figure 19:
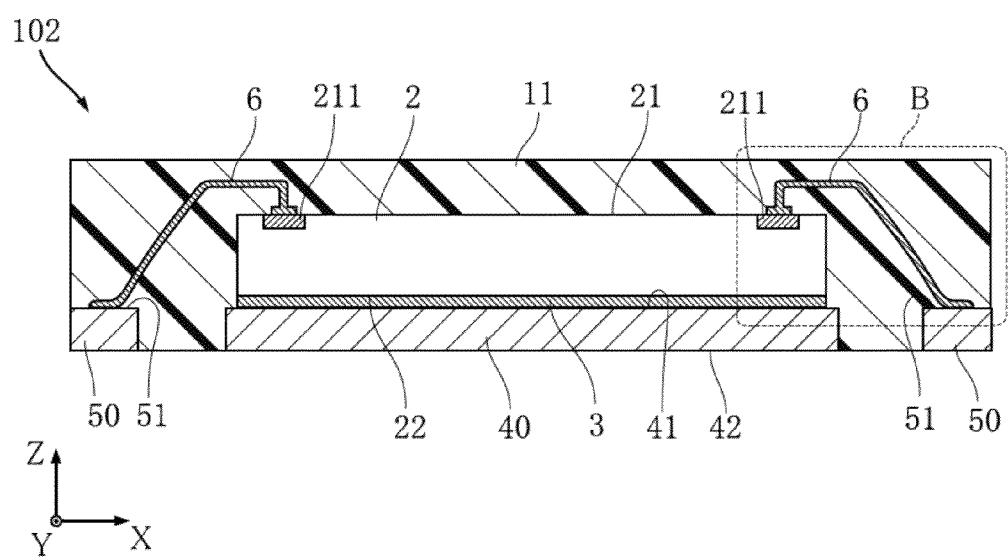
FIG. 19 is a sectional view taken along lines XIX-XIX in FIG. 18.
Figure 20:
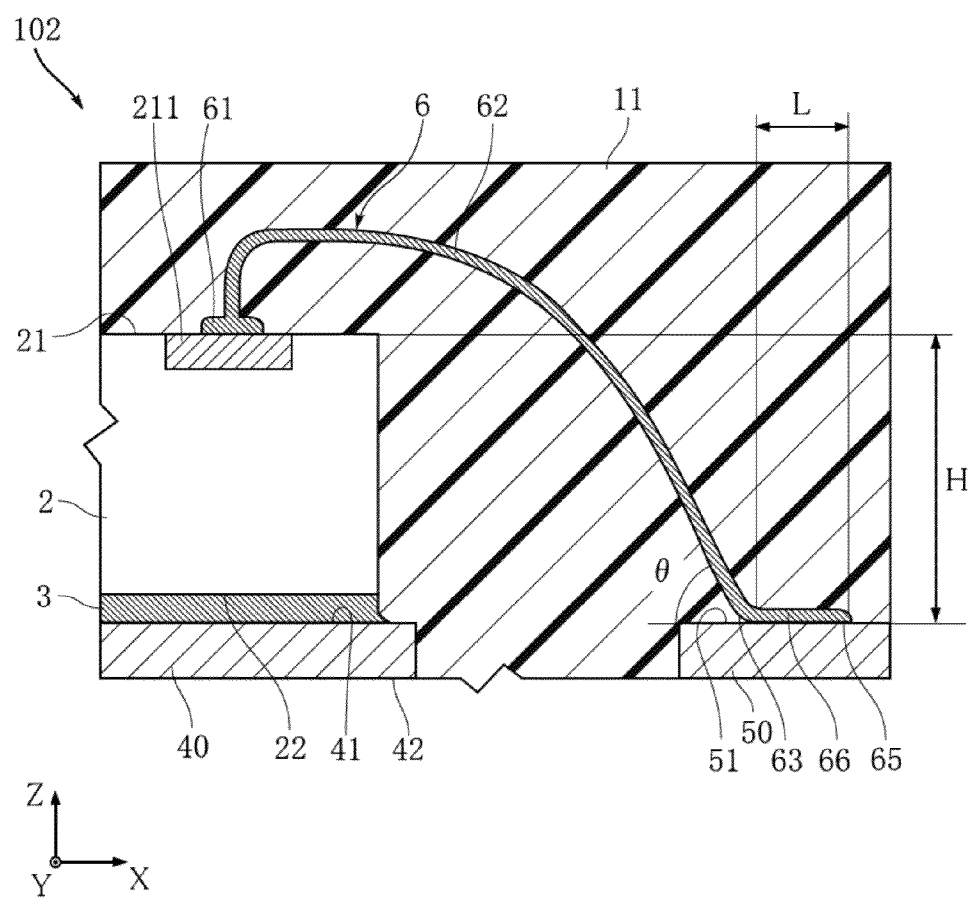
FIG. 20 is an enlarged view showing a principal portion of FIG. 19.
Figure 21:
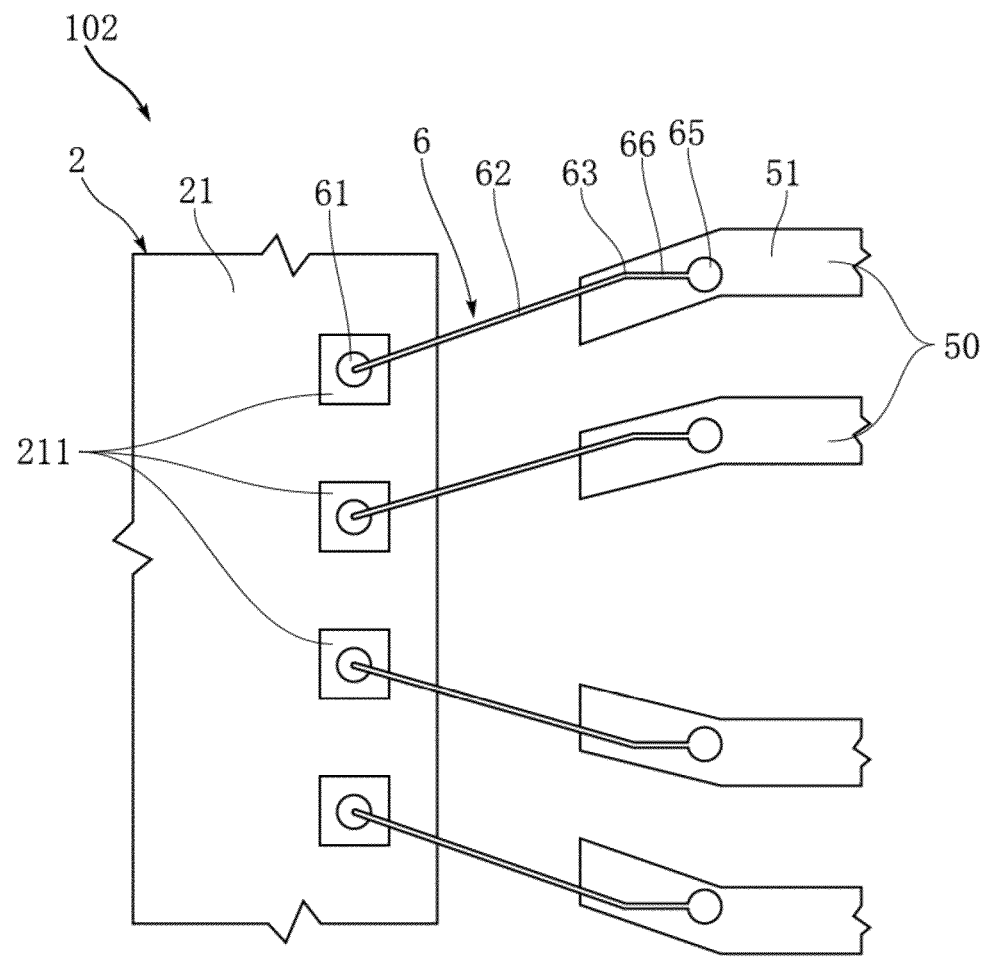
FIG. 21 is a plan view showing a principal portion of the electronic device of FIG. 18.

FIG. 18 is a schematic bottom view of a semiconductor device as an electronic device according to a second embodiment of the present invention. FIG. 19 is a sectional view taken along lines II-II in FIG. 18. FIG. 20 shows the portion surrounded by the broken line B in FIG. 19 as enlarged. The semiconductor device 102 shown in FIGS. 18-20 is a surface-mounting semiconductor device of a QFM (Quad Flat Non-leaded) type and includes a resin package 11, a semiconductor chip 2, a bonding material 3, a die pad 40, a plurality of leads 50, and a plurality of bonding wires 6. FIG. 21 is plan view of a principal portion, with the resin package 11 omitted. The semiconductor device 102 has a bonding structure based on a second embodiment of the present invention. The bonding structure is made up of the semiconductor chip 2, the leads 50 and the bonding wires 6.

The direction Z corresponds to the thickness direction of the semiconductor device 102. The direction X and the direction Y are directions along sides of the quadrangle of the semiconductor device 102 in bottom view. The direction X corresponds to the first direction in the Appendixes described later, the direction Z corresponds to the second direction in the Appendixes described later, and the direction Y corresponds to the third direction in the Appendixes described later.

The semiconductor device 102 is generally in the form of a rectangular parallelepiped having a relatively small thickness. As shown in FIG. 18, the semiconductor device 102 is square in bottom view. Specifically, each side of the bottom surface of the semiconductor device 102 is about 4 mm. The thickness of the semiconductor device 102 is e.g. from about 0.80 to 0.90 mm.

The resin package 11 defines the outer configuration of the semiconductor device 102 and covers the semiconductor chip 2, the bonding material 3, the die pad 40, the leads 50 and the bonding wires 6. The resin package 11 is made of e.g. epoxy resin.

The semiconductor chip 2 is the first component or the electronic component in the Appendixes described later and in the form of a rectangular parallelepiped having a thickness of not less than 100 μm, and specifically, about 220-240 μm for example. The semiconductor chip 2 has an obverse surface 21 and a reverse surface 22 facing away from each other. The semiconductor chip 2 is mounted on the obverse surface 41 of the die pad 40 such that its obverse surface 21 faces upward in FIG. 19. The semiconductor chip 2 includes a plurality of electrode pads 211 on the obverse surface 21. The reverse surface 22 is bonded on the obverse surface 41 of the die pad 40 via the bonding material 3. As the bonding material 3, use may be made of solder paste, silver paste, alumina paste or a non-conductive material.

As shown in FIG. 18, in bottom view, the die pad 40 is arranged at the center of the semiconductor device 102, and the leads 50 are arranged around the die pad 40 with predetermined intervals. As shown in FIG. 19, the reverse surface 42 of die pad 40 and the lower surface of the leads 50 are exposed from the resin package 11. In this embodiment, the die pad 40 is not down-set relative to the leads 50, and the obverse surface 41 of the die pad 40 and the upper surfaces 51 of the leads 50 are at the same height position. The die pad 40 and the leads 50 are made of metal. As will be described later, the die pad 40 and the leads 50 are made of a same thin metal plate and have a same thickness. Specifically, the thin metal plate for making the die pad 40 and the leads 50 has a thickness of e.g. 190-210 μm and is made of copper or 42-alloy (an alloy containing Fe and 42% nickel).

In bottom view, the die pad 40 has a center overlapping the center of the resin package 11, and is in the form of a rectangular plate having four sides parallel to the four sides of the resin package 11. In bottom view, the die pad 40 has a size larger than that of the semiconductor chip 2 and is about 2.7 mm×2.7 mm, for example.

The leads 50 are arranged to face each of the side surfaces of the die pad 40. In the example shown in FIG. 18, nine leads 50 are arranged to face each side of the die pad 40. The distance between each lead 50 and the die pad 40 in their facing direction is e.g. 390-410 μm. Each lead 50 is the second component in the Appendixes described later, and the upper surface 51 of each lead 50 is the pad surface in the Appendixes described later.

There is a height difference H between the upper surface 51 of the lead 50 and the electrode pad 211, which depends on the thickness of the semiconductor chip 2. The height difference H is not less than 100 μm, and specifically e.g. 200-400 μm, including the thickness of the bonding material 3.

As shown in FIG. 20, one end of a bonding wire 6 is bonded to the electrode pad 211, whereas the other end of the bonding wire 6 is bonded to the upper surface 51 of one of the lead 50. As shown in FIG. 21, bonding wires 6, each of which is connected at one end to an electrode pad 211, are connected to the upper surfaces 51 of different leads 50 at their respective other ends. In this way, the semiconductor chip 2 is electrically connected to the leads 50 via bonding wires 6. The length of each bonding wire 6 depends on the distance between the electrode pad 211 and the lead 50, and the distance between the electrode pad 211 and lead 50 is e.g. 500-800 μm.

As shown in FIG. 20, each bonding wire 6 includes a first bond portion 61, a loop 62, a bent portion 63, a second bond portion 65 and a landing portion 66. The first bond portion 61 is bonded to the electrode pad 211, and the second bond portion 65 is bonded to the upper surface 51 of the lead 50. The loop 62 is generally in the form of a trapezoid and extends from the first bond portion 61 to the bent portion 63. The inclination angle θ of the loop 62 with respect to the upper surface 51 of the lead 50 is e.g. 60-80°. The landing portion 66 extends from the bent portion 63 to the second bond portion 65. The landing portion 66 is formed to lie on the upper surface 51 of the lead 50 and has a length L of e.g. 10-80 μm.

As the bonding wire 6, metal wires such as a gold wire, an aluminum wire and a copper wire may be used. The diameter of the bonding wire 6 is not limited to a specific value, and the advantages described later can be obtained by forming the landing portion 66 having a length appropriate for the diameter.

FIG. 21 shows part of the semiconductor device 102, with illustration of the resin package 11 partially omitted. In this figure, four electrode pads 211, four leads 50 and four bonding wires 6 of the semiconductor chip 2 are shown. The four electrode pads 211 are arranged with equal intervals in the direction Y. The four leads 50 are spaced apart from each other in the direction Y, and the distance between the upper two leads 50 in the figure and the lower two leads 50 in the figure is relatively large. Each of the leads 50 includes a portion extending in the direction X and an end portion extending from this portion in a direction inclined with respect to the direction X. The end portion of each lead 50 extends generally toward the corresponding electrode pad 211. As viewed in the direction Z, the loop 62 of each bonding wire 6 extends in a direction connecting an electrode pad 211 and a corresponding lead 5. The landing portions 66 of the bonding wires 6 are parallel to each other and extend in the direction X.

For instance, the semiconductor device 102 is made as follows.

First, a thin metal plate as described above is worked to provide a lead frame including a plurality of die pads 40 and a plurality of leads 50 surrounding each of the die pads 40. Then, a semiconductor chip 2 is mounted on each die pad 40, and then bonding wires 6 that connect the semiconductor chips 2 and the leads 50 to each other are formed. After the formation of the bonding wires 6, the lead frame is placed in a mold and sealed with epoxy resin. Thereafter, the lead frame and epoxy resin are cut, whereby the lead frame is divided into individual die pads 40 and the leads 50, and the epoxy resin is cut into resin packages 11. In this way, the semiconductor device 102 is formed.

Figure 22:
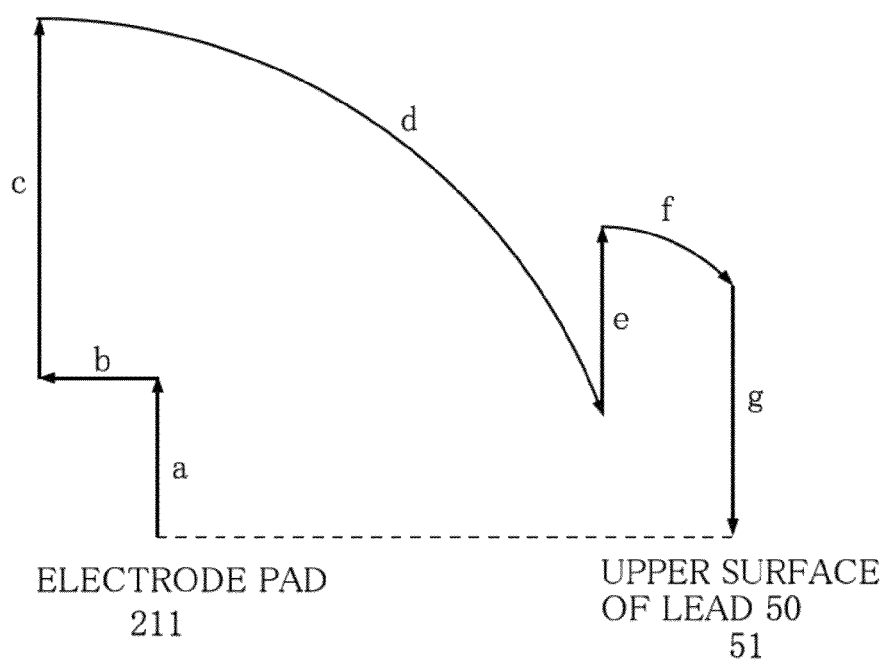
FIG. 22 shows a track of a capillary in a process of forming a bonding wire.

The process of forming each bonding wire 6 is described below with reference to FIGS. 22-30. In FIG. 22, the vertical axis represents the direction Z, whereas the horizontal axis represents the wire forming direction (directions X and Y). The arrows a-g in FIGS. 24-30 correspond to the signs a-g in FIG. 22.

The bonding wire 6 is formed by moving a capillary 7, which can pay out a wire 60 for making the bonding wire 6, along the track shown in FIG. 22.

To form a bonding wire 6, a current is applied to the end of a wire 60 held by a capillary 7 of a wire bonder, whereby a FAB (Free Air Ball) is formed. Then, as shown in FIG. 23, the capillary 7 is moved downward in the direction Z to press the FAB against the electrode pad 211, and ultrasonic energy is applied (ball bonding). The FAB pressed by the capillary 7 is deformed, whereby a first bond portion 61 is formed. In this way, bonding of one end of the wire 60 to the electrode pad 211 (first bonding) is completed.

Then, as shown in FIG. 24, the capillary 7 is moved away from the electrode pad 211 in the direction Z to a predetermined height position (e.g. to a height, of 100-300 μm) (the arrow a in FIG. 22) while paying out the wire 60.

Then, as shown in FIG. 25, while holding the wire 60 paid out from it, the capillary 7 is translated e.g. 100-200 μm in a direction away from the relevant lead 50 (arrow B in FIG. 22). This step is performed to form a loop 62 of a bonding wire 6 into a trapezoid shape. By paying out an excessive amount of wire 60 in this step, a relatively horizontal region is formed adjacent to a first bond portion 61 of the loop 62 in a later step.

Then, as shown in FIG. 26, the capillary 7 is moved e.g. 500-800 μm upward in the direction 3 while paying out the wire 6 (arrow c in FIG. 22), depending on the distance between the electrode pad 211 and the lead 50.

Then, as shown in FIG. 27, while holding the wire 60 paid out from it, the capillary 7 is moved obliquely downward in such a manner as to draw an arc toward the upper surface 51 of the lead 50 to form an inclination angle θ of 50-80° with respect to the lead 50 (arrow d in FIG. 22). As shown in FIG. 20, this process provides a loop 62 in the form of an arc projecting upward and bridging the semiconductor chip 2 and the lead 50. Further, in this step, the bonding wire 6 is bent to form a bent portion 63 in the bonding wire.

When the step shown in FIG. 25 is not performed, the resulting loop 62 has a triangular shape extending more straight toward the lead 50 as compared with the shape shown in FIG. 20. When the loop 62 is triangular, the wire 60 may come into contact with an edge of the semiconductor chip 2. To avoid this problem, the trapezoid loop 62 is employed in this embodiment. A triangular loop can be employed when the contact of the wire 60 with the semiconductor chip 2 can be avoided owing to a sufficiently small size of the semiconductor chip 2. By employing a triangular loop, the wire bonding process can be simplified.

After the formation of the bent portion 63, a step of forming a landing portion 66 is performed. To form a landing portion 66, as shown in FIG. 28, immediately before the end of the loop 62 comes into contact with the upper surface 51 of the lead 50, the capillary 7 is moved upward in the direction Z while paying out the wire 60 (arrow e in FIG. 22). Specifically, the capillary 7 is moved upward to a height position of e.g. 300-600 μm. By this step, a wire margin 64 is provided between the bent portion 63 and the end of the capillary 7, which has a length R corresponding to the length of wire 60 paid out during the upward movement of the capillary 7.

Then, as shown in FIG. 29, while holding the wire margin 64, the capillary 7 is moved to draw an arc (arrow f in FIG. 22). Specifically, the capillary 7 is moved closer to the upper surface 51 of the lead 50 in the direction Z while proceeding away from, the semiconductor chip 2 in the direction X. The track of the end of the capillary 7 during this movement is indicated by broken lines in FIG. 29. For instance, this track is an arc of a radius R that is the length R of the wire margin 64. The movement distance of the capillary 7 in the direction X in this step is e.g. 30-60 μm. In this second step, the capillary moves along the direction X as viewed in the direction 2.

Then, as shown in FIG. 30, the capillary 7 is lowered in the direction Z to come into contact with the upper surface 51 of the lead 50 (arrow g in FIG. 22). Thus, the wire margin 64 lies from the bent portion 63 on the upper surface 51 of the lead 50. Then, the wire 60 is cut by pressing the capillary 7 against the upper surface 51 of lead 50 and applying ultrasonic energy (stitch bonding). The portion of the wire 60 which is cut away from the capillary 7 is the bonding wire 6. In cutting the wire 60, the other end of the bonding wire 6 is deformed, and the second bond portion 65 is formed. In this way, bonding of the other end of the boding wire 6 to the lead 50 (second bonding) is completed. In this process, ultrasonic trace due to the application of ultrasonic energy is left in the second bond portion 65.

At the same time as the formation of the second bond portion 65, the wire margin 64 laid on the upper surface 51 of the lead 50 becomes a landing portion 66. The landing portion 66 is unfixedly held on the upper surface 51 of the lead 50 (i.e., not fixed by press-bonding or the like but just held substantially in contact with the upper surface 51 of the lead 50 without physical adhesion). The landing portion 66 and the lead 50 are substantially in parallel with each other.

The advantages of the semiconductor device 102 are described below.

According to this embodiment, as viewed in the direction Z, the bonding wire 6 has a shape bent at the bent portion 63. As compared with a bonding wire 6 that is entirely straight, the shape and arrangement of the bonding wire 6 can be appropriately adapted to the arrangement of the semiconductor chip 2 or the leads 50.

In this embodiment, all the landing portions 66 of the bonding wires 6 are along the direction X and parallel to each other. Thus, when the resin material is caused to flow in the direction Y in the molding process to form the resin package 11, the force from the resin material is exerted uniformly to all the landing portions 66 of the bonding wire 6. Thus, it is possible to prevent such a situation that the second bond portion 65 of only one or some of the bonding wires 6 is detached from the upper surface 51 of the lead 50 in forming the resin package 11. The force exerted from the resin material to the bonding wire 6 is dispersed in the direction in which the loop 62 and the landing portion 66 extend. Thus, the force from the resin material is prevented from being directly exerted on the first bond portion 61 and the second bond portion 65.

According to the above-described making method, the second bond portion 65 of each bonding wire 8 is connected to the landing portion 66 lying on the upper surface 51 of the lead 50. This arrangement is suitable for making the length of the bonding wire 6 short adjacent to the second bond portion 65. This is desirable for preventing the bonding wire 6 from being swept by resin in the process of sealing the lead frame with resin. Moreover, the resin exerts a sufficient pressure in the direction to press the landing portion 66 onto the upper surface 51 of the lead 50, whereby wire sweep in the resin-sealing process is reliably prevented.

Moreover, the loop 62 and the second bond portion 65 are not connected directly to each other but connected via the landing portion 66 intervening between them. Thus, even when the resin flowing under the loop 62 thermally expands or the length of the lead 50 changes so that the resin pushes the loop 62 upward, the effect of the pushing is suppressed. That is, even when the loop 62 is pushed upward due to the expansion of the resin, the pushing merely causes slight rising of the landing portion 66 from the lead 50, and detachment of the second bond portion 65 from, the lead 50 does not occur.

Thus, the defective rate is improved, and a reliable semiconductor device 102 can foe provided.

The above-described advantages are particularly effective when the distance between the semiconductor chip 2 and the lead 50 is further reduced in accordance, with the demand for size reduction of a semiconductor package. To make the semiconductor device 102 smaller, the distance between the semiconductor chip 2 and the lead 50 needs to be reduced, which makes it difficult to reduce the inclination angle θ of the bonding wire 6 with respect to the lead 50. When the inclination angle θ is large, the bonding wire 6 stands relative to the lead 50, which often leads to wire sweep or detachment of the second bond portion 65. Such a problem is solved by providing the landing portion 66 as in this embodiment.

Since wire sweep and detachment of the second bond portion 65 are reliably prevented in the semiconductor device 102, it is not necessary to set the die pad 40 lower than the read frame 50 (down-set). This facilitates the working of the lead frame and simplifies the making process.

The landing portion 66 that provides the above-described advantages can be easily formed, as described with reference to FIGS. 27-30, just by moving a conventionally used capillary 7, without using any novel tool. Moreover, the landing portion 66 is formed by the movement of the capillary 7 performed after the movement to draw an arc for forming the loop 62. Thus, the landing portion 66 can be formed properly regardless of the shape of the loop 62 and is hence applicable to various structures.

In this embodiment, after the wire margin 64 is formed as shown in FIG. 28, the capillary 7 is moved along an arc as shown in FIG. 29. In this process, the landing portion 66 can foe formed just by moving the capillary 7 horizontally in the direction X. However, if the capillary 7 is moved horizontally, the wire 60 already provided may be pulled. In that case, load may be exerted on the neck portion adjacent to the first bond portion 61 or the wire may become thinner, which reduces the strength of the bonding wire 6. These risks can be avoided and a more reliable bonding wire 6 can be formed by moving the capillary 7 along an arc as in this embodiment. By enhancing the reliability of the bonding wire 6, the defective rate is improved, and a reliable semiconductor device 102 is provided.

Moreover, in the case where the capillary 7 is moved straight in the horizontal direction, the capillary 7 needs to be once stopped for change of direction, before shifting to the subsequent step shown in FIG. 30, i.e., the step of moving the capillary downward in the direction Z. Unlike this, when the capillary 7 is moved along an arc as in this embodiment, the capillary 7 can be shifted to the downward movement in the direction Z without stopping. This is desirable for reducing the time taken for forming the landing portion 66.

FIGS. 31-33 show other embodiments of the present invention. In these figures, the elements that are identical or similar to those of the foregoing embodiments are designated by the same reference signs as those used for the foregoing embodiments. Further, in these figures, illustration of the resin package 11 is omitted for easier understanding.

FIG. 31 shows a semiconductor device as an electronic device based on a third embodiment of the present invention. The semiconductor device 103 of this embodiment has a bonding structure based on a third embodiment of the present invention. In this embodiment, the shape of the bonding wire 6 as viewed in the direction Z is different from the foregoing embodiments.

In this embodiment, the bent portion 63 of each bonding wire 6 is spaced farther from the electrode pad 211 in the direction Y than the second bond portion 65 is. Thus, the loop 62 extends from the first bond portion 6 to a position beyond the second bond portion 65 in the direction Y. The landing portion 66 extends back to the second bond portion 65 from the bent portion 63 provided at a farther position. That is, the bonding wire 6 has a shape bent back at the bent portion 63, and the angle of bend at the bent portion 63 as viewed in the direction 2 is about 90°.

According to this embodiment, when the loop 62 expands due to heating of the bonding wire 6 during the use of the semiconductor device 10, for example, the end of the loop 62 on the lead 50 side pushes the resin package 11. Since the resin package 11 has a sufficient rigidity as compared with the bonding wire 6, the expansion of the loop 62 is properly suppressed by the resin package 11. Since the resin package 11 suppresses the expansion of the loop 62, force due to thermal expansion of the loop 62 is hardly exerted on the landing portion 66 or the second bond portion 65. Thus, the second bond portion 65 is prevented from being detached from the upper surface 51 of the lead 50.

FIG. 32 shows a semiconductor device as an electronic device based on a fourth embodiment of the present invention. The semiconductor device 104 of this embodiment has a bonding structure based on a fourth embodiment of the present invention. In this embodiment, a plurality of bonding wires 6 are bonded to a single lead 5.

The lead 50 is in the form of a strip elongated in the direction X. Loops 62 of the plurality of bonding wires 6 extend from the respective electrode pads 211 to the leads 50. The landing portions 66 of the bonding wires 6 are parallel to each other and extend in the direction X. That is, the landing portions 66 of the bonding wires 6 extend in the longitudinal direction of the leads 50. The structure of this embodiment allows a plurality of bonding wires 6 to be bonded to a single lead 50 without interfering with each other. This achieves size reduction of the semiconductor device 104.

FIG. 33 shows a semi conduct or device as an electronic device based on a fifth embodiment of the present invention. The semiconductor device 105 of this embodiment has a bonding structure based on a fifth embodiment of the present invention.

The lead 50 is arranged such that part of the lead 50 is beyond the upper edge of the semiconductor chip 2 in the direction Y in FIG. 33. Loops 62 of the plurality of bonding wires 6 extend from the respective electrode pads 211 to the leads 50. The landing portions 66 of the bonding wires 6 are parallel to each other, but unlike the above-described semiconductor device 104, extend in a direction inclined with respect to both of the direction X and the direction Y. The structure of this embodiment also allows a plurality of bonding wires 6 to be bonded to a single lead 50 without interfering with each other. This achieves size reduction of the semiconductor device 105.

The bonding structure and electronic device according to the present invention are not limited to the foregoing embodiments. The bonding structure and the specific structure of the electronic device as well as the making method can be varied in design in many ways.

In the above-described method for making the semiconductor devices 102-105, the capillary 7 is moved to draw an arc in the step shown in FIG. 29. Instead of this, the capillary 7 may perform linear movement and arc movement in combination. For instance, the capillary 7 may be moved horizontally a certain distance and then shift to arc movement. Further, in forming a bent portion 63 in the step shown in FIG. 27, the bonding wire 6 may be pressed against the upper surface 51 of the lead 50 by the capillary 7. In this case, the dimension of the bent portion 63 in the direction Z becomes smaller than the dimensions of the loop 62 and the landing portion 66, or the bent portion 63 has a constricted shape. The bent portion 63 is more likely to keep the state bonded on the upper surface 51.

For instance, although the above-described semiconductor device 102 is of the QFN type, the present invention is applicable also to semiconductor devices of other non-lead package types such as the SON (Small Outlined Non-leaded Package) and also to electronic components such as chip resistors or chip capacitors.

Further, although the above-described semiconductor device 102 is of a singulation type in which the end surface of the lead 50 and the side surface of the resin package 11 are flush with each other, the present invention is not limited to such an embodiment. The present invention is applicable also to a semiconductor device adapted for a non-lead package of a lead cut type in which the lead 50 projects from the resin package 11. Further, the present invention is applicable not only to a semiconductor device adapted for a non-lead package but also to a semiconductor device such as a QFP (Quad Flat Package) type configured such that the lead 50 projects from the resin package 11.

The foregoing embodiments employ a structure in which the die pad 40 is not down-set, because such a structure is desirable for simplifying the working of a lead frame. However, the present invention is not limited to this structure, and also applicable to a structure in which the die pad 40 is down-set relative to the upper surface 51 of the lead 50.

[Appendix 1]
A bonding structure comprising:
a first component;
at least one second component spaced apart from the first component in a first direction and including a pad surface facing a second direction perpendicular to the first direction;
at least one bonding wire including a first bond portion bonded to the first component and a second bond portion bonded to the pad surface of the second component, wherein:
the bonding wire includes: a landing portion extending from the second bond portion along the pad surface; a bent portion connected to the landing portion on a side opposite from the second bond portion; and a loop that is connected to the bent portion from a side of the first bond portion and forms an angle between a portion thereof which is connected to the bent, portion and the pad surface, the angle being larger than an angle formed by the landing portion and the pad surface, and
the loop and the landing portion extend in different directions from each other as viewed in the second direction.

[Appendix 2]
The bonding structure as set forth in Appendix 1, wherein the bent portion is in contact with the pad surface.

[Appendix 3]
The bonding structure as set forth in Appendix 1 or 2, wherein a plurality of the second components and a plurality of the bonding wires, are provided, and
the landing portions of the bonding wires are parallel to each other.

[Appendix 4]
The bonding structure as set forth in Appendix 3, wherein the loops of the bonding wires cross the first direction as viewed in the second direction, whereas the landing portions of the bonding wires are along the first direction as viewed in the second direction.

[Appendix 5]
The bonding structure as set forth in Appendix 1 or 2, wherein, the first bond portion, the bent portion and the second bond portion are at different positions from each other in a third direction perpendicular to both the first direction and the second direction, and the bent portion is spaced farther from the first bond portion in the third direction than the second bond portion is.

[Appendix 6]
The bonding structure as set forth in Appendix 1 or 2, wherein a plurality of the bonding wires are bonded to the pad surface of a single second component.

[Appendix 7]
The bonding structure as set forth in Appendix 6, wherein the landing portions of the bonding wires are parallel to each other.

[Appendix 8]
The bonding structure as set forth in Appendix 7, wherein the second component is elongated in a predetermined direction, and
the landing portions of the bonding wires are along the longitudinal direction of the second component.

[Appendix 9]
The bonding structure as set forth in any one of Appendixes 1-8, wherein: the landing portion is 10-80 μm in length, and the angle formed by the portion of the loop which is connected to the bent portion and the pad surface is 60-80°.

[Appendix 10]
The bonding structure as set forth in any one of Appendixes 1-9, wherein the first bond portion and the second component are spaced apart from each other by not more than 800 μm in the first direction.

[Appendix 11]
The bonding structure as set forth in any one of Appendixes 1-10, wherein the first bond portion and the second bond portion are spaced apart from each other by not less than 100 μm in the second direction.

[Appendix 12]
The bonding structure as set forth in any one of Appendixes 1-11, wherein an ultrasonic trace is formed in the second bond portion.

[Appendix 13]
An electronic device including a bonding structure as set forth in any one of Appendixes 1-12, comprising:
an electronic component as the first component;
at least one lead as the second component;
the bonding wire; and
a resin package that seals the electronic component and said at least one bonding wire.

[Appendix 14]
The electronic device as set forth in Appendix 13, comprising a die pad including an obverse surface and a reverse surface facing away from each other, wherein the electronic component is bonded on the obverse surface.

[Appendix 15]
The electronic device as set forth in Appendix 14, wherein the obverse surface of the die pad and the pad surface of the lead are flush with each other.

[Appendix 16]
The electronic device as set forth in Appendix 14 or 15, wherein the reverse surface of the die pad is exposed from the resin package.

[Appendix 17]
The electronic device as set forth in any one of Appendixes 13-16, wherein said at least one lead is exposed from the resin package in the second direction.

[Appendix 18]
The electronic device as set forth in any one of Appendixes 13-17, wherein the lead and the resin package are different from each other in coefficient of thermal expansion.

Other embodiments of the present invention are described below with reference to FIGS. 34-45.

FIG. 34 shows an example of resin-sealed type electronic component made by a method based on an embodiment of the present invention. Specifically, the resin-sealed type electronic component shown in FIG. 34 is a semiconductor device, and FIG. 34 is a schematic bottom view of the semiconductor device. FIG. 35 is a sectional view taken along lines XXXV-XXXV in FIG. 34. FIG. 36 shows the portion surrounded by the broken line B in FIG. 35 as enlarged. The semiconductor device 106 shown in FIGS. 34-36 is a surface-mounting semiconductor device of a QFN (Quad Flat Non-leaded) type and includes a resin package 11, a semiconductor chip 2, a bonding material 3, a die pad 40, a plurality of leads 50, and a plurality of bonding wires 6.

The semiconductor device 106 is generally in the form of a rectangular parallelepiped having a relatively small thickness. As shown in FIG. 34, the semiconductor device 106 is square in bottom view. Specifically, each side of the bottom surface of the semiconductor device 106 is about 4 mm. The thickness of the semiconductor device 106 is e.g. 0.80-0.90 mm.

The resin package 11 defines the outer configuration of the semiconductor device 106 and covers the semiconductor chip 2, the bonding material 3, the die pad 40, the leads 50 and the bonding wires 6. The resin package 11 is made of e.g. epoxy resin.

The semiconductor chip 2 is the first component in the Appendixes described later and in the form of a rectangular parallelepiped having a thickness of not less than 100 μm, and specifically, e.g. 220-240 μm. The semiconductor chip 2 has an obverse surface 21 and a reverse surface 22 facing away from each other. The semiconductor chip 2 is mounted on the die pad 40 such that the obverse surface 21 faces upward in FIG. 35. The semiconductor chip 2 includes a plurality of electrode pads 211 on the obverse surface 21. The reverse surface 22 is bonded on the upper surface, in FIG. 35, of the die pad 40 via the bonding material 3. As the bonding material 3, use may be made of solder paste, silver paste, alumina paste or a non-conductive material.

As shown in FIG. 34, in bottom view, the die pad 40 is arranged at the center of the semiconductor device 106, and the leads 50 are arranged around the die pad 40 with predetermined intervals. As shown in FIG. 35, the lower surfaces of the die pad 40 and leads 50 in the figure are exposed from the resin package 11. In this embodiment, the die pad 40 is not down-set relative to the leads 50, and the upper surface of the die pad 40 and the upper surfaces of the leads 50 are at the same height position. The die pad 40 and the leads 50 are made of metal. As will be described later, the die pad 40 and the leads 50 are made of a same thin metal plate and have a same thickness. Specifically, the thin metal plate for making the die pad 40 and the leads 50 has a thickness of e.g. 190-210 μm and is made of copper or 42-alloy (an alloy containing Fe and 42% nickel).

In bottom view, the die pad 40 has a center overlapping the center of the resin package 11, and is in the form of a rectangular plate having four sides parallel to the four sides of the resin package 11. In bottom view, the size of the die pad 40 is larger than that of the semiconductor chip 2 and about 2.7 mm×2.7 mm.

The leads 50 are arranged to face each side surface of the die pad 40. In the example shown in FIG. 34, nine leads 50 are arranged to face each side of the die pad 40. The distance between each lead 50 and the die pad 40 in their facing direction is e.g. 390-410 μm. Each lead 50 is the second component in the Appendixes described later, and the upper surface 51 of each lead 50 is the pad surface in the Appendixes described later.

As shown in FIG. 36, there is a height difference H between the upper surface 51 of the lead 50 and the electrode pad 211, which depends on the thickness of the semiconductor chip 2. The height difference H is not less than 100 μm, and specifically, e.g. 200-400 μm, including the thickness of the bonding material 3.

As shown in FIG. 36, one end of a bonding wire 6 is bonded to the electrode pad 211, whereas the other end of the bonding wire 6 is bonded to the upper surface 51 of one of the lead 50. Specifically, bonding wires 6, each of which is connected at one end to an electrode pad 211, are connected to the upper surfaces 51 of different leads 50 at their respective other ends. In this way, the semiconductor chip 2 is electrically connected to the leads 50 via bonding wires 6. The length of each bonding wire 6 depends on the distance between the electrode pad 211 and the lead 50, and the distance between the electrode pad 211 and lead 50 is e.g. 500-800 μm.

As shown in FIG. 36, each bonding wire 6 includes a first bond portion 61, a loop 62, a bent portion 63, a second bond portion 85 and a landing portion 66. The first bond portion 61 is bonded to the electrode pad 211, and the second bond portion 65 is bonded to the lead 50. The loop 62 is generally in the form of a trapezoid and extends from the first bond portion 61 to the bent portion 63. The inclination angle θ of the loop 62 with respect to the upper surface 51 of the lead 50 is e.g. 60-80°. The landing portion 66 extends from the bent portion 63 to the second bond portion 65. The landing portion 66 is formed to lie on the upper surface 51 of the lead 50 and has a length L of 10-80 μm.

As the bonding wire 6, metal wires such as a gold wire, an aluminum wire and a copper wire may be used. The diameter of the bonding wire 6 is not limited to a specific value, and the advantages described later can be obtained by forming the landing portion 66 having a length, appropriate for the diameter.

For instance, the semiconductor device 106 is made as follows.

First, a thin metal plate as described above is worked to provide a lead frame including a plurality of die pads 40 and a plurality of leads 50 surrounding each of the die pads 40. Then, a semiconductor chip 2 is mounted on each die pad 40, and then bonding wires 6 connecting the semiconductor chip 2 and the leads 50 to each other are formed. After the formation of the bonding wires 6, the lead frame is placed in a mold and sealed with epoxy resin. Thereafter, the lead frame and epoxy resin are cut, whereby the lead frame is divided into individual die pads 40 and the leads 50, and the epoxy resin is cut into resin packages 11. In this way, the semiconductor device 106 is formed.

The process of forming each bonding wire 6 is described below with reference to FIGS. 37-45. In FIG. 37, the vertical axis represents the direction Z, whereas the horizontal axis represents the wire forming direction (directions X and Y). The arrows a-g in FIGS. 39-45 correspond to the signs a-g in FIG. 37. The direction Z corresponds to the thickness direction of the semiconductor device 106. The direction X and the direction Y are directions along sides of the quadrangle of the semiconductor device 106 in bottom view. The direction X corresponds to the first direction in the Appendixes described later, and the direction Z corresponds to the second direction in the Appendixes described later.

The bonding wire 6 is formed by moving a capillary 7, which can pay out a wire 60 for making the bonding wire 6, along the track shown in FIG. 37.

To form a bonding wire 6, a current is applied to the end of a wire 60 held by a capillary 7 of a wire bonder, whereby a FAB (Free Air Ball) is formed. Then, as shown in FIG. 38, the capillary 7 is moved downward in the direction Z to press the FAB against the electrode pad 211, and ultrasonic energy is applied (ball bonding). The FAB pressed by the capillary 7 is deformed, whereby a first bond portion 61 is formed. In this way, bonding of one end of the wire 60 to the electrode pad 211 (first bonding) is completed.

Then, as shown in FIG. 19, the capillary 7 is moved away from the electrode pad 211 in the direction Z to a predetermined height position (e.g. to a height of 100-300 μm)(the arrow a in FIG. 37) while paying out the wire 60.

Then, as shown in FIG. 40, while holding the wire 60 paid out from it, the capillary 7 is translated e.g. 100-200 μm along the direction X (arrow b in FIG. 37). Specifically, the capillary 7 is moved to be away from the lead 50 to which the wire 60 is to be bonded. This step is performed to form a loop 62 of a bonding wire 6 into a trapezoid shape. By paying out an excessive amount of wire 60 in this step, a substantially horizontal region is formed adjacent to a first bond portion 61 of the loop 62 in a later step.

Then, as shown in FIG. 41, the capillary 7 is moved e.g. 500-800 μm upward in the direction Z while paying out the wire 60 (arrow c in FIG. 37), depending on the distance between the electrode pad 211 and the lead 50.

Then, as shown in FIG. 42, while holding the wire 60 paid out from it, the capillary 7 is moved obliquely downward in the figure in such a manner as to draw an arc toward the upper surface 51 of the lead 50 to form an inclination angle θ of 60-80° with respect to the lead 50 (arrow d in FIG. 37). As shown in FIG. 36, this process provides a loop 62 in the form of an arc projecting upward and bridging the semiconductor chip 2 and the lead 50. Further, in this step, the bonding wire 6 is bent to form a bent portion 63 in the bonding wire.

When the step shown in FIG. 40 is not performed, the resulting loop 62 has a triangular shape extending more straight toward the lead 50 as compared with the shape shown in FIG. 36. When the loop 62 is triangular, the wire 60 may come into contact with an edge of the semiconductor chip 2. To avoid this problem, the trapezoid loop 62 is employed in this embodiment. A triangular loop can be employed when the contact of the wire 60 with, the semiconductor chip 2 can be avoided owing to a sufficiently small size of the semiconductor chip 2. By employing a triangular loop, the wire bonding process can be simplified.

After the formation of the bent portion 63, a step of forming a landing portion 66 is performed. To form a landing portion 66, as shown in FIG. 43, immediately before the end of the loop 62 comes into contact with the upper surface 51 of the lead 50, the capillary 7 is moved upward in the direction Z while paying out the wire 60 (arrow e in FIG. 37). Specifically, the capillary 7 is moved upward to a height position of e.g. 300-600 μm. By this step, a wire margin 64 is provided between the bent portion 63 and the end of the capillary 7, which has a length R corresponding to the length of wire 60 paid out during the upward movement of the capillary 7. This step is the first step in the Appendixes described later.

Then, as shown in FIG. 44, while holding the wire margin 64, the capillary 7 is moved to draw an arc (arrow f in FIG. 37). Specifically, the capillary 7 is moved closer to the upper surface 51 of the lead 50 in the direction Z while proceeding away from the semiconductor chip 2 in the direction X. The track of the end of the capillary 7 during this movement is indicated by broken lines in FIG. 44. For instance, this track is an arc of a radius R that is the length R of the wire margin 64. The movement distance of the capillary 7 in the direction X in this step is e.g. 30-60 μm. This step is the second step in the Appendixes described later.

Then, as shown in FIG. 45, the capillary 7 is lowered in the direction Z to come into contact with the upper surface 51 of the lead 50 (arrow g in FIG. 37). Thus, the wire margin 64 lies from the bent portion 63 on the upper surface 51 of the lead 50. Then, the wire 60 is cut by pressing the capillary 7 against the upper surface 51 of lead 50 and applying ultrasonic energy (stitch bonding). The portion of the wire 60 which is cut away from the capillary 7 is the bonding wire 6. In cutting the wire 60, the other end of the bonding wire 6 is deformed, and the second bond portion 65 is formed. In this way, bonding of the other end of the boding wire 6 to the lead 50 (second bonding) is completed. In this process, ultrasonic trace due to the application of ultrasonic energy is left in the second bond portion 65.

At the same time as the formation of the second bond portion 65, the wire margin 64 laid on the upper surface 51 of the lead 50 becomes a landing portion 66. The landing portion 66 is unfixedly held on the upper surface 51 of the lead 50 (i.e., not fixed by press-bonding or the like but just held substantially in contact with the upper surface 51 of the read 50 without physical adhesion). The landing portion 66 and the lead 50 are substantially in parallel with each other.

The advantages of the semiconductor device 106 and the making method are described below.

According to the above-described making method, the second bond portion 65 of each bonding wire 6 is connected to the landing portion 66 lying on the upper surface 51 of the lead 50. This arrangement is suitable for making the length of the bonding wire 6 short adjacent to the second bond portion 65. This is desirable for preventing the bonding wire 6 from being swept by resin in the process of sealing the lead frame with resin. Moreover, the resin exerts a sufficient pressure in the direction to press the landing portion 66 onto the upper surface 51 of the lead 50, whereby wire sweep in the resin-sealing process is reliably suppressed.

Moreover, the loop 62 and the second bond portion 65 are not connected directly to each other but connected via the landing portion 66 intervening between them. Thus, even when the resin flowing under the loop 62 thermally expands or the length of the lead 50 changes so that the resin pushes the loop 62 upward, the effect of the pushing is suppressed. That is, even when the loop 62 is pushed upward due to the expansion of the resin, the pushing merely causes slight rising of the landing portion 66 from the lead 50, and detachment of the second bond portion 65 from the lead 50 does not occur. Thus, the defective rate is improved, and a reliable semiconductor device 106 can be provided.

The above-described advantages are particularly effective when the distance between the semiconductor chip 2 and the lead 50 is further reduced in accordance with the demand for size reduction of a semiconductor package. To make the semiconductor device 106 smaller, the distance between the semiconductor chip 2 and the lead 50 needs to be reduced, which makes it difficult to reduce the inclination angle θ of the bonding wire 6 with respect to the lead 50. When the inclination angle θ is large, the bonding wire 6 stands relative to the lead 50, which often leads to wire sweep or detachment of the second bond portion 65. Such a problem can be avoided by providing the landing portion 66 as in this embodiment.

Since wire sweep and detachment of the second bond portion 65 are reliably prevented in the semiconductor device 106, it is not necessary to set the die pad 40 lower than the lead frame 50 (down-set). This facilitates the working of the lead frame and simplifies the making process.

The landing portion 66 that provides the above-described advantages can be easily formed, as described with reference to FIGS. 42-45, just by moving a conventionally used capillary 7, without using any novel tool. Moreover, the landing portion 66 is formed by the movement of the capillary 7 performed after the movement to draw an arc for forming the loop 62. Thus, the landing portion 66 can be formed properly regardless of the shape of the loop 62 and is hence applicable to various structures.

In this embodiment, after the wire margin 64 is formed as shown in FIG. 43, the capillary 7 is moved along an arc as shown in FIG. 44. In this process, the landing portion 66 can be formed just by moving the capillary 7 horizontally in the direction X. However, if the capillary 7 is moved horizontally, the wire 60 already provided may be pulled. In that case, load may exerted on the neck portion adjacent to the first bond portion 61 or the wire may become thinner, which reduces the strength of the bonding wire 6. These risks can be avoided and a more reliable bonding wire 6 can be formed by moving the capillary 7 along an arc as in this embodiment. By enhancing the reliability of the bonding wire 6, the defective rate is improved, and a reliable semiconductor device 106 is provided.

Moreover, in the case where the capillary 7 is moved straight in the horizontal direction, the capillary 7 needs to be once stopped for change of direction, before shifting to the subsequent step shown in FIG. 45, i.e., the step of moving the capillary downward in the direction Z. Unlike this, when the capillary 7 is moved along an arc as in this embodiment, the capillary 7 can be shifted to the downward movement in the direction Z without stopping. This is desirable for reducing the time taken for forming the landing portion 66.

The method for making the resin-sealed type electronic component according to the present invention is not limited to the foregoing embodiments but can be varied in design in many ways.

In the method for making the semiconductor device 106, the capillary 7 is moved to draw an arc in the step shown in FIG. 44. Instead of this, the capillary 7 may perform linear movement and arc movement in combination. For instance, the capillary 7 may be moved horizontally a certain distance and then shift to arc movement.

For instance, although the above-described semiconductor device 106 is of the QFN type, the present invention is applicable also to semiconductor devices of other non-lead package types such as the SON (Small Outlined Non-leaded Package) and also to electronic components such as chip resistors or chip capacitors.

Further, although the above-described semiconductor device 106 is of a singulation type in which the end surface of the lead 50 and the side surface of the resin package 11 are flush with each other, the present invention is not limited to such an embodiment. The present invention is applicable also to a semiconductor device adapted for a non-lead package of a lead cut type in which the lead 50 projects from the resin package 11. Further, the present invention is applicable not only to a semiconductor device adapted for a non-lead package but also to a semiconductor device such as a QFP (Quad Flat Package) type configured such that the lead 50 projects from the resin package 11.

The foregoing embodiments employ a structure in which the die pad 40 is not down-set, because this structure is desirable for simplifying the working of a lead frame. However, the present invention is not limited to this structure, and also applicable to a structure in which the die pad 40 is down-set relative to the upper surface 51 of the lead 50.

[Appendix 1]
A method for making a resin-sealed type electronic component comprising the steps of:
forming a bonding wire that electrically connects a first component and a second component that are spaced apart from each other in a first direction, by operating a capillary that pays out a wire; and
sealing the first component and the bonding wire with resin, wherein:
the second component includes a pad surface facing a second direction perpendicular to the first direction,
the step of forming a bonding wire comprises: a first bonding step of bonding a wire paid out from the capillary to the first component; a second bonding step of cutting the wire while pressing the wire paid out from the capillary against the pad surface; a loop forming step which is performed between the first bonding step and the second bonding step and in which a bent portion is formed; and a landing portion forming step performed between the loop forming step and the second bonding step, and
the landing portion forming step comprises: a first step of providing a wire margin by moving the capillary away from the pad surface in the second direction while paying out the wire from the capillary; and a second step of moving the capillary closer to the pad surface in the second direction, while moving the capillary away from the first component in the first direction.

[Appendix 2]
The method for making a resin-sealed type electronic component as set forth in Appendix 1, wherein:
the loop forming step comprises forming the bent portion by moving the capillary closer to the pad surface in the second direction, and
the first step comprises moving the capillary along the second direction from a position where the bent portion is formed.

[Appendix 3]
The method for making a resin-sealed type electronic component as set forth in Appendix 1 or 2, wherein the second step comprises moving the capillary in such a manner as to draw an arc within a plane containing the first direction and the second direction.

[Appendix 4]
The method for making a resin-sealed type electronic component as set forth in Appendix 3, wherein in the second step, the capillary is moved along an arc of a circle having a center at the bent portion and a radius corresponding to a length of the wire margin provided in the first step.

[Appendix 5]
The method for making a resin-sealed type electronic component as set forth in Appendix 3 or 4, wherein in the second step, the capillary is moved 30-60 µm along the first direction.

[Appendix 6]
The method for making a resin-sealed type electronic component as set forth in any one of Appendixes 1-5, wherein: the first component includes an electrode pad spaced apart from the pad surface in the second direction,
the first bonding step comprises forming a ball portion at an end of the wire paid out from the capillary and press-bonding the ball portion against the electrode pad, and
the second bonding step comprises press-bonding the wire held by the capillary onto the pad surface by stitch bonding.

[Appendix 7]
The method for making a resin-sealed type electronic component as set forth in Appendix 6, wherein the electrode pad and the pad surface are spaced apart, from each other by not less than 100 µm in the second direction.

[Appendix 8]
The method for making a resin-sealed type electronic component as set forth in Appendix 6 or 7, wherein the loop forming step comprises a step of moving the capillary away from the electrode pad in the second direction and a step of moving the capillary toward the pad surface in such a manner as to draw an arc.

[Appendix 9]
The method for making a resin-sealed type electronic component as set forth in Appendix 8, wherein the step of moving the capillary toward the pad surface in such a manner as to draw an arc comprises moving the capillary such that the bonding wire forms an inclination angle of 60-80° with respect to the pad surface.

[Appendix 10]
The method for making a resin-sealed type electronic component as set forth in any one of Appendixes 1-9, wherein
the first component is a semiconductor chip,
the second component, is a lead terminal,
the method further comprises the step of forming a lead frame including a die pad to which the semiconductor chip is to be bonded and the lead terminal, and
the step of sealing the first component and the bonding wire with resin comprises placing the lead frame in a mold, flowing resin into the mold and hardening the resin.

[Appendix 11]
The method for making a resin-sealed type electronic component as set forth in Appendix 10, wherein the step of forming the lead frame comprises working a thin metal plate such that the die pad and the lead terminal are at a same position in the second direction.

Other embodiments of the present invention are described below with reference to FIGS. 46-60.

FIG. 46 shows an example of resin-sealed type electronic component based on an embodiment of the present invention. Specifically, the resin-sealed type electronic component shown in FIG. 46 is a semiconductor device, and FIG. 46 is a schematic bottom view of the semiconductor device. FIG. 47 is a sectional view taken along lines XLVII-XLVII in FIG. 46. FIG. 48 shows the portion surrounded by the broken line B in FIG. 47 as enlarged. The semiconductor device 107 shown in FIGS. 46-48 is a surface-mounting semiconductor device of a QFN (Quad Flat Non-leaded) type and includes a resin package 11, a semiconductor chip 2, a bonding material 3, a die pad 40, a plurality of leads 50, and a plurality of bonding wires 6. The direction Z shown in FIG. 48 corresponds to the thickness direction of the semiconductor device 107. The direction X and the direction Y are directions along sides of the quadrangle of the semiconductor device 107 in bottom view. The direction X corresponds to the first direction in the Appendixes described later, and the direction Z corresponds to the second direction in the Appendixes described later.

The semiconductor device 107 is generally in the form of a rectangular parallelepiped having a relatively small thickness. As shown in FIG. 46, the semiconductor device 107 is square in bottom view. Specifically, each side of the bottom surface of the semiconductor device 107 is about 4 mm. The thickness of the semiconductor device 107 is e.g. about 0.80-0.90 mm.

The resin package 11 defines the outer configuration of the semiconductor device 107 and covers the semiconductor chip 2, the bonding material 3, the die pad 40, the leads 50 and the bonding wires 6. The resin package 11 is made of e.g. epoxy resin.

The semiconductor chip 2 is the first component in the Appendixes described later and in the form of a rectangular parallelepiped having a thickness of not less than 100 μm, and specifically, e.g. 220-240 μm. The semiconductor chip 2 has an obverse surface 21 and a reverse surface 22 facing away from each other. The semiconductor chip 2 is mounted on the die pad 40 such that the obverse surface 21 faces upward in FIG. 47. The semiconductor chip 2 includes a plurality of electrode pads 211 on the obverse surface 21. The reverse surface 22 is bonded to the die pad 40 via the bonding material 3. As the bonding material 3, use may be made of solder paste, silver paste, alumina paste or a non-conductive material.

As shown in FIG. 46, in bottom view, the die pad 40 is arranged at the center of the semiconductor device 107, and the leads 50 are arranged around the die pad 40 with predetermined intervals. As shown in FIG. 47, the lower surfaces of die pad 40 and reads 50 in the figure are exposed from the resin package 11. In this embodiment, the die pad 40 is not down-set relative to the leads 50, and the upper surface of the die pad 40 and the upper surfaces of the leads 50 are at the same height position. The die pad 40 and the leads 50 are made of metal. As will be described later, the die pad 40 and the leads 50 are made of a same thin metal plate and have a same thickness. Specifically, the thin metal plate for making the die pad 40 and the leads 50 has a thickness of e.g. 190-210 μm and is made of copper or 42-alloy fan alloy containing Fe and 42% nickel).

In bottom view, the die pad 40 has a center overlapping the center of the resin package 11, and is in the form of a rectangular plate having four sides parallel to the four sides of the resin package 11. In bottom view, the size of the die pad 40 is larger than that of the semiconductor chip 2 and about 2.7 mm×2.7 mm. The die pad 40 has an upper surface 41 and a lower surface 42 facing away from each other in the direction 2. The semiconductor chip 2 is bonded on the upper surface 41. As shown in FIG. 47, the lower surface 42 of the die pad 40 is exposed from the resin package 11.

Each lead 50 includes an upper surface 51 and a lower surface 52 facing away from each other in the direction z. The leads 50 are arranged to face each side surface of the die pad 40. In the example shown in FIG. 46, nine leads 50 are arranged to face each side of the die pad 40. The distance between each lead 50 and the die pad 40 in their facing direction is e.g. 390-410 μm. Each lead 50 is the second component in the Appendixes described later, and the upper surface 51 of each lead 50 is the pad surface in the Appendixes described later. As shown in FIG. 47, the lower surface 52 of each pad 50 is exposed from the resin package 11.

As shown in FIG. 48, there is a height difference H between the upper surface 51 of the lead 50 and the electrode pad 211, which depends on the thickness of the semiconductor chip 2. The height difference H is not less than 100 μm, and specifically e.g. 200-400 μm, including the thickness of the bonding material 3.

As shown in FIG. 48, one end of a bonding wire 6 is bonded to the electrode pad 211, whereas the other end of the bonding wire 6 is bonded to the upper surface 51 of the lead 50. Specifically, bonding wires 6, each of which is connected at one end to an electrode pad 211, are connected to the upper surfaces 51 of different leads 50 at their respective other ends. In this way, the semiconductor chip 2 is electrically connected to the leads 50 via bonding wires 6. The length of each bonding wire 6 depends on the distance between the electrode pad 211 and the lead 50, and the distance between the electrode pad 211 and the lead 50 is e.g. 500-800 μm.

As shown in FIG. 48, each bonding wire 6 includes a first bond portion 61, a loop 62, a bent portion 63, a second bond portion 65 and a landing portion 66. The first, bond portion 61 is bonded to the electrode pad 211, and the second bond portion 65 is bonded to the lead 50. The loop 62 is generally in the form of a trapezoid and extends from the first bond portion 61 to the bent portion 63. The inclination angle θ of the loop 62 with respect to the upper surface 51 of the lead 50 is e.g. 60-80°. The landing portion 66 is sandwiched between the bent portion 63 and the second bond portion 65 in the direction X. The landing portion 66 is formed to lie on the upper surface 51 of the lead 50 and has a length L of e.g. 10-80 μm. The bent portion 63 of each bonding wire 6 has a recess 631 extending in the direction Z toward, the tipper surface 51 of the lead 50. To show the details of the bonding wire 6, FIGS. 49 and 50 show a portion of the bonding wire 6 adjacent to the lead 50 as enlarged. Explanation is given below also with reference to FIGS. 49 and 50.

As shown in FIGS. 49 and 50, the bent portion 63 has, at a position overlapping the recess 631 as viewed in the direction Z, a preliminary bond portion 632 bonded to the upper surface of the lead 50. The preliminary bond portion 632 is the third bond portion in the Appendixes described later. The preliminary bond portion is formed by press-bonding accompanying heating and ultrasonic energy application, and hence has a shape spreading in the direction Y as shown in FIG. 49.

As shown in FIG. 50, since the recess 631 is formed at the bent portion 63, the preliminary bond portion 632 is thinner than adjacent portions. The thickness Da of the landing portion 66 is substantially equal to the diameter of the bonding wire 6, and the thickness Db of the bent portion 63 is smaller than the thickness Da, or the diameter of the bonding wire 6. The bent portion 63 is thicker than the second bond portion 65. The thickness Dc of the second bond portion 65 is about 10-25% of the diameter of the bonding wire 6. The thickness Db of the bent portion 63 is larger than the thickness Dc.

For instance, the semiconductor device 107 is made as follows.

First, a thin metal plate as described above is worked to provide a lead frame including a plurality of die pads 40 and a plurality of leads 50 surrounding each of the die pads 40. Then, a semiconductor chip 2 is mounted on each die pad 40, and then bonding wires 6 connecting the semiconductor chip 2 and the leads 50 to each other are formed. After the formation of the bonding wires 6, the lead frame is placed in a mold and sealed with epoxy resin. Thereafter, the lead frame and epoxy resin are cut, whereby the lead frame is divided into individual die pads 40 and the leads 50, and the epoxy resin is cut into resin packages 11. In this way, the semiconductor device 107 is formed.

The process of forming each bonding wire 6 is described below with reference to FIGS. 51-60. In FIG. 51, the vertical axis represents the direction Z, whereas the horizontal axis represents the wire forming direction (directions X and Y). The arrows a-h in FIGS. 53-60 correspond to the signs a-h in FIG. 51.

The bonding wire 6 is formed by moving a capillary 7, which can pay out a wire 60 for making the bonding wire 6, along the track shown in FIG. 51.

To form a bonding wire 6, a current is applied to the end of a wire 60 held by a capillary 7 of a wire bonder, whereby a FAB (Free Air Ball) is formed. Then, as shown in FIG. 52, the capillary 7 is moved downward in the direction Z to press the FAB against the electrode, pad 211, and ultrasonic energy is applied (ball bonding). The FAB pressed by the capillary 7 is deformed, whereby a first bond portion 61 is formed. In this way, bonding of one end of the wire 60 to the electrode pad 211 (first bonding) is completed.

Then, as shown in FIG. 53, the capillary 7 is moved away from the electrode pad 211 in the direction Z to a predetermined height position (e.g. to a height of 100-300 μm) (the arrow a in FIG. 51) while paying out the wire 60.

Then, as shown in FIG. 54, while holding the wire 60 paid out from it, the capillary 7 is translated e.g. 100-200 μm along the direction X (arrow b in FIG. 51). Specifically, the capillary 7 is moved to be away from the lead 50 to which the wire 60 is to be bonded. This step is performed to form a loop 62 of a bonding wire 6 into a trapezoid shape. By paying out an excessive amount of wire 60 in this step, a substantially horizontal region is formed adjacent to a first bond portion 61 of the loop 62 in a later step.

Then, as shown in FIG. 55, the capillary 7 is moved e.g. 500-800 μm upward in the direction Z while paying out the wire 60 (arrow c in FIG. 51), depending on the distance between the electrode pad 211 and the lead 50.

Then, as shown, in FIG. 56, while holding the wire 60 paid out from it, the capillary 7 is moved obliquely downward in the figure in such a manner as to draw an arc toward the upper surface 51 of the lead 50 to farm an inclination angle θ of from 60-80° with respect to the lead 50 (arrow d in FIG. 51). As shown in FIG. 48, this process provides a loop 62 in the form of an arc projecting upward and bridging the semiconductor chip 2 and the lead 50.

When the step shown in FIG. 54 is not performed, the resulting loop 62 has a triangular shape extending more straight toward the lead 50 as compared with the shape shown in FIG. 48. When the loop 62 is triangular, the wire 60 may come into contact with an edge of the semiconductor chip 2. To avoid this problem, the trapezoid loop 62 is employed in this embodiment. A triangular loop can be employed when the contact of the wire 60 with the semiconductor chip 2 can be avoided owing to a sufficiently small size of the semiconductor chip 2. By employing a triangular loop, the wire bonding process can be simplified.

After the loop 62 is formed, a wire contact step is performed. In this step, as shown in FIG. 57, the capillary 7 is moved closer to the upper surface 51 of the lead 50 along the direction Z to bring the wire 60 into contact with the upper surface 51 of the lead 50 (arrow e in FIG. 51). Immediately after this process, a wire bonding step is performed. In this wire bonding step, ultrasonic energy is applied to press-bond the wire 60 onto the upper surface 51 of the lead (stitch bonding). By these steps, a bent portion 63 is formed. Specifically, a recess 631 is formed by pressing the wire 60 against the upper surface 51 of the lead 50 in the wire contact step, and a preliminary bond portion 632 is formed by the wire bonding step.

After the formation of the bent portion 63, a step of forming a landing portion 66 is performed. To form a landing portion 66, as shown in FIG. 58, the capillary 7 is moved upward in the direction Z while paying out the wire 60 (arrow f in FIG. 51). Specifically, the capillary 7 is moved upward to a height position of e.g. 300-600 μm. By this step, a wire margin 64 is provided between the bent portion 63 and the end of the capillary 7, which has a length R corresponding to the length of wire 60 paid out during the upward movement of the capillary 7. This step is the first step in the Appendixes described later.

Then, as shown in FIG. 59, while holding the wire margin 64, the capillary 7 is moved to draw an arc (arrow g in FIG. 51). Specifically, the capillary 7 is moved closer to the upper surface 51 of the lead 50 in the direction Z while proceeding away from the semiconductor chip 2 in the direction X. The track of the end of the capillary 7 during this movement is indicated by broken lines in FIG. 59. For instance, this track is an arc of a radius R that is the length R of the wire margin 64. The movement distance of the capillary 7 in the direction X in this step is e.g. 30 to 60 μm. This step is the second step in the Appendixes described later.

Then, as shown in FIG. 60, the capillary 7 is lowered in the direction Z to come into contact with the upper surface 51 of the lead 50 (arrow h in FIG. 51). Thus, the wire margin 64 lies from the bent portion 63 on the upper surface 51 of the lead 50. Then, the wire 60 is cut by pressing the capillary 7 against the upper surface 51 of lead 50 and applying ultrasonic energy (stitch bonding). The portion of the wire 60 which is cut away from the capillary 7 is the bonding wire 6. In cutting the wire 60, the other end of the bonding wire 6 is deformed, and the second bond portion 65 is formed. In this way, bonding of the other end of the boding wire 6 to the lead 50 (second bonding) is completed. In this process, ultrasonic trace due to the application of ultrasonic energy is left in the second bond portion 65.

Although the wire 60 is cut in the stitch bonding performed to form the second bond portion 65, the stitch bonding to form the preliminary bond portion 632 is performed so as not to cut the wire 60. This difference leads to a difference between the thickness Dc of the second bond portion 65 and the thickness Db of the bent portion 63. That is, the second bond portion 65, which is pressed with a relatively strong force, deforms largely to have a smaller thickness as compared with the bent portion 63, which is pressed with a relatively weak force.

At the same time as the formation of the second bond portion 65, the wire margin 64 laid on the upper surface 51 of the lead 50 becomes a landing portion 66. The landing portion 66 is unfixedly held on the upper surface 51 of the lead 50 (i.e., not fixed by press-bonding or the like but just held substantially in contact with the upper surface 51 of the lead 50 without physical adhesion). The landing portion 66 and the lead 50 are substantially in parallel with each other.

The advantages of the semiconductor device 107 and the making method are described below.

According to the above-described making method, the second bond portion 65 of each bonding wire 6 is connected to the landing portion 66 lying on the upper surface 51 of the lead 50. This arrangement is suitable for making the length of the bonding wire 6 short at a position close to the second bond portion 65. This is desirable for preventing the bonding wire 6 from being swept by resin in the process of sealing the lead frame with resin. Moreover, the resin exerts a sufficient pressure in the direction to press the landing portion 66 onto the upper surface 51 of the lead 50, whereby wire sweep in the resin sealing process is reliably suppressed.

Moreover, the loop 62 and the second bond portion 65 are not connected directly to each other but connected via the preliminary bond portion 632 and the landing portion 66 intervening between them. Thus, even when the resin flowing under the loop 62 thermally expands or the length of the lead 50 changes so that the resin pushes the loop 62 upward, the effect of the pushing is suppressed. The preliminary bond portion 632 may be detached from the upper surface 51 of the lead 50 when the loop 62 is pushed upward due to expansion of the resin. However, since the landing portion 66 exists next to the preliminary bond portion 632, the second bond portion 65 is not affected by the rising of the resin. Even when the preliminary bond portion 632 is detached from the lead 50 after the second bond portion 65 is formed, such detachment has no adverse effect on the function of the semiconductor device 107. In other words, the provision, of the preliminary bond portion 632 and the landing portion 66 prevents the second bond portion 65 from being detached from the lead 50. Thus, the defective rate is improved, and a reliable semiconductor device 107 can be provided.

The above-described advantages are particularly effective when the distance between the semiconductor chip 2 and the lead 50 is further reduced in accordance with the demand for size reduction of a semiconductor package. To make the semiconductor device 107 smaller, the distance between the semiconductor chip 2 and the lead 50 needs to be reduced, which makes it difficult to reduce the inclination angle θ of the bonding wire 6 with respect to the lead 50. When the inclination angle θ is large, the bonding wire 6 stands relative to the lead 50, which often leads to wire sweep or detachment of the second bond portion 65. Such a problem can be avoided by providing the preliminary bond portion 632 and the landing portion 66 as in this embodiment.

Since wire sweep and detachment of the second bond portion 65 are reliably prevented in the semiconductor device 107, it is not necessary to set the die pad 40 lower than the lead frame 50 (down-set). This facilitates the working of the lead frame and simplifies the making process.

The landing portion 66 that provides the above-described advantages can be easily formed, as described with reference to FIGS. 56-60, just by moving a conventionally used capillary 7, without using any novel tool. Moreover, the landing portion 66 is formed by the movement of the capillary 7 performed after the movement to draw an arc for forming the loop 62. Thus, the landing portion 66 can be formed properly regardless of the shape of the loop 62 and is hence applicable to various structures.

In this embodiment, the preliminary bond portion 632 is formed before the formation of the landing portion 66. This means that the starting point of the landing portion is fixed in advance on the upper surface 51 of the lead 50, which is desirable for causing the landing portion 66 to lie flat on the upper surface 51.

In forming the landing portion 66, the capillary 7 is moved in the direction X. In this process, the wire 60 already provided may be pulled. In that case, load may exerted on the neck portion adjacent, to the first bond portion 61 or the wire may become thinner, which reduces the strength of the bonding wire 6. However, by providing the preliminary bond portion 632 as in this embodiment, the already provided portion of the wire is prevented from being affected by the pulling. Moreover, in this embodiment, the capillary 7 is moved in such a manner as to draw an arc as shown in FIG. 59 after the wire margin 64 is provided, so that horizontal force acting on the wire 60 is small. This is desirable for preventing the wire 60 from being detached from the upper surface 51 at the preliminary bond portion 632. Thus, the structure and making method according to this embodiment assures that a reliable bonding wire 6 is formed. By enhancing the reliability of the bonding wire 6, the defective rate is improved, and a reliable semiconductor device 107 is provided.

Unlike the method in which the capillary is first moved horizontally and then vertically, moving the capillary 7 along an arc as shown in FIG. 59 does not require the step of changing movement, directions of the capillary 7. This is desirable for reducing the time taken for forming the landing portion 66.

The resin-sealed type electronic component and the making method according to the present invention are not limited to the foregoing embodiments but can be varied in design in many ways.

As the bonding wire 6, metal wires such as a gold wire, an aluminum wire and a copper wire may be used. The diameter of the bonding wire 6 is not limited to a specific value, and the advantages described above can be obtained by forming the landing portion 66 having a length appropriate for the diameter.

In the method for making the send conductor device 107, the capillary 7 is moved to draw an arc in the step shown in FIG. 59. Instead of this, the capillary 7 may perform linear movement and arc movement in combination. For instance, the capillary 7 may be moved horizontally a certain distance and then shift to arc movement.

For instance, although the above-described semiconductor device 107 is of the QFN type, the present invention is applicable also to semiconductor devices of other non-lead package types such as the SON (Small Outlined Non-leaded Package) and also to electronic components such as chip resistors or chip capacitors.

Further, although the above-described semiconductor device 107 is of a singulation type in which the end surface of the lead 50 and the side surface of the resin package 11 are flush with each other, the present invention is not limited to such an embodiment. The present invention is applicable also to a semiconductor device adapted for a non-lead package of a lead cut type in which the read 50 projects from the resin package 11. Further, the present invention is applicable not only to a semiconductor device adapted for a non-lead package but also to a semiconductor device such as a QFP (Quad Flat Package) type configured such that the lead 50 projects from the resin package 11.

The foregoing embodiments employ a structure in which the die pad 40 is not down-set, because this structure is desirable for simplifying the working of a lead frame. However, the present invention is not limited to this structure, and also applicable to a structure in which the die pad 40 is down-set relative to the upper surface 51 of the lead 50.

[Appendix 1]
A rein-sealed type electronic component comprising:
a first component;
a second component spaced apart from the first component in a first direction;
a bonding wire that is formed by operating a capillary and electrically connects the first component and the second component to each other; and
a resin package covering the first component and the bonding wire, wherein:
the second component includes a pad surface facing a second direction perpendicular to the first direction,
the pad surface is covered with the resin package,
the bonding wire includes a first bond portion bonded to the first component, a second bond portion bonded to the pad surface, a bent portion provided between the first bond portion and the second bond portion in the first direction, and a landing portion provided between the bent portion and the second bond portion in the first direct ion, and
the bent portion is formed with a recess depressed toward the pad surface in the second direction.

[Appendix 2]
The rein-sealed type electronic component as set forth in Appendix 1, wherein the bent portion includes a third bond portion bonded to the pad surface.

[Appendix 3]
The rein-sealed type electronic component as set forth in Appendix 2, wherein the third bond portion overlaps the recess as viewed in the second direction.

[Appendix 4]
The rein-sealed type electronic component as set forth in Appendix 3, wherein thickness of the bent portion in the second direction is larger than that of the second bond portion.

[Appendix 5]
The rein-sealed type electronic component as set forth in any one of Appendixes 1-4, wherein length of the landing portion in the first direction is larger than a diameter of the bonding wire.

[Appendix 6]
The rein-sealed type electronic component as set forth in Appendix 5, wherein the length of the landing portion in the first direction is 10-80 μm.

[Appendix 7]
The rein-sealed type electronic component as set forth in any one of Appendixes 1-6, wherein:
the first component is a semiconductor chip including an obverse surface and a reverse surface facing away from each other in the second direction and an electrode pad provided on the obverse surface; and
the first bond portion is bonded to the electrode pad.

[Appendix 8]
The rein-sealed type electronic component as set forth in Appendix 7, wherein height difference between the first bond portion and the second bond portion in the second direction is not less than 100 μm.

[Appendix 9]
The rein-sealed type electronic component as set forth in Appendix 8, wherein:
the bonding wire includes a loop provided between the first bond portion and the bent portion, and
the loop is inclined at an inclination angle of 60-80° with respect to the pad surface.

[Appendix 10]
The rein-sealed type electronic component as set forth in any one of Appendixes 7-9, further comprising a die pad including an upper surface and a lower surface facing away from each other in the second direction and supporting the reverse surface of the first component, wherein:
the upper surface of the die pad is bonded to the reverse surface of the first component, and
the upper surface of the die pad and the pad surface are at a same position in the second direction.

[Appendix 11]
A method for making a resin-sealed type electronic component comprising the steps of:
forming a bonding wire that electrically connects a first component and a second component that are spaced apart from each other in a first direction, by operating a capillary that pays out a wire; and
sealing the first component and the bonding wire with, resin, wherein:
the second component includes a pad surface facing a second direction perpendicular to the first direction,
the step of forming a bonding wire comprises: a first bonding step of bonding a wire paid out from the capillary to the first component; a second bonding step of cutting the wire while bonding the wire paid out from the capillary onto the pad surface; a loop forming step performed between the first bonding step and the second bonding step; a landing portion forming step performed between the loop forming step and the second bonding step, and a wire contact step performed between the loop forming step and the landing portion forming step,
the wire contact step comprises moving the capillary toward the pad surface in the second direction to bring the wire into contact with the pad surface,
the landing portion forming step comprises: a first step of providing a wire margin by moving the capillary away from the pad surface in the second direction while paying out the wire from the capillary; and a second step of moving the capillary in the first direct ion.

[Appendix 12]
The method for making a resin-sealed type electronic component as set forth in Appendix 11, wherein the step of forming the bonding wire comprises a wire bonding step performed between the wire contact step and the landing portion forming step.

[Appendix 13]

The method for making a resin-sealed type electronic component as set forth in Appendix 12, wherein the wire bonding step comprises press-bonding the wire onto the pad surface by stitch bonding.

[Appendix 14]

The method for making a resin-sealed type electronic component as set forth in any one of Appendixes 11-13, wherein in the second step, the capillary is moved 30-60 μm along the first direction.

[Appendix 15]

The method for making a resin-sealed type electronic component as set forth in any one of Appendixes 11-14, wherein:
the first component includes an electrode pad spaced apart from the pad surface in the second direction,
the first bonding step comprises forming a ball portion at an end of the wire paid out from the capillary and press-bonding the ball portion against the electrode pad, and
the second bonding step comprises press-bonding the wire held by the capillary onto the pad surface by stitch bonding.

[Appendix 16]

The method for making a resin-sealed type electronic component as set forth in Appendix 15, wherein the electrode pad and the pad surface are spaced apart from each other by not less than 100 μm in the second direction.

[Appendix 17]

The method for making a resin-sealed type electronic component as set forth in Appendix 15 or 16, wherein the loop forming step comprises a step of moving the capillary away from the electrode pad in the second direction and a step of moving the capillary toward the pad surface in such a manner as to draw an arc.

[Appendix 18]

The method for making a resin-sealed type electronic component as set forth in Appendix 17, wherein the step of moving the capillary toward the pad surface in such a manner as to draw an arc comprises moving the capillary such that the bonding wire forms an inclination angle of 60-80° with respect to the pad surface.

[Appendix 19]

The method for making a resin-sealed type electronic component as set forth in any one of Appendixes 11-18, wherein the first component is a semiconductor chip,
the second component is a lead terminal,
the method further comprises the step of forming a lead frame including a die pad to which the semiconductor chip is to be bonded and the lead terminal, and
the step of sealing the first component and the bonding wire with resin comprises placing the lead frame in a mold, flowing resin into the mold and hardening the resin.

[Appendix 20]

The method for making a resin-sealed type electronic component as set forth in Appendix 19, wherein the step of forming the lead frame comprises working a thin metal plate such that the die pad and the lead terminal are at a same position in the second direction.

The invention claimed is:

1. A semiconductor device comprising:
a semiconductor chip;
a die pad including an obverse surface on which the semiconductor chip is bonded;
a lead including a lead obverse surface, the lead being spaced apart from the die pad;
a bonding wire electrically connecting the semiconductor chip and the lead to each other; and
a resin package that seals the semiconductor chip and the bonding wire,
wherein the bonding wire includes:
a first bond portion press-bonded to the semiconductor chip by ball bonding;
a second bond portion press-bonded to the lead by stitch bonding;
a landing portion extending in parallel with the lead obverse surface from the second bond portion toward the die pad and formed in contact with and unfixed to the lead obverse surface; and
a loop extending obliquely upward from the landing portion toward the semiconductor chip.

2. The semiconductor device according to claim 1, wherein the landing portion is 10-80 μm in length, and an inclination angle of the loop to the lead is 60-80°.

3. The semiconductor device according to claim 1, wherein the obverse surface of the die pad and the lead obverse surface are flush with each other.

4. The semiconductor device according to claim 1, wherein a distance between the first bond portion and an inner end of the lead in a horizontal direction parallel to the lead obverse surface is not more than 800 μm.

5. The semiconductor device according to claim 1, wherein a height difference between the first bond portion and the second bond portion in a direction normal to the lead obverse surface is not less than 100 μm.

6. The semiconductor device according to claim 1, wherein the semiconductor device is a surface-mounting semiconductor device in which the lead projects from a side surface of the resin package.

7. The semiconductor device according to claim 1, wherein a reverse surface of the die pad and a reverse surface of the lead are exposed from the resin package.

8. The semiconductor device according to claim 1, wherein the lead and the resin package differ from each other in coefficient of thermal expansion.

9. The semiconductor device according to claim 1, wherein the landing portion is spaced apart from an inner end of the lead toward an outer side of the lead, the lead includes an inner portion on an inner side of the landing portion, and the loop includes a rising portion directly above the inner portion of the lead.

10. The semiconductor device according to claim 1, wherein the second bond portion is formed with ultrasonic trace.

11. An electronic device comprising:
an electronic component including an obverse surface on which an electrode is formed;
a die pad including an obverse surface on which the electronic component is bonded;
a lead including a lead obverse surface, the lead being spaced apart from the die pad;
a wire electrically connecting the electrode and the lead; and
a resin package sealing the electronic component and the wire,
wherein the wire includes:
a first bond portion press-bonded to the electrode;
a second bond portion press-bonded to the lead by stitch bonding;
a horizontal portion extending horizontally from the second bond portion toward the die pad and formed in contact with and unfixed to the lead obverse surface; and a loop extending obliquely upward from the horizontal portion toward the electrode.

12. The electronic device according to claim 11, wherein the horizontal portion is 10-80 μm in length, and an inclination angle of the loop to the lead is 60-80°.

13. The electronic device according to claim 11, wherein the obverse surface of the die pad and the lead obverse surface are flush with each other.

14. The electronic device according to claim 11, wherein a distance between the first bond portion and an inner end of the lead in a horizontal direction parallel to the lead obverse surface is not more than 800 μm.

15. The electronic device according to claim 11, wherein a height difference between the first bond portion and the second bond portion in a direction normal to the lead obverse surface is not less than 100 μm.

16. The electronic device according to claim 11, wherein the electronic device is a surface-mounting electronic device in which the lead projects from a side surface of the resin package.

17. The electronic device according to claim 11, wherein a reverse surface of the die pad and a reverse surface of the lead are exposed from the resin package.

18. The electronic device according to claim 11, wherein the lead and the resin package differ from each other in coefficient of thermal expansion.

19. The electronic device according to claim 11, wherein the horizontal portion is spaced apart from an inner end of the lead toward an outer side of the lead, the lead includes an inner portion on an inner side of the horizontal portion, and the loop includes a rising portion directly above the inner portion of the lead.

20. The electronic device according to claim 11, wherein the second bond portion is formed with ultrasonic trace.

21. A method for making a semiconductor device comprising the steps of:
preparing a semiconductor chip including an electrode pad and bonded to an obverse surface of a die pad, while preparing a bonding wire including a ball portion formed at an end thereof;
forming a first bond portion by press-bonding the ball portion onto the electrode pad with a capillary;
forming a loop between the semiconductor chip and a lead spaced apart from the die pad by lifting the capillary and then moving the capillary obliquely downward in such a manner as to draw an arc toward the lead such that an inclination angle of 60-80° is formed with respect to a horizontal surface of the lead;
providing a wire margin of a predetermined length by lifting the capillary from a point close to an obverse surface of the lead to a position obliquely upward of the point while paying out the bonding wire;
forming a second bond portion by lowering the capillary and press-bonding the bonding wire by stitch bonding onto the obverse surface of the lead, while forming a landing portion having a length of 10-80 μm by bringing the wire margin into contact with the obverse surface of the lead; and
sealing the semiconductor chip and the bonding wire by a resin package.

22. The method for making a semiconductor device according to claim 21, wherein the step of providing a wire margin comprises lifting the capillary from the point in a direction normal to the obverse surface of the lead and then moving the capillary in a direction parallel to the obverse surface of the lead.

* * * * *